United States Patent
Levinson et al.

(10) Patent No.: US 10,496,766 B2
(45) Date of Patent: Dec. 3, 2019

(54) SIMULATION SYSTEM AND METHODS FOR AUTONOMOUS VEHICLES

(71) Applicant: Zoox, Inc., Foster City, CA (US)

(72) Inventors: Jesse Sol Levinson, Redwood City, CA (US); Gabriel Thurston Sibley, Menlo Park, CA (US); Ashutosh Gajanan Rege, San Jose, CA (US)

(73) Assignee: Zoox, Inc., Foster City, CA (US)

( * ) Notice: Subject to any disclaimer, the term of this patent is extended or adjusted under 35 U.S.C. 154(b) by 791 days.

(21) Appl. No.: 14/757,016

(22) Filed: Nov. 5, 2015

(65) Prior Publication Data
US 2017/0132334 A1 May 11, 2017

(51) Int. Cl.
*G05D 1/00* (2006.01)
*G05D 1/02* (2006.01)
*G06F 17/50* (2006.01)

(52) U.S. Cl.
CPC ....... *G06F 17/5009* (2013.01); *G05D 1/0088* (2013.01); *G05D 1/0214* (2013.01)

(58) Field of Classification Search
CPC ............ G06F 17/5009; G06F 17/5095; G05D 1/0214; G05D 1/0088; G05D 2201/0213; G01S 17/936; G01S 2013/936; G01S 2013/9357; G01S 13/87; G01S 13/867; G01S 13/865; G01S 7/4972
USPC ........................................................... 703/8
See application file for complete search history.

(56) References Cited

U.S. PATENT DOCUMENTS

| 5,558,370 | A  | 9/1996  | Behr |
| 5,959,552 | A  | 9/1999  | Cho |
| 6,301,542 | B1 | 10/2001 | Kirchberger et al. |
| 6,374,168 | B1 | 4/2002  | Fujii |

(Continued)

FOREIGN PATENT DOCUMENTS

| WO | WO2009151781 A1 | 12/2009 |
| WO | WO2011154681 A1 | 12/2011 |
| WO | WO2015134152    | 9/2015  |

OTHER PUBLICATIONS

"Shader-Based SensorSimulation for Autonomous Car Testing" by Wang et al. IEEE 2012, pp. 224-229 (Year: 2012).*

(Continued)

*Primary Examiner* — Juan C Ochoa
(74) *Attorney, Agent, or Firm* — Lee & Hayes, P.C.

(57) ABSTRACT

Various embodiments relate generally to autonomous vehicles and associated mechanical, electrical and electronic hardware, computer software and systems, and wired and wireless network communications to provide an autonomous vehicle fleet as a service. More specifically, systems, devices, and methods are configured to simulate navigation of autonomous vehicles in various simulated environments. In particular, a method may include receiving data representing characteristics of a dynamic object, calculating a classification of a dynamic object to identify a classified dynamic object, identifying data representing dynamic-related characteristics associated with the classified dynamic object, forming a data model of the classified dynamic object, simulating a predicted range of motion of the classified dynamic object in a simulated environment to form a simulated dynamic object, and simulating a predicted response of a data representation of a simulated autonomous vehicle.

24 Claims, 44 Drawing Sheets

(56) References Cited

U.S. PATENT DOCUMENTS

| | | | |
|---|---|---|---|
| 6,728,616 B1 | 4/2004 | Tabe | |
| 7,424,414 B2* | 9/2008 | Craft | G07C 5/08 434/65 |
| 7,426,429 B2 | 9/2008 | Tabe | |
| 8,123,642 B2 | 2/2012 | Ishikawa et al. | |
| 8,126,642 B2 | 2/2012 | Trepagnier | |
| 8,392,064 B2 | 3/2013 | Thrun et al. | |
| 8,434,919 B2 | 5/2013 | Schofield | |
| 8,880,272 B1 | 11/2014 | Ferguson et al. | |
| 8,977,007 B1 | 3/2015 | Ferguson et al. | |
| 8,996,224 B1 | 3/2015 | Herbach et al. | |
| 9,158,979 B2* | 10/2015 | Aimura | G06K 9/00805 |
| D743,978 S | 11/2015 | Amin | |
| 9,194,168 B1 | 11/2015 | Lu et al. | |
| 9,201,426 B1 | 12/2015 | Bonawitz | |
| 9,384,443 B2 | 7/2016 | Passot et al. | |
| 9,395,727 B1 | 7/2016 | Smith et al. | |
| 2002/0120374 A1* | 8/2002 | Douros | G07C 5/0808 701/34.4 |
| 2004/0017073 A1 | 1/2004 | Pavlov et al. | |
| 2004/0068354 A1 | 4/2004 | Tabe | |
| 2005/0216181 A1 | 9/2005 | Estkowski et al. | |
| 2006/0064202 A1 | 3/2006 | Gutmann et al. | |
| 2006/0089763 A1 | 4/2006 | Barrett et al. | |
| 2006/0174221 A1* | 8/2006 | Kinsella | G06F 8/36 717/106 |
| 2006/0175116 A1 | 8/2006 | Friedman et al. | |
| 2006/0207820 A1 | 9/2006 | Joshi et al. | |
| 2006/0282218 A1* | 12/2006 | Urai | B60W 30/09 701/301 |
| 2007/0096447 A1 | 5/2007 | Tabe | |
| 2007/0246927 A1 | 10/2007 | Okada | |
| 2008/0033645 A1 | 2/2008 | Levinson et al. | |
| 2008/0084283 A1 | 4/2008 | Kalik | |
| 2008/0097699 A1 | 4/2008 | Ono | |
| 2008/0320421 A1 | 12/2008 | Demaris et al. | |
| 2009/0036090 A1 | 2/2009 | Cho, II et al. | |
| 2009/0240647 A1 | 9/2009 | Green et al. | |
| 2009/0276149 A1 | 11/2009 | Kauffman et al. | |
| 2010/0045482 A1 | 2/2010 | Strauss | |
| 2010/0106356 A1* | 4/2010 | Trepagnier | G01S 17/023 701/25 |
| 2011/0130111 A1 | 6/2011 | Crandall et al. | |
| 2011/0246156 A1* | 10/2011 | Zecha | G08G 1/166 703/6 |
| 2011/0288684 A1 | 11/2011 | Farlow et al. | |
| 2012/0062372 A1* | 3/2012 | Augst | G06K 9/00798 340/435 |
| 2012/0083960 A1 | 4/2012 | Zhu et al. | |
| 2012/0256448 A1 | 10/2012 | Yasui et al. | |
| 2013/0054133 A1 | 2/2013 | Lewis et al. | |
| 2013/0246301 A1 | 9/2013 | Radhakrishnan et al. | |
| 2013/0268138 A1 | 10/2013 | Moughler et al. | |
| 2014/0032012 A1 | 1/2014 | Joshi et al. | |
| 2014/0032049 A1 | 1/2014 | Moshchuk et al. | |
| 2014/0129135 A1 | 5/2014 | Holden et al. | |
| 2014/0129302 A1 | 5/2014 | Amin et al. | |
| 2014/0129951 A1 | 5/2014 | Amin et al. | |
| 2014/0142830 A1 | 5/2014 | Bernzen et al. | |
| 2014/0185880 A1 | 7/2014 | Fairfield et al. | |
| 2014/0188347 A1 | 7/2014 | Tabe | |
| 2014/0214255 A1 | 7/2014 | Dolgov et al. | |
| 2014/0214260 A1 | 7/2014 | Eckert et al. | |
| 2014/0244151 A1 | 8/2014 | Matsubara et al. | |
| 2014/0257661 A1 | 9/2014 | Schulman et al. | |
| 2014/0303827 A1 | 10/2014 | Dolgov et al. | |
| 2014/0309833 A1 | 10/2014 | Ferguson et al. | |
| 2014/0333468 A1 | 11/2014 | Zhu et al. | |
| 2014/0336935 A1 | 11/2014 | Zhu et al. | |
| 2014/0358353 A1 | 12/2014 | Ibanez-Guzman et al. | |
| 2014/0358427 A1 | 12/2014 | Fuhrman | |
| 2015/0025708 A1 | 1/2015 | Anderson | |
| 2015/0039157 A1 | 2/2015 | Wolfe et al. | |
| 2015/0039391 A1 | 2/2015 | Hershkovitz et al. | |
| 2015/0057871 A1 | 2/2015 | Ono et al. | |
| 2015/0091374 A1 | 4/2015 | Lenius et al. | |
| 2015/0094850 A1 | 4/2015 | Passot et al. | |
| 2015/0127224 A1 | 5/2015 | Tabe | |
| 2015/0127239 A1 | 5/2015 | Breed et al. | |
| 2015/0149088 A1 | 5/2015 | Attard et al. | |
| 2015/0160024 A1 | 6/2015 | Fowe | |
| 2015/0185034 A1 | 7/2015 | Abhyanker | |
| 2015/0248131 A1* | 9/2015 | Fairfield | G05D 1/0044 701/2 |
| 2015/0254986 A1 | 9/2015 | Fairfield et al. | |
| 2015/0258928 A1 | 9/2015 | Goto et al. | |
| 2015/0266475 A1* | 9/2015 | Tanzmeister | B60W 30/0956 701/301 |
| 2015/0268665 A1 | 9/2015 | Ludwick et al. | |
| 2015/0271290 A1 | 9/2015 | Tao et al. | |
| 2015/0292894 A1 | 10/2015 | Goddard et al. | |
| 2015/0298636 A1 | 10/2015 | Furst | |
| 2015/0310146 A1* | 10/2015 | Tanzmeister | G08G 1/167 703/2 |
| 2015/0336502 A1 | 11/2015 | Hillis et al. | |
| 2015/0336524 A1 | 11/2015 | Larner et al. | |
| 2015/0338226 A1 | 11/2015 | Mason et al. | |
| 2015/0338852 A1 | 11/2015 | Ramanujam | |
| 2015/0339928 A1 | 11/2015 | Ramanujam | |
| 2015/0346727 A1 | 12/2015 | Ramanujam | |
| 2015/0348221 A1 | 12/2015 | Pedersen et al. | |
| 2015/0356368 A1 | 12/2015 | Liu et al. | |
| 2015/0359032 A1 | 12/2015 | Menard et al. | |
| 2015/0370251 A1 | 12/2015 | Siegel et al. | |
| 2015/0375764 A1 | 12/2015 | Rajendran et al. | |
| 2016/0016315 A1 | 1/2016 | Kuffner, Jr. et al. | |
| 2016/0071278 A1 | 3/2016 | Leonard et al. | |
| 2016/0107703 A1 | 4/2016 | Briceno et al. | |
| 2016/0159402 A1 | 6/2016 | Nakaya et al. | |
| 2016/0159407 A1 | 6/2016 | Holmstrom et al. | |
| 2016/0165775 P1 | 6/2016 | Maillard et al. | |
| 2016/0165786 P1 | 6/2016 | Giesen | |
| 2016/0189544 A1 | 6/2016 | Ricci | |
| 2016/0209220 A1 | 7/2016 | Laetz | |
| 2016/0247106 A1 | 8/2016 | Dalloro et al. | |
| 2016/0247109 A1 | 8/2016 | Scicluna et al. | |
| 2016/0314224 A1* | 10/2016 | Wei | G05B 17/02 |

OTHER PUBLICATIONS

Real-Time Image Segmentation on a GPU; Abramov, Alexey et al.; Facing the Multi-Core Challenge, pp. 131-142, Berlin, German (2010).

Bodensteiner et al., "Monocular Camera Trajectory Optimization using LiDAR Data", IEEE International Conference on Computer Vision Workshops, 2011, 8 pages.

Office action for U.S. Appl. 14/932,962, dated Mar. 21, 2016, Kentley et al., "Robotic Vehicle Active Safety Systems and Methods", 18 pages.

Office action for U.S. Appl. 14/932,963, dated Mar. 17, 2016, Levinson et al., "Adaptive Mapping to Navigate Autonomous Vehicles Responsive to Physical Environment Changes", 26 pages.

Office action for U.S. Appl. No. 14/932,940, dated May 4, 2016, Levinson et al., "Automated Extraction of Semantic Information to Enhance Incremental Mapping Modifications for Robotic Vehicles", 22 pages.

Final Office action for U.S. Appl. No. 14/932,940, dated Nov. 22, 2016, Levinson et al., "Automated Extraction of Semantic Information to Enhance Incremental Mapping Modifications for Robotic Vehicles", 29 pages.

Office action for U.S. Appl. No. 14/932,959, dated Dec. 2, 2016, Kentley et al., "Autonomous Vehicle Fleet Service and System", 21 pages.

Combining 3D Shape, Color, and Motion for Robust Antime Tracking; Held, David, Levinson, Jesse, Thrun, Sebastian, Savarese, Silvio, Robotics: Science and Systems (RSS), Berkeley, California, USA (2014).

Group Induction; Teichman, Alex, Thrun, Sebastian, Proc. of the IEEE/RSJ Intl Conf on Intelligent Robotics and Systems (IROS) (2013).

(56) References Cited

OTHER PUBLICATIONS

Automatic Online Calibration of Cameras and Lasers; Levinson, Jesse, Thrun, Sebastian; Robotics: Science and Systems (RSS) (2013).
Precision Tracking With Sparse 3D and Dense Color 2D Data; Held, David, Levinson, Jesse, Thrun, Sebastian; International Conference on Robotics and Automation (ICRA) (2013).
Automatic Calibration of Cameras and Lasers in Arbitrary Scenes; Levinson, Jesse, Thrun, Sebastian; International Symposium on Experimental Robotics (ISER) (2012).
Online, Semi-Supervised Learning for Long-Term Interaction With Object Recognition Systems; Teichman, Alex, Thrun, Sebastian, RSS Workshop on Long-Term Operation of Autonomous Robotic Systems in Changing Environments (2012).
Tracking-Based Semi-Supervised Learning; Teichman, Alex, Thrun, Sebastian; International Journal of Robotics Research (IJRR); http://ijr.sagepub.com/content/31/7/804; (2012).
A Probabilistic Framework for Object Detection in Images Using Context and Scale; Held, David, Levinson, Jesse, Thrun, Sebastian; International Conference on Robotics and Automation (ICRA) (2012).
Practical Object Recognition in Autonomous Driving and Beyond; Teichman, Alex, Thrun, Sebastian; IEEE Workshop on Advanced Robotics and its Social Impacts (ARSO) (2011).
Tracking-Based Semi-Supervised Learning; Teichman, Alex, Thrun, Sebastian; Robotics: Science and Systems (RSS) (2011).
Towards 3D Object Recognition Via Classification of Arbitrary Object Tracks; Teichman, Alex, Levinson, Jesse, Thrun, Sebastian; International Conference on Robotics and Automation (ICRA) (2011).
Towards Fully Autonomous Driving: Systems and Algorithms; Levinson, Jesse et al.; Intelligent Vehicles Symposium (2011).
Traffic Light Mapping, Localization, and State Detection for Autonomous Vehicles; Levison, Jesse, Askeland, Jake, Dolson, Jennifer, Thrun, Sebastian; International Conference on Robotics and Automation (ICRA) (2011).
Automatic Laser Calibration, Mapping, and Localization for Autonomous Vehicles, Levison, Jesse; Thesis (Ph D); Stanford University (2011).
Unsupervised Calibration for Multi-Beam Lasers; Levinson, Jesse, Thrun, Sebastian, International on Symposium Experimental Robotics (ISER) (2010).
Robust Vehicle Localization in Urban Environments Using Probabilistic Maps; Levinson, Jesse, Thrun, Sebastian; International Conference on Robotics and Automation (ICRA) (2010).
Exponential Family Sparse Coding With Application to Self-Taught Learning; Honglak, Lee, Raina, Rajat, Teichman, Alex, Ng, Andrew Y.; International Joint Conference on Artificial Intelligence (IJCAI) (2009).
Map-Based Precision Vehicle Localization in Urban Environments; Levinson, Jesse, Thrun, Sebastian; Robotics: Science and Systems (RSS) (2007).
Stanford Autonomous Driving Team website <http://driving.stanford.edu/papers.html>; Various; Stanford University 2014.
Combining Data-Driven and Model-Based Cues for Segmentation of Video Sequences; Eckes, Christian, Vorbruggen, Jan C.; Proceedings WCNN '96, San Diego, USA (1996).
A Real-Time Motion Planner With Trajectory Optimization for Autonomous Vehicles; Xu, Wenda et al.; Robotics and Automation (ICRA); Saint Paul, MN, USA (2012).
Dynamic Real-Time Replanning in Belief Space: An Experimental Study on Physical Mobile Robots; Agha-mohammadi, Ali-Akbar et al.; Technical Report TR 13-007; Texas A&M University, USA (2013).
An Evaluation of Dynamic Object Tracking With 3D LIDAR; Morton, P., Douillard, B., Underwood, J.; Proceedings of Australasian Conference on Robotics and Automation; Dec. 7-9, 2011; Melbourne, Australia (2011).
Control of Robotic Mobility-On Demand Systems: A Queueing-Theoretical Perspective; Zhang, Rick, Pavone, Marco; Intl Journal of Robotics Research, pp. 1-18, Stanford, USA (2015).
Evaluation of Urban Vehicle Routing Algorithms; Kong, Linghe et al.; Intl Journal of Digital Content Technology and its Applications (JDCTA); vol. 6, No. 23, University of New Mexico, USA (2012).
Real-Time High Resolution Fusion of Depth Maps on GPU; Trifonov, Dmitry; Intl Conference on Computer-Aided Design and Computer Graphics (CAD/Graphics); Guangzhou, China (2013).
A Tutorial on Graph-Based Slam; Grisetti, Giorgio et al.; Intelligent Transportation Systems Magazine, IEEE; pp. 31-43 (2010).
Sensor Fusion and Calibration of Inertial Sensors, Vision, Ultra-Wideband and GPS; Hol, Jeroen; Linkoping Studies in Science and Technology, Dissertations No. 1368; Department of Electrical Engineering; Linkoping University, SE-581 83 Linkoping, Sweden; (2011).
Large Scale Dense Visual Inertial Slam; Ma, Lu et al.; Field and Service Robotics (FSR); (2015).
Simultaneous Localization, Mapping, and Manipulation for Unsupervised Object Discovery; Ma, Lu et al.; IEEE International Conference on Robotics and Automation (ICRA); (2014).
Online Slam With Any-Time Self-Calibration and Automatic Change Detection; Nima Keivan and Gabe Sibley; IEEE International Conference on Robotics and Automation (ICRA); (2014).
U.S. Appl. No. 14/756,991, filed Nov. 4, 2015, Levinson et al., "Sensor-based object-detection optimization for autonomous vehicles".
U.S. Appl. No. 14/756,993, filed Nov. 4, 2015, Kentley et al., "Method for robotic vehicle communication with an external environment via acoustic beam forming".
U.S. Appl. No. 14/756,994, filed Nov. 4, 2015, Kentley et al., "System of configuring active lighting to indicate directionality of an autonomous vehicle".
U.S. Appl. No. 14/756,996, filed Nov. 4, 2015, Levinson et al., "Calibration for Autonomous Vehicle Operation".
U.S. Appl. No. 14/757,015, filed Nov. 5, 2015, Levinson et al., "Independent steering, power torque control and transfer in autonomous vehicles".
U.S. Appl. No. 14/932,940, filed Nov. 4, 2015, Levinson et al., "Automated Extraction of Semantic Information to Enhance Incremental Mapping Modifications for Robotic Vehicles".
U.S. Appl. No. 14/932,948, filed Nov. 4, 2015, Kentley et al., "Active Lighting Control for Communicating a State of an Autonomous Vehicle to Entities in a Surrounding Environment".
U.S. Appl. No. 14/932,952, filed Nov. 4, 2015, Kentley et al., "Resilient Safety System for a Robotic Vehicle".
U.S. Appl. No. 14/932,954, filed Nov. 4, 2015, Kentley et al., "Internal Safety Systems for Robotic Vehicles".
U.S. Appl. No. 14/932,958, filed Nov. 4, 2015, Kentley, "Quadrant Configuration of Robotic Vehicles".
U.S. Appl. No. 14/932,962, filed Nov. 4, 2015, Kently et al., "Robotic Vehicle Active Safety Systems and Methods".
U.S. Appl. No. 14/933,469, filed Nov. 5, 2015, Kentley eta al., "Software Application to Request and Control an Autonomous Vehicle Service".
U.S. Appl. No. 14/933,602, filed Nov. 5, 2015, Levinson et al., "Machine-Learning Systems and Techniques to Optimize Teleoperation and/or Planner Decisions".
U.S. Appl. No. 14/933,665, filed Nov. 5, 2015, Kentley et al., "Software Application and Logic to Modify Configuration of an Autonomous Vehicle".
U.S. Appl. No. 14/933,706, filed Nov. 5, 2015, Kentley et al., "Interactive Autonomous Vehicle Command Controller".
Office action for U.S. Appl. No. 14/932,948, dated Oct. 14, 2016, Kentley et al., "Active Lighting Control for Communicating a State of an Autonomous Vehicle to Entities in a Surrounding Environment", 15 pages.
Office action for U.S. Appl. No. 14/756,995, dated Oct. 31, 2016, Kentley et al., "Coordination of dispatching and maintaining fleet of autonomous vehicles", 35 pages.
Office action for U.S. Appl. No. 14/932,954, dated Mar. 29, 2016, Kentley et al., "Internal Safety Systems for Robotic Vehicles", 17 pages.

(56) References Cited

OTHER PUBLICATIONS

Office Action for U.S. Appl. No. 14/933,602, dated Nov. 5, 2015, Levinson et al., "Machine-Learning Systems and Techniques to Optimize Teleoperation and/or Planner Decisions", 11 pages.
U.S. Appl. No. 14/757,016, filed Nov. 5, 2015, Levinson et al., "Simulation system and methods for autonomous vehicles".
U.S. Appl. No. 14/756,995, filed Nov. 4, 2015, Kentley et al., Coordination of dispatching and maintaining fleet of autonomous vehicles.
U.S. Appl. No. 14/932,959, filed Nov. 4, 2015, Kentley et al., Titled "Autonomous Vehicle Fleet Service and System", 65 Pages.
U.S. Appl. No. 14/932,963, filed Nov. 4, 2015, Levinson et al., "Adaptive Mapping to Navigate Autonomous Vehicles Responsive to Physical Environment Changes".
U.S. Appl. No. 14/932,966, filed Nov. 4, 2015, Levinson et al., "Teleoperation System and Method for Trajectory Modification of Autonomous Vehicles".
U.S. Appl. No. 14/756,992, filed Nov. 4, 2015, Levinson et al., "Adaptive autonomous vehicle planner logic".
U.S. Appl. No. 14/932,959, filed Nov. 4, 2015.
U.S. Appl. No. 14/932,963, filed Nov. 4, 2015.
U.S. Appl. No. 14/932,966, filed Nov. 4, 2015.
U.S. Appl. No. 14/756,995, filed Nov. 4, 2015.
U.S. Appl. No. 14/756,992, filed Nov. 4, 2015.
Bayazit et al., "Swarming Behavior Using Probabilistic Roadmap Techniques", Swarm Robotics WS 2004, LNCS, Springer-Verlag Berlin Heidelberg 2005, pp. 112-pp. 125.
Easymile (website), Retrieved from <<https://web.archive.org/web/20150723060050/http://easymile.com>> Jul. 2015, <<https://web.archive.org/web/201508012054107/http://easymile.com/mobility-soulition/>>, Aug. 2015, and <<http:www.youtube.com/watch?v=fijDBL76yDY>>, Feb. 2015, 13 pages.
Office Action for U.S. Appl. No. 14/932,952, dated Jun. 24, 2016, Kentley et al., "Resilient Safety System for a Robotic Vehicle", 11 pages.
Office action for U.S. Appl. No. 14/932,963, dated Aug. 15, 2016, Levinson et al., "Adaptive Mapping to Navigate Autonomous Vehicles Responsive to Physical Environment Changes", 15 pages.
Office action for U.S. Appl. No. 14/756,992, dated Aug. 25, 2016, Levinson et al., "Adaptive autonomous vehicle planner logic", 9 pages.
Office action for U.S. Appl. No. 14/933,469, dated Aug. 30, 2016, Kentley et al., "Software Application to Request and Control an Autonomous Vehicle Service", 11 pages.
Office action for U.S. Appl. No. 14/932,959, dated Aug. 5, 2016, Kentley et al., "Autonomous Vehicle Fleet Service and System", 16 pages.
PCT Search Report and Written Opinion dated Mar. 30, 2017 for PCT Application No. PCT/US16/60030, 8 pages.
The Extended European Search Report dated Apr. 9, 2019, for the European Patent Application No. 16862835.2, 10 pages.

\* cited by examiner

SIMULATION SYSTEM AND METHODS FOR AUTONOMOUS VEHICLES

CROSS-REFERENCE TO RELATED APPLICATIONS

This application is a Continuation-in-Part application of U.S. patent application Ser. No. 14/932,959 filed Nov. 4, 2015 entitled "AUTONOMOUS VEHICLE FLEET SERVICE AND SYSTEM," is a Continuation-in-Part application of U.S. patent application Ser. No. 14/932,963 filed Nov. 4, 2015 entitled "ADAPTIVE MAPPING TO NAVIGATE AUTONOMOUS VEHICLES RESPONSIVE TO PHYSICAL ENVIRONMENT CHANGES," is a Continuation-in-Part application of U.S. patent application Ser. No. 14/932,966 filed Nov. 4, 2015 entitled "TELEOPERATION SYSTEM AND METHOD FOR TRAJECTORY MODIFICATION OF AUTONOMOUS VEHICLES," is a Continuation-in-Part application of U.S. patent application Ser. No. 14/932,940 filed Nov. 4, 2015 entitled "AUTOMATED EXTRACTION OF SEMANTIC INFORMATION TO ENHANCE INCREMENTAL MAPPING MODIFICATIONS FOR ROBOTIC VEHICLES," is a Continuation-in-Part application of U.S. patent application Ser. No. 14/756,995 filed Nov. 4, 2015 entitled "COORDINATION OF DISPATCHING AND MAINTAINING FLEET OF AUTONOMOUS VEHICLES," is a Continuation-in-Part application of U.S. patent application Ser. No. 14/756,992 filed Nov. 4, 2015 entitled "ADAPTIVE AUTONOMOUS VEHICLE PLANNER LOGIC," is a Continuation-in-Part application of U.S. patent application Ser. No. 14/756,994 filed Nov. 4, 2015 entitled "SYSTEM OF CONFIGURING ACTIVE LIGHTING TO INDICATE DIRECTIONALITY OF AN AUTONOMOUS VEHICLE," is a Continuation-in-Part application of U.S. patent application Ser. No. 14/756,993 filed Nov. 4, 2015 entitled "METHOD FOR ROBOTIC VEHICLE COMMUNICATION WITH AN EXTERNAL ENVIRONMENT VIA ACOUSTIC BEAM FORMING," is a Continuation-in-Part application of U.S. patent application Ser. No. 14/756,991 filed Nov. 4, 2015 entitled "SENSOR-BASED OBJECT-DETECTION OPTIMIZATION FOR AUTONOMOUS VEHICLES," is a Continuation-in-Part application of U.S. patent application Ser. No. 14/756,996 filed Nov. 4, 2015 entitled "CALIBRATION FOR AUTONOMOUS VEHICLE OPERATION," is a Continuation-in-Part application of U.S. patent application Ser. No. 14/932,948 filed Nov. 4, 2015 entitled "ACTIVE LIGHTING CONTROL FOR COMMUNICATING A STATE OF AN AUTONOMOUS VEHICLE TO ENTITIES IN A SURROUNDING ENVIRONMENT," is a Continuation-in-Part application of U.S. patent application Ser. No. 14/932,952 filed Nov. 4, 2015 entitled "RESILIENT SAFETY SYSTEM FOR A ROBOTIC VEHICLE," is a Continuation-in-Part application of U.S. patent application Ser. No. 14/932,954 filed Nov. 4, 2015 entitled "INTERNAL SAFETY SYSTEMS FOR ROBOTIC VEHICLES," is a Continuation-in-Part application of U.S. patent application Ser. No. 14/932,958 filed Nov. 4, 2015 entitled "QUADRANT CONFIGURATION OF ROBOTIC VEHICLES," and is a Continuation-in-Part application of U.S. patent application Ser. No. 14/932,962 filed Nov. 4, 2015 entitled "ROBOTIC VEHICLE ACTIVE SAFETY SYSTEMS AND METHODS," this application is related to U.S. patent application Ser. No. 14/757,015 filed Nov. 5, 2015 entitled "INDEPENDENT STEERING, POWER, TORQUE CONTROL AND TRANSFER IN AUTONOMOUS VEHICLES," all of which are hereby incorporated by reference in their entirety for all purposes.

FIELD

Various embodiments relate generally to autonomous vehicles and associated mechanical, electrical and electronic hardware, computer software and systems, and wired and wireless network communications to provide an autonomous vehicle fleet as a service. More specifically, systems, devices, and methods are configured to simulate navigation of autonomous vehicles in various simulated environments.

BACKGROUND

A variety of approaches to developing driverless vehicles focus predominately on automating conventional vehicles (e.g., manually-driven automotive vehicles) with an aim toward producing driverless vehicles for consumer purchase. For example, a number of automotive companies and affiliates are modifying conventional automobiles and control mechanisms, such as steering, to provide consumers with an ability to own a vehicle that may operate without a driver. In some approaches, a conventional driverless vehicle performs safety-critical driving functions in some conditions, but requires a driver to assume control (e.g., steering, etc.) should the vehicle controller fail to resolve certain issues that might jeopardize the safety of the occupants.

Although functional, conventional driverless vehicles typically have a number of drawbacks. For example, a large number of driverless cars under development have evolved from vehicles requiring manual (i.e., human-controlled) steering and other like automotive functions. Therefore, a majority of driverless cars are based on a paradigm that a vehicle is to be designed to accommodate a licensed driver, for which a specific seat or location is reserved within the vehicle. As such, driverless vehicles are designed sub-optimally and generally forego opportunities to simplify vehicle design and conserve resources (e.g., reducing costs of producing a driverless vehicle). Other drawbacks are also present in conventional driverless vehicles.

Other drawbacks are also present in conventional transportation services, which are not well-suited for managing, for example, inventory of vehicles effectively due to the common approaches of providing conventional transportation and ride-sharing services. In one conventional approach, passengers are required to access a mobile application to request transportation services via a centralized service that assigns a human driver and vehicle (e.g., under private ownership) to a passenger. With the use of differently-owned vehicles, maintenance of private vehicles and safety systems generally go unchecked. In another conventional approach, some entities enable ride-sharing for a group of vehicles by allowing drivers, who enroll as members, access to vehicles that are shared among the members. This approach is not well-suited to provide for convenient transportation services as drivers need to pick up and drop off shared vehicles at specific locations, which typically are rare and sparse in city environments, and require access to relatively expensive real estate (i.e., parking lots) at which to park ride-shared vehicles. In the above-described conventional approaches, the traditional vehicles used to provide transportation services are generally under-utilized, from an inventory perspective, as the vehicles are rendered immobile once a driver departs. Further, ride-sharing approaches (as well as individually-owned vehicle transportation services) generally are not well-suited to rebalance inventory to match demand of transportation services to accommodate usage and typical travel patterns. Note, too, that some conventionally-described vehicles having limited self-driving automation capabilities also are not well-suited to rebalance inventories as a human driver generally may be required. Examples of vehicles having limited self-driving automation capabilities are vehicles designated as Level 3 ("L3") vehicles, according to the U.S. Department of Transportation's National Highway Traffic Safety Administration ("NHTSA").

As another drawback, typical approaches to driverless vehicles are generally not well-suited to detect and navigate vehicles relative to interactions (e.g., social interactions) between a vehicle-in-travel and other drivers of vehicles or individuals. For example, some conventional approaches are not sufficiently able to identify pedestrians, cyclists, etc., and associated interactions, such as eye contact, gesturing, and the like, for purposes of addressing safety risks to occupants of a driverless vehicles, as well as drivers of other vehicles, pedestrians, etc.

Thus, what is needed is a solution for implementing autonomous vehicles, without the limitations of conventional techniques.

BRIEF DESCRIPTION OF THE DRAWINGS

Various embodiments or examples ("examples") of the invention are disclosed in the following detailed description and the accompanying drawings.

DETAILED DESCRIPTION

Various embodiments or examples may be implemented in numerous ways, including as a system, a process, an apparatus, a user interface, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents thereof. Numerous specific details are set forth in the following description in order to provide a thorough understanding. These details are provided for the purpose of example and the described techniques may be practiced according to the claims without some or all of these specific details. For clarity, technical material that is known in the technical fields related to the examples has not been described in detail to avoid unnecessarily obscuring the description.

Figure 1:
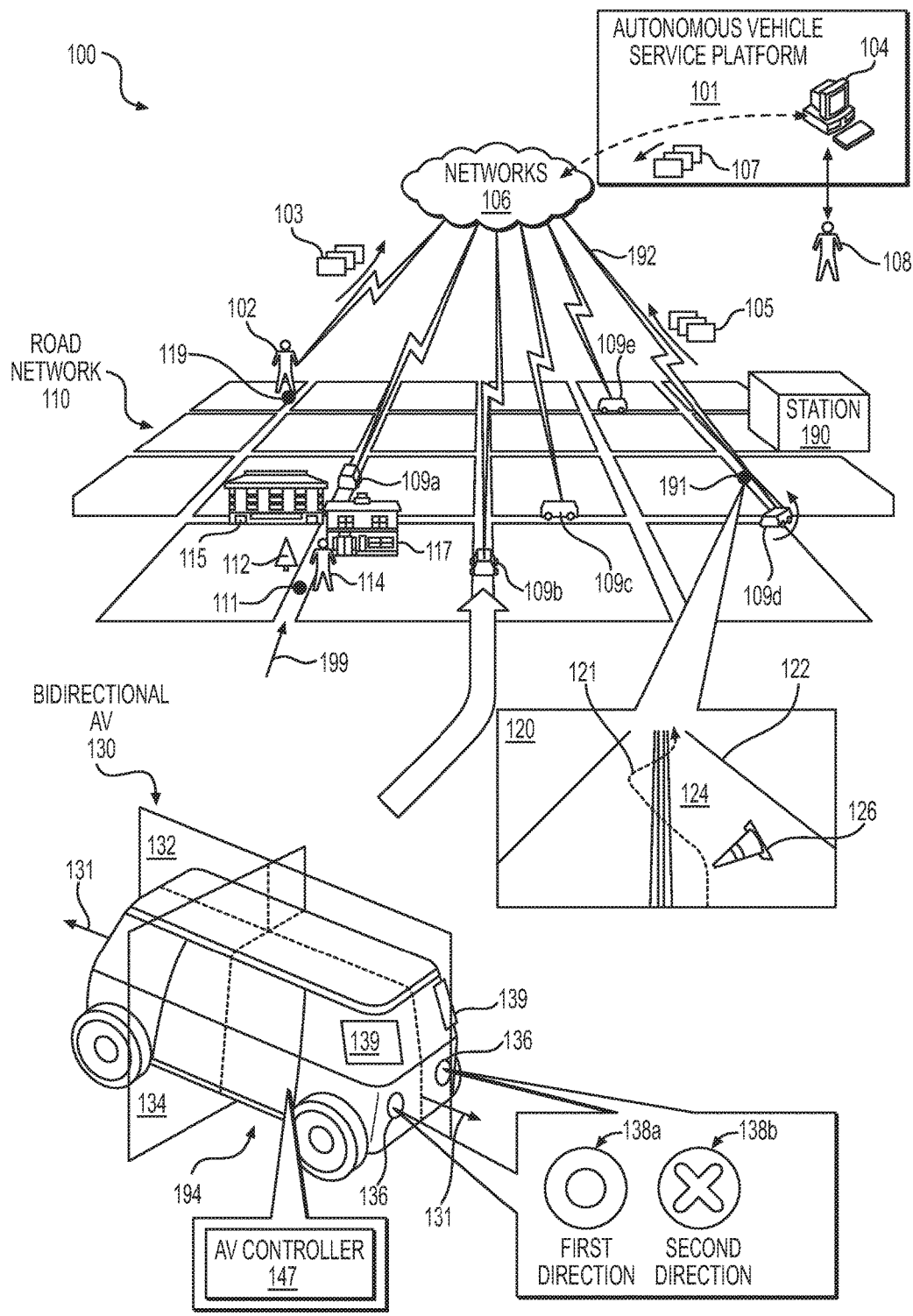
FIG. 1 is a diagram depicting implementation of a fleet of autonomous vehicles that are communicatively networked to an autonomous vehicle service platform, according to some embodiments.

FIG. 1 is a diagram depicting an implementation of a fleet of autonomous vehicles that are communicatively networked to an autonomous vehicle service platform, according to some embodiments. Diagram 100 depicts a fleet of autonomous vehicles 109 (e.g., one or more of autonomous vehicles 109a to 109e) operating as a service, each autonomous vehicle 109 being configured to self-drive a road network 110 and establish a communication link 192 with an autonomous vehicle service platform 101. In examples in which a fleet of autonomous vehicles 109 constitutes a service, a user 102 may transmit a request 103 for autonomous transportation via one or more networks 106 to autonomous vehicle service platform 101. In response, autonomous vehicle service platform 101 may dispatch one of autonomous vehicles 109 to transport user 102 autonomously from geographic location 119 to geographic location 111. Autonomous vehicle service platform 101 may dispatch an autonomous vehicle from a station 190 to geographic location 119, or may divert an autonomous vehicle 109c, already in transit (e.g., without occupants), to service the transportation request for user 102. Autonomous vehicle service platform 101 may be further configured to divert an autonomous vehicle 109c in transit, with passengers, responsive to a request from user 102 (e.g., as a passenger). In addition, autonomous vehicle service platform 101 may be configured to reserve an autonomous vehicle 109c in transit, with passengers, for diverting to service a request of user 102 subsequent to dropping off existing passengers. Note that multiple autonomous vehicle service platforms 101 (not shown) and one or more stations 190 may be implemented to service one or more autonomous vehicles 109 in connection with road network 110. One or more stations 190 may be configured to store, service, manage, and/or maintain an inventory of autonomous vehicles 109 (e.g., station 190 may include one or more computing devices implementing autonomous vehicle service platform 101).

According to some examples, at least some of autonomous vehicles 109a to 109e are configured as bidirectional autonomous vehicles, such as bidirectional autonomous vehicle ("AV") 130. Bidirectional autonomous vehicle 130 may be configured to travel in either direction principally along, but not limited to, a longitudinal axis 131. Accordingly, bidirectional autonomous vehicle 130 may be configured to implement active lighting external to the vehicle to alert others (e.g., other drivers, pedestrians, cyclists, etc.) in the adjacent vicinity, and a direction in which bidirectional autonomous vehicle 130 is traveling. For example, active sources of light 136 may be implemented as active lights 138a when traveling in a first direction, or may be implemented as active lights 138b when traveling in a second direction. Active lights 138a may be implemented using a first subset of one or more colors, with optional animation (e.g., light patterns of variable intensities of light or color that may change over time). Similarly, active lights 138b may be implemented using a second subset of one or more colors and light patterns that may be different than those of active lights 138a. For example, active lights 138a may be implemented using white-colored lights as "headlights," whereas active lights 138b may be implemented using red-colored lights as "taillights." Active lights 138a and 138b, or portions thereof, may be configured to provide other light-related functionalities, such as provide "turn signal indication" functions (e.g., using yellow light). According to various examples, logic in autonomous vehicle 130 may be configured to adapt active lights 138a and 138b to comply with various safety requirements and traffic regulations or laws for any number of jurisdictions.

In some embodiments, bidirectional autonomous vehicle 130 may be configured to have similar structural elements and components in each quad portion, such as quad portion 194. The quad portions are depicted, at least in this example, as portions of bidirectional autonomous vehicle 130 defined by the intersection of a plane 132 and a plane 134, both of which pass through the vehicle to form two similar halves on each side of planes 132 and 134. Further, bidirectional autonomous vehicle 130 may include an autonomous vehicle controller 147 that includes logic (e.g., hardware or software, or as combination thereof) that is configured to control a predominate number of vehicle functions, including driving control (e.g., propulsion, steering, etc.) and active sources 136 of light, among other functions. Bidirectional autonomous vehicle 130 also includes a number of sensors 139 disposed at various locations on the vehicle (other sensors are not shown).

Autonomous vehicle controller 147 may be further configured to determine a local pose (e.g., local position) of an autonomous vehicle 109 and to detect external objects relative to the vehicle. For example, consider that bidirectional autonomous vehicle 130 is traveling in the direction 119 in road network 110. A localizer (not shown) of autonomous vehicle controller 147 can determine a local pose at the geographic location 111. As such, the localizer may use acquired sensor data, such as sensor data associated with surfaces of buildings 115 and 117, which can be compared against reference data, such as map data (e.g., 3D map data, including reflectance data) to determine a local pose. Further, a perception engine (not shown) of autonomous vehicle controller 147 may be configured to detect, classify, and predict the behavior of external objects, such as external object 112 (a "tree") and external object 114 (a "pedestrian"). Classification of such external objects may broadly classify objects as static objects, such as external object 112, and dynamic objects, such as external object 114. The localizer and the perception engine, as well as other components of the AV controller 147, collaborate to cause autonomous vehicles 109 to drive autonomously.

According to some examples, autonomous vehicle service platform 101 is configured to provide teleoperator services should an autonomous vehicle 109 request teleoperation. For example, consider that an autonomous vehicle controller 147 in autonomous vehicle 109*d* detects an object 126 obscuring a path 124 on roadway 122 at point 191, as depicted in inset 120. If autonomous vehicle controller 147 cannot ascertain a path or trajectory over which vehicle 109*d* may safely transit with a relatively high degree of certainty, then autonomous vehicle controller 147 may transmit request message 105 for teleoperation services. In response, a teleoperator computing device 104 may receive instructions from a teleoperator 108 to perform a course of action to successfully (and safely) negotiate obstacles 126. Response data 107 then can be transmitted back to autonomous vehicle 109*d* to cause the vehicle to, for example, safely cross a set of double lines as it transits along the alternate path 121. In some examples, teleoperator computing device 104 may generate a response identifying geographic areas to exclude from planning a path. In particular, rather than provide a path to follow, a teleoperator 108 may define areas or locations that the autonomous vehicle must avoid.

In view of the foregoing, the structures and/or functionalities of autonomous vehicle 130 and/or autonomous vehicle controller 147, as well as their components, can perform real-time (or near real-time) trajectory calculations through autonomous-related operations, such as localization and perception, to enable autonomous vehicles 109 to self-drive.

In some cases, the bidirectional nature of bidirectional autonomous vehicle 130 provides for a vehicle that has quad portions 194 (or any other number of symmetric portions) that are similar or are substantially similar to each other. Such symmetry reduces complexity of design and decreases relatively the number of unique components or structures, thereby reducing inventory and manufacturing complexities. For example, a drivetrain and wheel system may be disposed in any of the quad portions 194. Further, autonomous vehicle controller 147 is configured to invoke teleoperation services to reduce the likelihood that an autonomous vehicle 109 is delayed in transit while resolving an event or issue that may otherwise affect the safety of the occupants. In some cases, the visible portion of road network 110 depicts a geo-fenced region that may limit or otherwise control the movement of autonomous vehicles 109 to the road network shown in FIG. 1. According to various examples, autonomous vehicle 109, and a fleet thereof, may be configurable to operate as a level 4 ("full self-driving automation," or L4) vehicle that can provide transportation on demand with the convenience and privacy of point-to-point personal mobility while providing the efficiency of shared vehicles. In some examples, autonomous vehicle 109, or any autonomous vehicle described herein, may be configured to omit a steering wheel or any other mechanical means of providing manual (i.e., human-controlled) steering for autonomous vehicle 109. Further, autonomous vehicle 109, or any autonomous vehicle described herein, may be configured to omit a seat or location reserved within the vehicle for an occupant to engage a steering wheel or any mechanical interface for a steering system.

Figure 2:
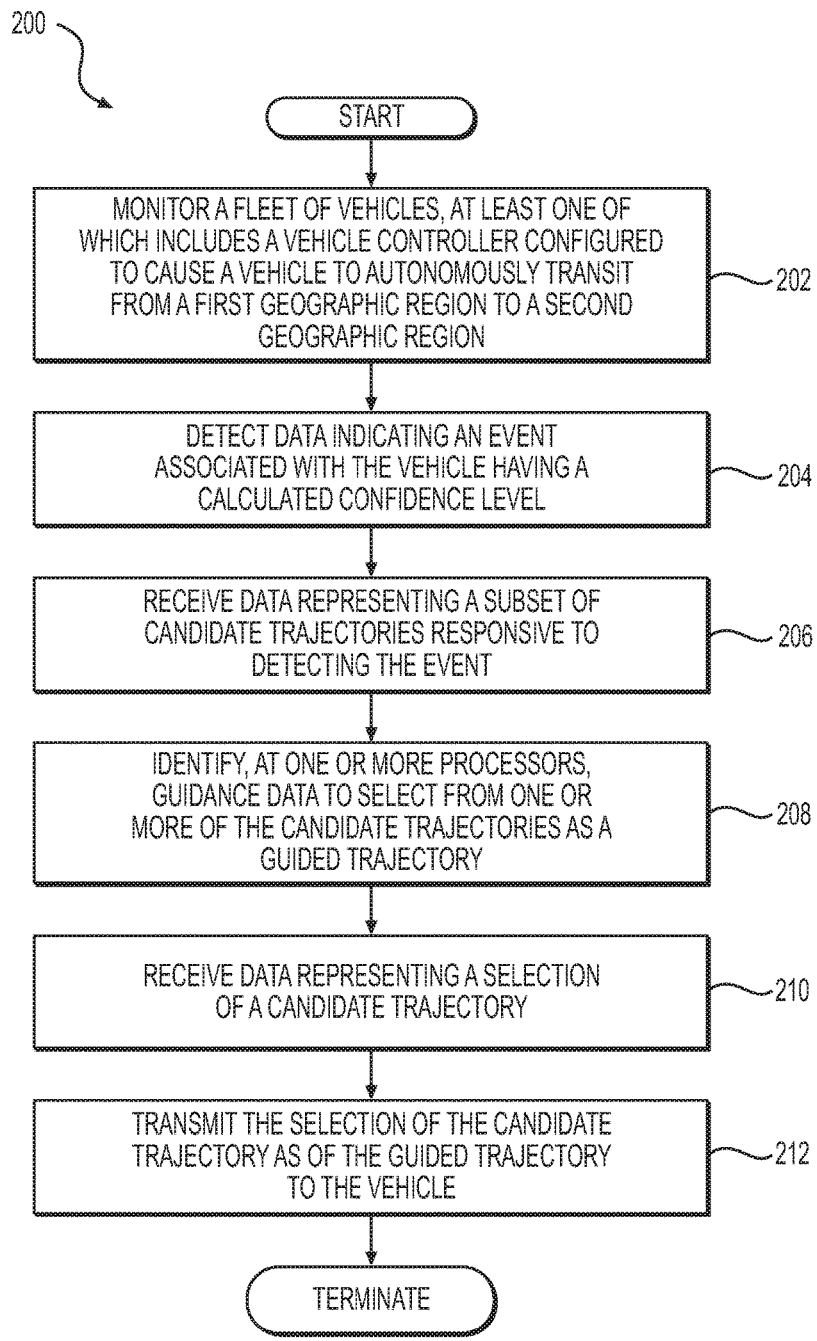
FIG. 2 is an example of a flow diagram to monitor a fleet of autonomous vehicles, according to some embodiments.

FIG. 2 is an example of a flow diagram to monitor a fleet of autonomous vehicles, according to some embodiments. At 202, flow 200 begins when a fleet of autonomous vehicles are monitored. At least one autonomous vehicle includes an autonomous vehicle controller configured to cause the vehicle to autonomously transit from a first geographic region to a second geographic region. At 204, data representing an event associated with a calculated confidence level for a vehicle is detected. An event may be a condition or situation affecting operation, or potentially affecting operation, of an autonomous vehicle. The events may be internal to an autonomous vehicle, or external. For example, an obstacle obscuring a roadway may be viewed as an event, as well as a reduction or loss of communication. An event may include traffic conditions or congestion, as well as unexpected or unusual numbers or types of external objects (or tracks) that are perceived by a perception engine. An event may include weather-related conditions (e.g., loss of friction due to ice or rain) or the angle at which the sun is shining (e.g., at sunset), such as low angle to the horizon that cause sun to shine brightly in the eyes of human drivers of other vehicles. These and other conditions may be viewed as events that cause invocation of the teleoperator service or for the vehicle to execute a safe-stop trajectory.

At 206, data representing a subset of candidate trajectories may be received from an autonomous vehicle responsive to the detection of the event. For example, a planner of an autonomous vehicle controller may calculate and evaluate large numbers of trajectories (e.g., thousands or greater) per unit time, such as a second. In some embodiments, candidate trajectories are a subset of the trajectories that provide for relatively higher confidence levels that an autonomous vehicle may move forward safely in view of the event (e.g., using an alternate path provided by a teleoperator). Note that some candidate trajectories may be ranked or associated with higher degrees of confidence than other candidate trajectories. According to some examples, subsets of candidate trajectories may originate from any number of sources, such as a planner, a teleoperator computing device (e.g., teleoperators can determine and provide approximate paths), etc., and may be combined as a superset of candidate trajectories. At 208, path guidance data may be identified at one or more processors. The path guidance data may be configured to assist a teleoperator in selecting a guided trajectory from one or more of the candidate trajectories. In some instances, the path guidance data specifies a value indicative of a confidence level or probability that indicates the degree of certainty that a particular candidate trajectory may reduce or negate the probability that the event may impact operation of an autonomous vehicle. A guided trajectory, as a selected candidate trajectory, may be received at 210, responsive to input from a teleoperator (e.g., a teleoperator may select at least one candidate trajectory as a guided trajectory from a group of differently-ranked candidate trajectories). The selection may be made via an operator interface that lists a number of candidate trajectories, for example, in order from highest confidence levels to lowest confidence levels. At 212, the selection of a candidate trajectory as a guided trajectory may be transmitted to the vehicle, which, in turn, implements the guided trajectory for resolving the condition by causing the vehicle to perform a teleoperator-specified maneuver. As such, the autonomous vehicle may transition from a non-normative operational state.

Figure 3A:
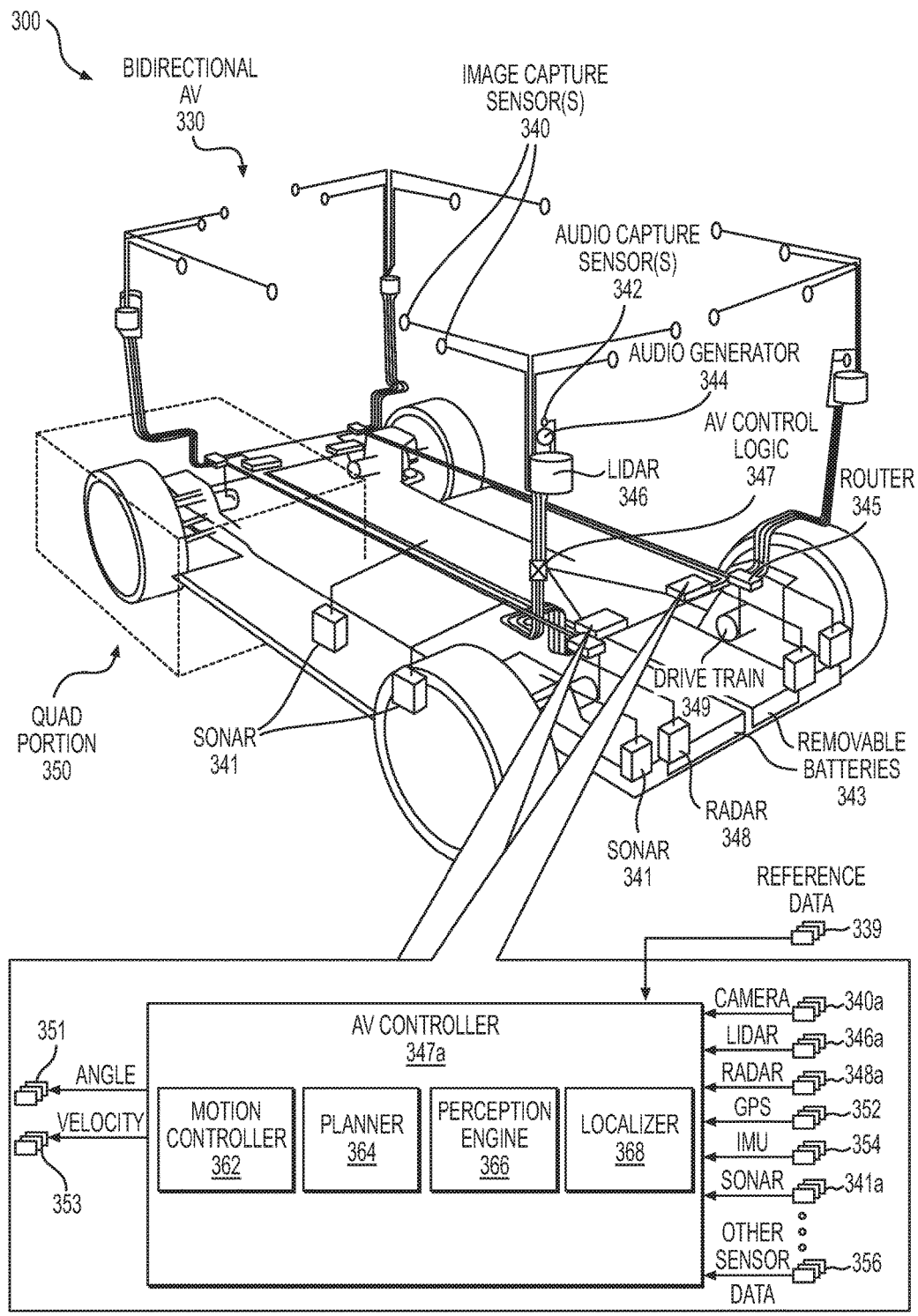
FIG. 3A is a diagram depicting examples of sensors and other autonomous vehicle components, according to some examples.

FIG. 3A is a diagram depicting examples of sensors and other autonomous vehicle components, according to some examples. Diagram 300 depicts an interior view of a bidirectional autonomous vehicle 330 that includes sensors, signal routers 345, drive trains 349, removable batteries 343, audio generators 344 (e.g., speakers or transducers), and autonomous vehicle ("AV") control logic 347. Sensors shown in diagram 300 include image capture sensors 340 (e.g., light capture devices or cameras of any type), audio capture sensors 342 (e.g., microphones of any type), radar devices 348, sonar devices 341 (or other like sensors, including ultrasonic sensors or acoustic-related sensors), and Lidar devices 346, among other sensor types and modalities (some of which are not shown, such inertial measurement units, or "IMUs," global positioning system ("GPS") sensors, sonar sensors, etc.). Note that quad portion 350 is representative of the symmetry of each of four "quad portions" of bidirectional autonomous vehicle 330 (e.g., each quad portion 350 may include a wheel, a drivetrain 349, similar steering mechanisms, similar structural support and members, etc. beyond that which is depicted). As depicted in FIG. 3A, similar sensors may be placed in similar locations in each quad portion 350, however any other configuration may implemented. Each wheel may be steerable individually and independent of the others. Note, too, that removable batteries 343 may be configured to facilitate being swapped in and swapped out rather than charging in situ, thereby ensuring reduced or negligible downtimes due to the necessity of charging batteries 343. While autonomous vehicle controller 347a is depicted as being used in a bidirectional autonomous vehicle 330, autonomous vehicle controller 347a is not so limited and may be implemented in unidirectional autonomous vehicles or any other type of vehicle, whether on land, in air, or at sea. Note that the depicted and described positions, locations, orientations, quantities, and types of sensors shown in FIG. 3A are not intended to be limiting, and, as such, there may be any number and type of sensor, and any sensor may be located and oriented anywhere on autonomous vehicle 330.

According to some embodiments, portions of the autonomous vehicle ("AV") control logic 347 may be implemented using clusters of graphics processing units ("GPUs") implementing a framework and programming model suitable for programming the clusters of GPUs. For example, a compute unified device architecture ("CUDA")-compatible programming language and application programming interface ("API") model may be used to program the GPUs. CUDA™ is produced and maintained by NVIDIA of Santa Clara, Calif. Note that other programming languages may be implemented, such as OpenCL, or any other parallel programming language.

According to some embodiments, autonomous vehicle control logic 347 may be implemented in hardware and/or software as autonomous vehicle controller 347a, which is shown to include a motion controller 362, a planner 364, a perception engine 366, and a localizer 368. As shown, autonomous vehicle controller 347a is configured to receive camera data 340a, Lidar data 346a, and radar data 348a, or any other range-sensing or localization data, including sonar data 341a or the like. Autonomous vehicle controller 347a is also configured to receive positioning data, such as GPS data 352, IMU data 354, and other position-sensing data (e.g., wheel-related data, such as steering angles, angular velocity, etc.). Further, autonomous vehicle controller 347a may receive any other sensor data 356, as well as reference data 339. In some cases, reference data 339 includes map data (e.g., 3D map data, 2D map data, 4D map data (e.g., including Epoch Determination)) and route data (e.g., road network data, including, but not limited to, RNDF data (or similar data), MDF data (or similar data), etc.

Localizer 368 is configured to receive sensor data from one or more sources, such as GPS data 352, wheel data, IMU data 354, Lidar data 346a, camera data 340a, radar data 348a, and the like, as well as reference data 339 (e.g., 3D map data and route data). Localizer 368 integrates (e.g., fuses the sensor data) and analyzes the data by comparing sensor data to map data to determine a local pose (or position) of bidirectional autonomous vehicle 330. According to some examples, localizer 368 may generate or update the pose or position of any autonomous vehicle in real-time or near real-time. Note that localizer 368 and its functionality need not be limited to "bi-directional" vehicles and can be implemented in any vehicle of any type. Therefore, localizer 368 (as well as other components of AV controller 347a) may be implemented in a "uni-directional" vehicle or any non-autonomous vehicle. According to some embodiments, data describing a local pose may include one or more of an x-coordinate, a y-coordinate, a z-coordinate (or any coordinate of any coordinate system, including polar or cylindrical coordinate systems, or the like), a yaw value, a roll value, a pitch value (e.g., an angle value), a rate (e.g., velocity), altitude, and the like.

Perception engine 366 is configured to receive sensor data from one or more sources, such as Lidar data 346a, camera data 340a, radar data 348a, and the like, as well as local pose data. Perception engine 366 may be configured to determine locations of external objects based on sensor data and other data. External objects, for instance, may be objects that are not part of a drivable surface. For example, perception engine 366 may be able to detect and classify external objects as pedestrians, bicyclists, dogs, other vehicles, etc. (e.g., perception engine 366 is configured to classify the objects in accordance with a type of classification, which may be associated with semantic information, including a label). Based on the classification of these external objects, the external objects may be labeled as dynamic objects or static objects. For example, an external object classified as a tree may be labeled as a static object, while an external object classified as a pedestrian may be labeled as a static object. External objects labeled as static may or may not be described in map data. Examples of external objects likely to be labeled as static include traffic cones, cement barriers arranged across a roadway, lane closure signs, newly-placed mailboxes or trash cans adjacent a roadway, etc. Examples of external objects likely to be labeled as dynamic include bicyclists, pedestrians, animals, other vehicles, etc. If the external object is labeled as dynamic, and further data about the external object may indicate a typical level of activity and velocity, as well as behavior patterns associated with the classification type. Further data about the external object may be generated by tracking the external object. As such, the classification type can be used to predict or otherwise determine the likelihood that an external object may, for example, interfere with an autonomous vehicle traveling along a planned path. For example, an external object that is classified as a pedestrian may be associated with some maximum speed, as well as an average speed (e.g., based on tracking data). The velocity of the pedestrian relative to the velocity of an autonomous vehicle can be used to determine if a collision is likely. Further, perception engine 364 may determine a level of uncertainty associated with a current and future state of objects. In some examples, the level of uncertainty may be expressed as an estimated value (or probability).

Planner 364 is configured to receive perception data from perception engine 366, and may also include localizer data from localizer 368. According to some examples, the perception data may include an obstacle map specifying static and dynamic objects located in the vicinity of an autonomous vehicle, whereas the localizer data may include a local pose or position. In operation, planner 364 generates numerous trajectories, and evaluates the trajectories, based on at least the location of the autonomous vehicle against relative locations of external dynamic and static objects. Planner 364 selects an optimal trajectory based on a variety of criteria over which to direct the autonomous vehicle in way that provides for collision-free travel. In some examples, planner 364 may be configured to calculate the trajectories as probabilistically-determined trajectories. Further, planner 364 may transmit steering and propulsion commands (as well as decelerating or braking commands) to motion controller 362. Motion controller 362 subsequently may convert any of the commands, such as a steering command, a throttle or propulsion command, and a braking command, into control signals (e.g., for application to actuators or other mechanical interfaces) to implement changes in steering or wheel angles 351 and/or velocity 353.

Figure 3B:
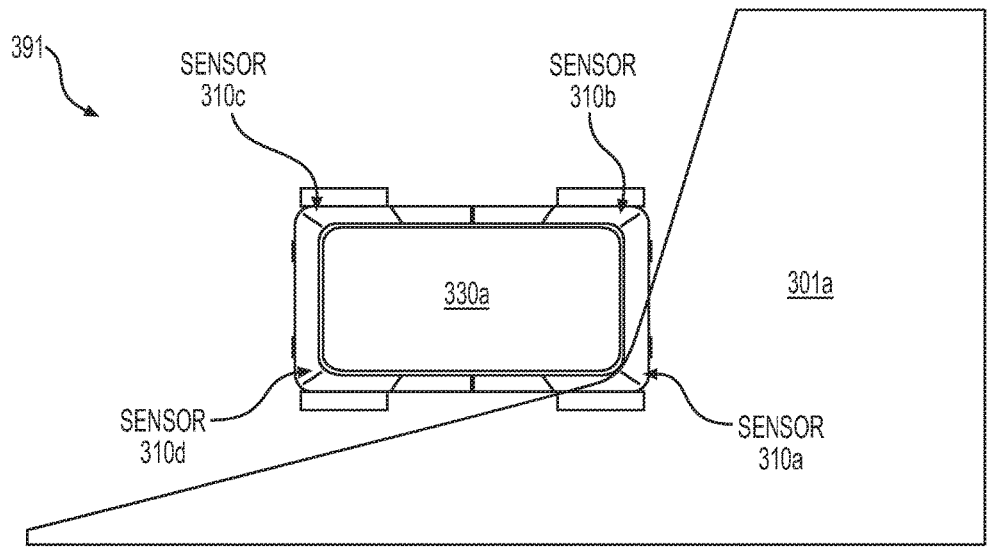
FIGS. 3B to 3E are diagrams depicting examples of sensor field redundancy and autonomous vehicle adaption to a loss of a sensor field, according to some examples.
Figure 3C:
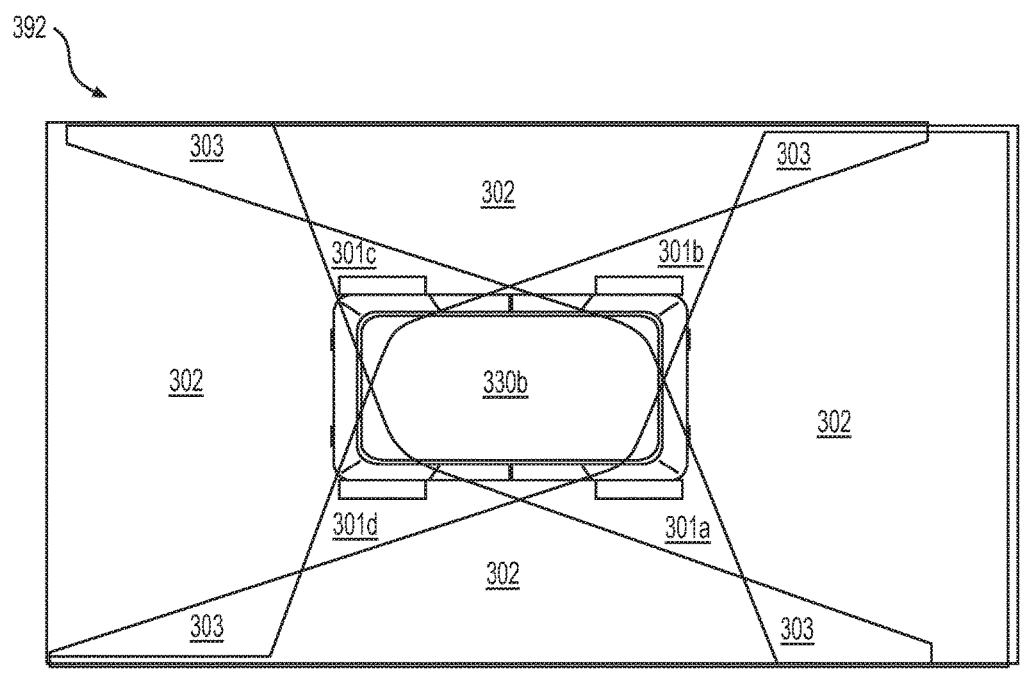

FIGS. 3B to 3E are diagrams depicting examples of sensor field redundancy and autonomous vehicle adaption to a loss of a sensor field, according to some examples. Diagram 391 of FIG. 3B depicts a sensor field 301a in which sensor 310a detects objects (e.g., for determining range or distance, or other information). While sensor 310a may implement any type of sensor or sensor modality, sensor 310a and similarly-described sensors, such as sensors 310b, 310c, and 310d, may include Lidar devices. Therefore, sensor fields 301a, 301b, 301c, and 301d each includes a field into which lasers extend. Diagram 392 of FIG. 3C depicts four overlapping sensor fields each of which is generated by a corresponding Lidar sensor 310 (not shown). As shown, portions 301 of the sensor fields include no overlapping sensor fields (e.g., a single Lidar field), portions 302 of the sensor fields include two overlapping sensor fields, and portions 303 include three overlapping sensor fields, whereby such sensors provide for multiple levels of redundancy should a Lidar sensor fail.

Figure 3D:
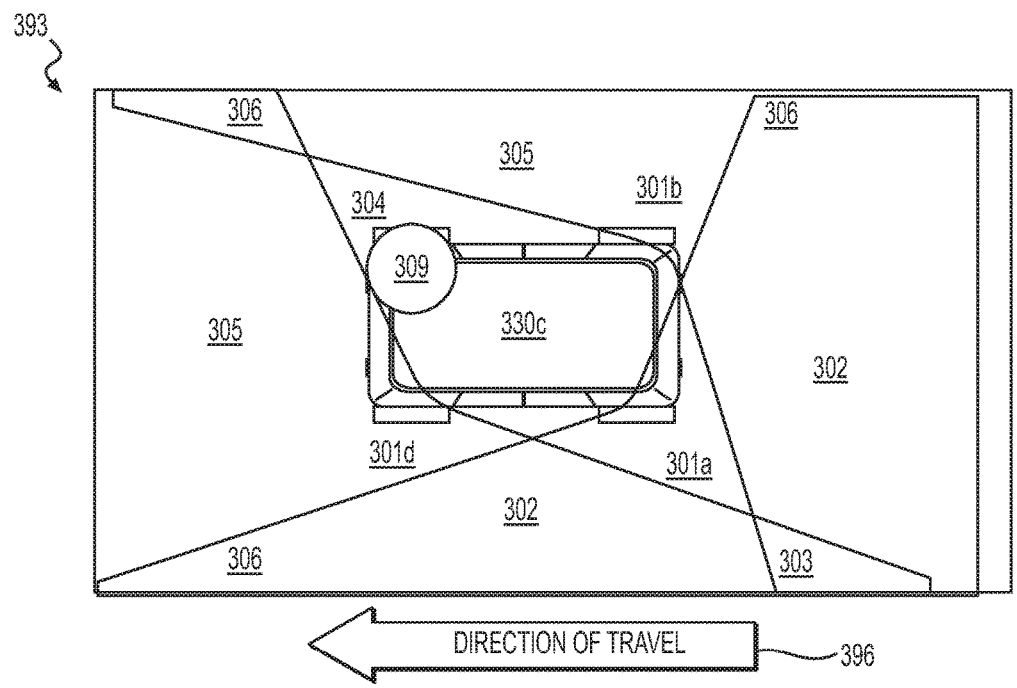
Figure 3E:
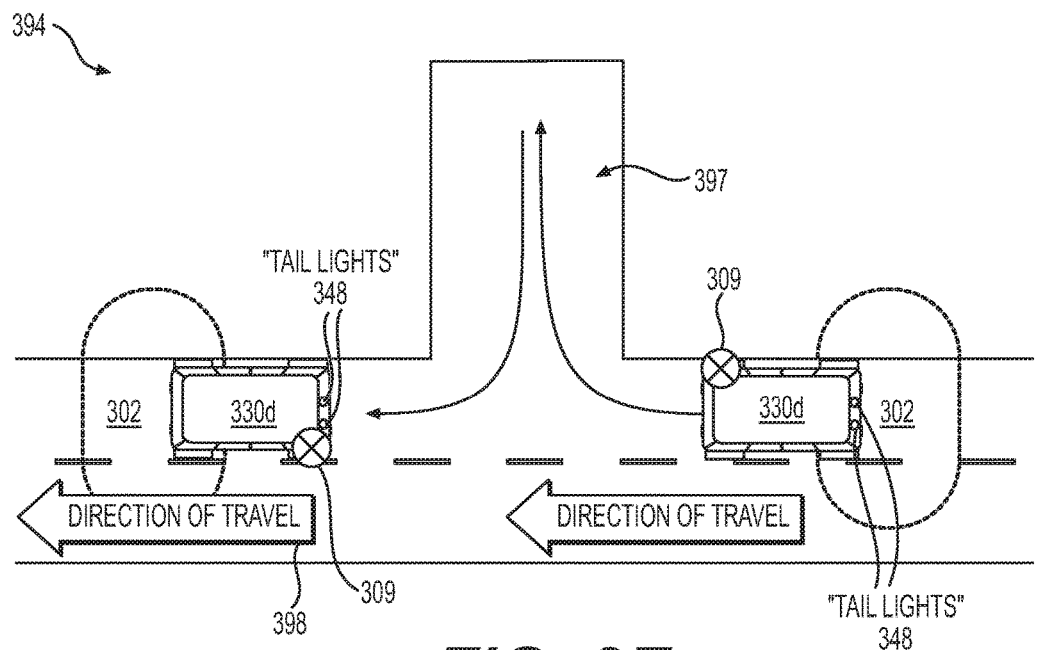

FIG. 3D depicts a loss of a sensor field due to failed operation of Lidar 309, according to some examples. Sensor field 302 of FIG. 3C is transformed into a single sensor field 305, one of sensor fields 301 of FIG. 3C is lost to a gap 304, and three of sensor fields 303 of FIG. 3C are transformed into sensor fields 306 (i.e., limited to two overlapping fields). Should autonomous car 330c be traveling in the direction of travel 396, the sensor field in front of the moving autonomous vehicle may be less robust than the one at the trailing end portion. According to some examples, an autonomous vehicle controller (not shown) is configured to leverage the bidirectional nature of autonomous vehicle 330c to address the loss of sensor field at the leading area in front of the vehicle. FIG. 3E depicts a bidirectional maneuver for restoring a certain robustness of the sensor field in front of autonomous vehicle 330d. As shown, a more robust sensor field 302 is disposed at the rear of the vehicle 330d coextensive with taillights 348. When convenient, autonomous vehicle 330d performs a bidirectional maneuver by pulling into a driveway 397 and switches its directionality such that taillights 348 actively switch to the other side (e.g., the trailing edge) of autonomous vehicle 330d. As shown, autonomous vehicle 330d restores a robust sensor field 302 in front of the vehicle as it travels along direction of travel 398. Further, the above-described bidirectional maneuver obviates a requirement for a more complicated maneuver that requires backing up into a busy roadway.

Figure 4:
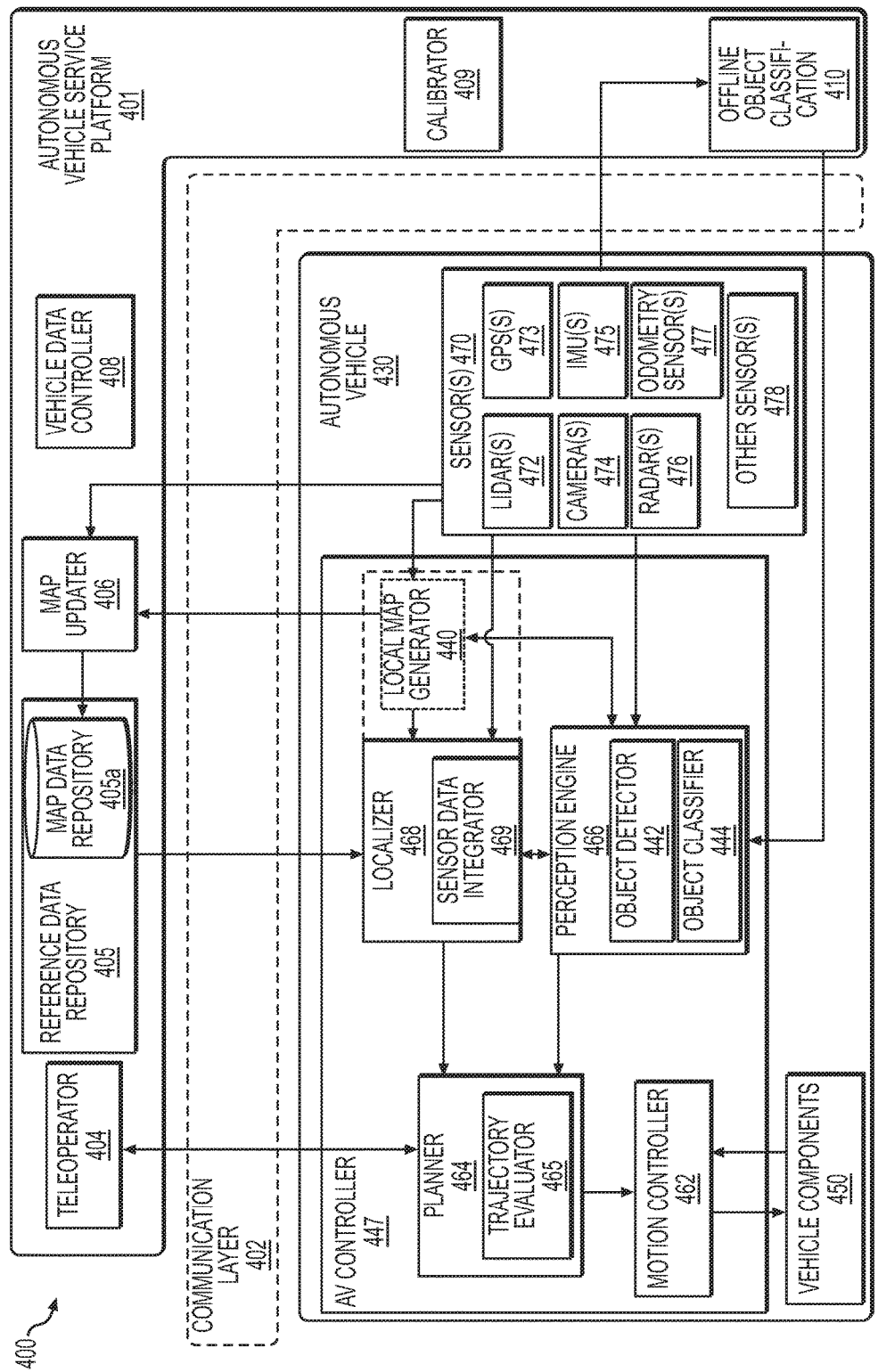
FIG. 4 is a functional block diagram depicting a system including an autonomous vehicle service platform that is communicatively coupled via a communication layer to an autonomous vehicle controller, according to some examples.

FIG. 4 is a functional block diagram depicting a system including an autonomous vehicle service platform that is communicatively coupled via a communication layer to an autonomous vehicle controller, according to some examples. Diagram 400 depicts an autonomous vehicle controller ("AV") 447 disposed in an autonomous vehicle 430, which, in turn, includes a number of sensors 470 coupled to autonomous vehicle controller 447. Sensors 470 include one or more Lidar devices 472, one or more cameras 474, one or more radars 476, one or more global positioning system ("GPS") data receiver-sensors, one or more inertial measurement units ("IMUs") 475, one or more odometry sensors 477 (e.g., wheel encoder sensors, wheel speed sensors, and the like), and any other suitable sensors 478, such as infrared cameras or sensors, hyperspectral-capable sensors, ultrasonic sensors (or any other acoustic energy-based sensor), radio frequency-based sensors, etc. In some cases, wheel angle sensors configured to sense steering angles of wheels may be included as odometry sensors 477 or suitable sensors 478. In a non-limiting example, autonomous vehicle controller 447 may include four or more Lidars 472, sixteen or more cameras 474 and four or more radar units 476. Further, sensors 470 may be configured to provide sensor data to components of autonomous vehicle controller 447 and to elements of autonomous vehicle service platform 401. As shown in diagram 400, autonomous vehicle controller 447 includes a planner 464, a motion controller 462, a localizer 468, a perception engine 466, and a local map generator 440. Note that elements depicted in diagram 400 of FIG. 4 may include structures and/or functions as similarly-named elements described in connection to one or more other drawings.

Localizer 468 is configured to localize autonomous vehicle (i.e., determine a local pose) relative to reference data, which may include map data, route data (e.g., road network data, such as RNDF-like data), and the like. In some cases, localizer 468 is configured to identify, for example, a point in space that may represent a location of autonomous vehicle 430 relative to features of a representation of an environment. Localizer 468 is shown to include a sensor data integrator 469, which may be configured to integrate multiple subsets of sensor data (e.g., of different sensor modalities) to reduce uncertainties related to each individual type of sensor. According to some examples, sensor data integrator 469 is configured to fuse sensor data (e.g., Lidar data, camera data, radar data, etc.) to form integrated sensor data values for determining a local pose. According to some examples, localizer 468 retrieves reference data originating from a reference data repository 405, which includes a map data repository 405a for storing 2D map data, 3D map data, 4D map data, and the like. Localizer 468 may be configured to identify at least a subset of features in the environment to match against map data to identify, or otherwise confirm, a pose of autonomous vehicle 430. According to some examples, localizer 468 may be configured to identify any amount of features in an environment, such that a set of features can one or more features, or all features. In a specific example, any amount of Lidar data (e.g., most or substantially all Lidar data) may be compared against data representing a map for purposes of localization. Generally, non-matched objects resulting from the comparison of the environment features and map data may be a dynamic object, such as a vehicle, bicyclist, pedestrian, etc. Note that detection of dynamic objects, including obstacles, may be performed with or without map data. In particular, dynamic objects may be detected and tracked independently of map data (i.e., in the absence of map data). In some instances, 2D map data and 3D map data may be viewed as "global map data" or map data that has been validated at a point in time by autonomous vehicle service platform 401. As map data in map data repository 405*a* may be updated and/or validated periodically, a deviation may exist between the map data and an actual environment in which the autonomous vehicle is positioned. Therefore, localizer 468 may retrieve locally-derived map data generated by local map generator 440 to enhance localization. Local map generator 440 is configured to generate local map data in real-time or near real-time. Optionally, local map generator 440 may receive static and dynamic object map data to enhance the accuracy of locally generated maps by, for example, disregarding dynamic objects in localization. According to at least some embodiments, local map generator 440 may be integrated with, or formed as part of, localizer 468. In at least one case, local map generator 440, either individually or in collaboration with localizer 468, may be configured to generate map and/or reference data based on simultaneous localization and mapping ("SLAM") or the like. Note that localizer 468 may implement a "hybrid" approach to using map data, whereby logic in localizer 468 may be configured to select various amounts of map data from either map data repository 405*a* or local map data from local map generator 440, depending on the degrees of reliability of each source of map data. Therefore, localizer 468 may still use out-of-date map data in view of locally-generated map data.

Perception engine 466 is configured to, for example, assist planner 464 in planning routes and generating trajectories by identifying objects of interest in a surrounding environment in which autonomous vehicle 430 is transiting. Further, probabilities may be associated with each of the object of interest, whereby a probability may represent a likelihood that an object of interest may be a threat to safe travel (e.g., a fast-moving motorcycle may require enhanced tracking rather than a person sitting at a bus stop bench while reading a newspaper). As shown, perception engine 466 includes an object detector 442 and an object classifier 444. Object detector 442 is configured to distinguish objects relative to other features in the environment, and object classifier 444 may be configured to classify objects as either dynamic or static objects and track the locations of the dynamic and the static objects relative to autonomous vehicle 430 for planning purposes. Further, perception engine 466 may be configured to assign an identifier to a static or dynamic object that specifies whether the object is (or has the potential to become) an obstacle that may impact path planning at planner 464. Although not shown in FIG. 4, note that perception engine 466 may also perform other perception-related functions, such as segmentation and tracking, examples of which are described below.

Planner 464 is configured to generate a number of candidate trajectories for accomplishing a goal to reaching a destination via a number of paths or routes that are available. Trajectory evaluator 465 is configured to evaluate candidate trajectories and identify which subsets of candidate trajectories are associated with higher degrees of confidence levels of providing collision-free paths to the destination. As such, trajectory evaluator 465 can select an optimal trajectory based on relevant criteria for causing commands to generate control signals for vehicle components 450 (e.g., actuators or other mechanisms). Note that the relevant criteria may include any number of factors that define optimal trajectories, the selection of which need not be limited to reducing collisions. For example, the selection of trajectories may be made to optimize user experience (e.g., user comfort) as well as collision-free trajectories that comply with traffic regulations and laws. User experience may be optimized by moderating accelerations in various linear and angular directions (e.g., to reduce jerking-like travel or other unpleasant motion). In some cases, at least a portion of the relevant criteria can specify which of the other criteria to override or supersede, while maintain optimized, collision-free travel. For example, legal restrictions may be temporarily lifted or deemphasized when generating trajectories in limited situations (e.g., crossing double yellow lines to go around a cyclist or travelling at higher speeds than the posted speed limit to match traffic flows). As such, the control signals are configured to cause propulsion and directional changes at the drivetrain and/or wheels. In this example, motion controller 462 is configured to transform commands into control signals (e.g., velocity, wheel angles, etc.) for controlling the mobility of autonomous vehicle 430. In the event that trajectory evaluator 465 has insufficient information to ensure a confidence level high enough to provide collision-free, optimized travel, planner 464 can generate a request to teleoperator 404 for teleoperator support.

Autonomous vehicle service platform 401 includes teleoperator 404 (e.g., a teleoperator computing device), reference data repository 405, a map updater 406, a vehicle data controller 408, a calibrator 409, and an off-line object classifier 410. Note that each element of autonomous vehicle service platform 401 may be independently located or distributed and in communication with other elements in autonomous vehicle service platform 401. Further, element of autonomous vehicle service platform 401 may independently communicate with the autonomous vehicle 430 via the communication layer 402. Map updater 406 is configured to receive map data (e.g., from local map generator 440, sensors 460, or any other component of autonomous vehicle controller 447), and is further configured to detect deviations, for example, of map data in map data repository 405*a* from a locally-generated map. Vehicle data controller 408 can cause map updater 406 to update reference data within repository 405 and facilitate updates to 2D, 3D, and/or 4D map data. In some cases, vehicle data controller 408 can control the rate at which local map data is received into autonomous vehicle service platform 408 as well as the frequency at which map updater 406 performs updating of the map data.

Calibrator 409 is configured to perform calibration of various sensors of the same or different types. Calibrator 409 may be configured to determine the relative poses of the sensors (e.g., in Cartesian space (x, y, z)) and orientations of the sensors (e.g., roll, pitch and yaw). The pose and orientation of a sensor, such a camera, Lidar sensor, radar sensor, etc., may be calibrated relative to other sensors, as well as globally relative to the vehicle's reference frame. Off-line self-calibration can also calibrate or estimate other parameters, such as vehicle inertial tensor, wheel base, wheel radius or surface road friction. Calibration can also be done online to detect parameter change, according to some examples. Note, too, that calibration by calibrator 409 may include intrinsic parameters of the sensors (e.g., optical distortion, beam angles, etc.) and extrinsic parameters. In some cases, calibrator 409 may be performed by maximizing a correlation between depth discontinuities in 3D laser data and edges of image data, as an example. Off-line object classification 410 is configured to receive data, such as sensor data, from sensors 470 or any other component of autonomous vehicle controller 447. According to some embodiments, an off-line classification pipeline of off-line object classification 410 may be configured to pre-collect and annotate objects (e.g., manually by a human and/or automatically using an offline labeling algorithm), and may further be configured to train an online classifier (e.g., object classifier 444), which can provide real-time classification of object types during online autonomous operation.

Figure 5:
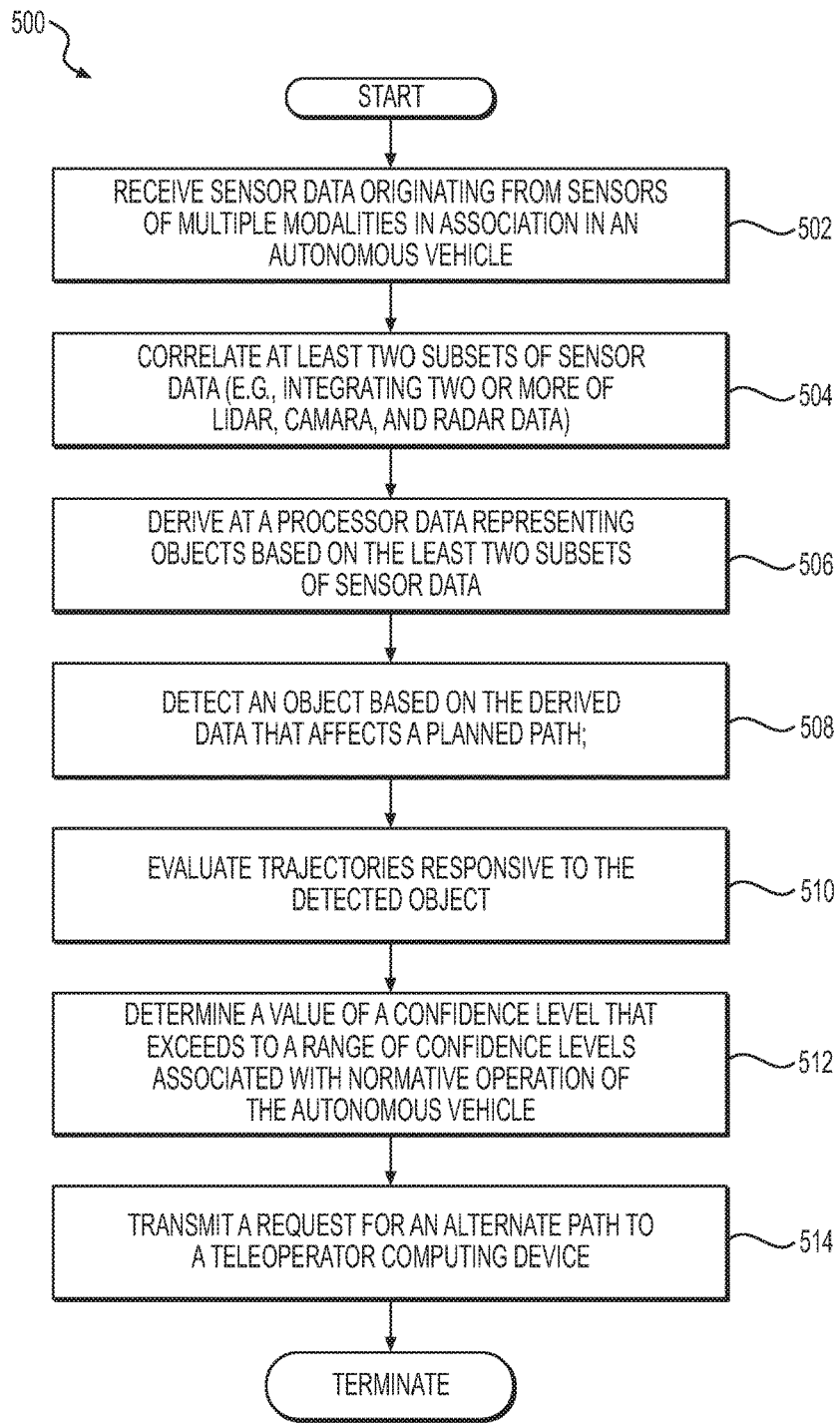
FIG. 5 is an example of a flow diagram to control an autonomous vehicle, according to some embodiments.

FIG. 5 is an example of a flow diagram to control an autonomous vehicle, according to some embodiments. At 502, flow 500 begins when sensor data originating from sensors of multiple modalities at an autonomous vehicle is received, for example, by an autonomous vehicle controller. One or more subsets of sensor data may be integrated for generating fused data to improve, for example, estimates. In some examples, a sensor stream of one or more sensors (e.g., of same or different modalities) may be fused to form fused sensor data at 504. In some examples, subsets of Lidar sensor data and camera sensor data may be fused at 504 to facilitate localization. At 506, data representing objects based on the least two subsets of sensor data may be derived at a processor. For example, data identifying static objects or dynamic objects may be derived (e.g., at a perception engine) from at least Lidar and camera data. At 508, a detected object is determined to affect a planned path, and a subset of trajectories are evaluated (e.g., at a planner) responsive to the detected object at 510. A confidence level is determined at 512 to exceed a range of acceptable confidence levels associated with normative operation of an autonomous vehicle. Therefore, in this case, a confidence level may be such that a certainty of selecting an optimized path is less likely, whereby an optimized path may be determined as a function of the probability of facilitating collision-free travel, complying with traffic laws, providing a comfortable user experience (e.g., comfortable ride), and/or generating candidate trajectories on any other factor. As such, a request for an alternate path may be transmitted to a teleoperator computing device at 514. Thereafter, the teleoperator computing device may provide a planner with an optimal trajectory over which an autonomous vehicle made travel. In situations, the vehicle may also determine that executing a safe-stop maneuver is the best course of action (e.g., safely and automatically causing an autonomous vehicle to a stop at a location of relatively low probabilities of danger). Note that the order depicted in this and other flow charts herein are not intended to imply a requirement to linearly perform various functions as each portion of a flow chart may be performed serially or in parallel with any one or more other portions of the flow chart, as well as independent or dependent on other portions of the flow chart.

Figure 6:
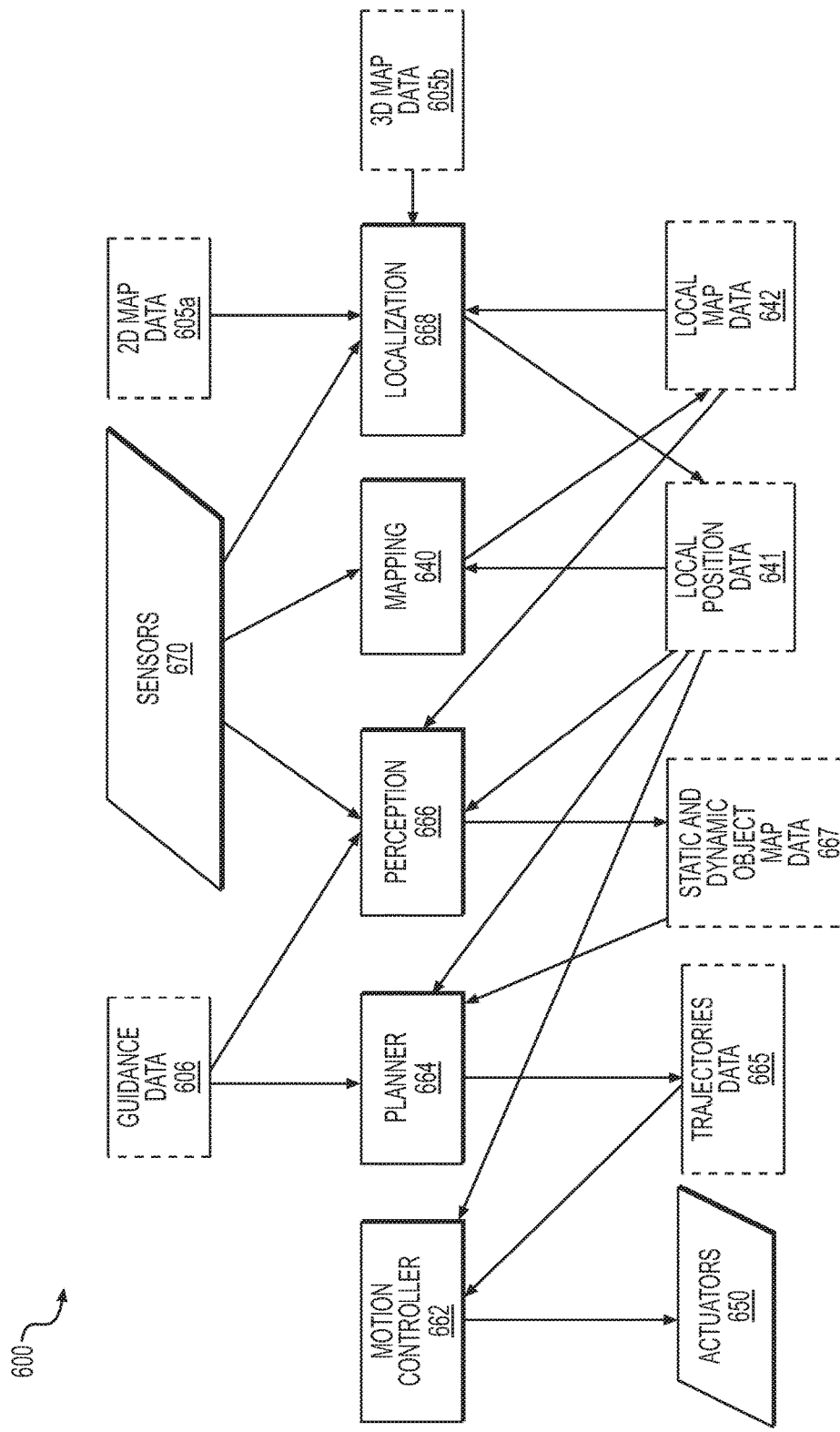
FIG. 6 is a diagram depicting an example of an architecture for an autonomous vehicle controller, according to some embodiments.

FIG. 6 is a diagram depicting an example of an architecture for an autonomous vehicle controller, according to some embodiments. Diagram 600 depicts a number of processes including a motion controller process 662, a planner processor 664, a perception process 666, a mapping process 640, and a localization process 668, some of which may generate or receive data relative to other processes. Other processes, such as such as processes 670 and 650 may facilitate interactions with one or more mechanical components of an autonomous vehicle. For example, perception process 666, mapping process 640, and localization process 668 are configured to receive sensor data from sensors 670, whereas planner process 664 and perception process 666 are configured to receive guidance data 606, which may include route data, such as road network data. Further to diagram 600, localization process 668 is configured to receive map data 605a (i.e., 2D map data), map data 605b (i.e., 3D map data), and local map data 642, among other types of map data. For example, localization process 668 may also receive other forms of map data, such as 4D map data, which may include, for example, an epoch determination. Localization process 668 is configured to generate local position data 641 representing a local pose. Local position data 641 is provided to motion controller process 662, planner process 664, and perception process 666. Perception process 666 is configured to generate static and dynamic object map data 667, which, in turn, may be transmitted to planner process 664. In some examples, static and dynamic object map data 667 may be transmitted with other data, such as semantic classification information and predicted object behavior. Planner process 664 is configured to generate trajectories data 665, which describes a number of trajectories generated by planner 664. Motion controller process uses trajectories data 665 to generate low-level commands or control signals for application to actuators 650 to cause changes in steering angles and/or velocity.

Figure 7:
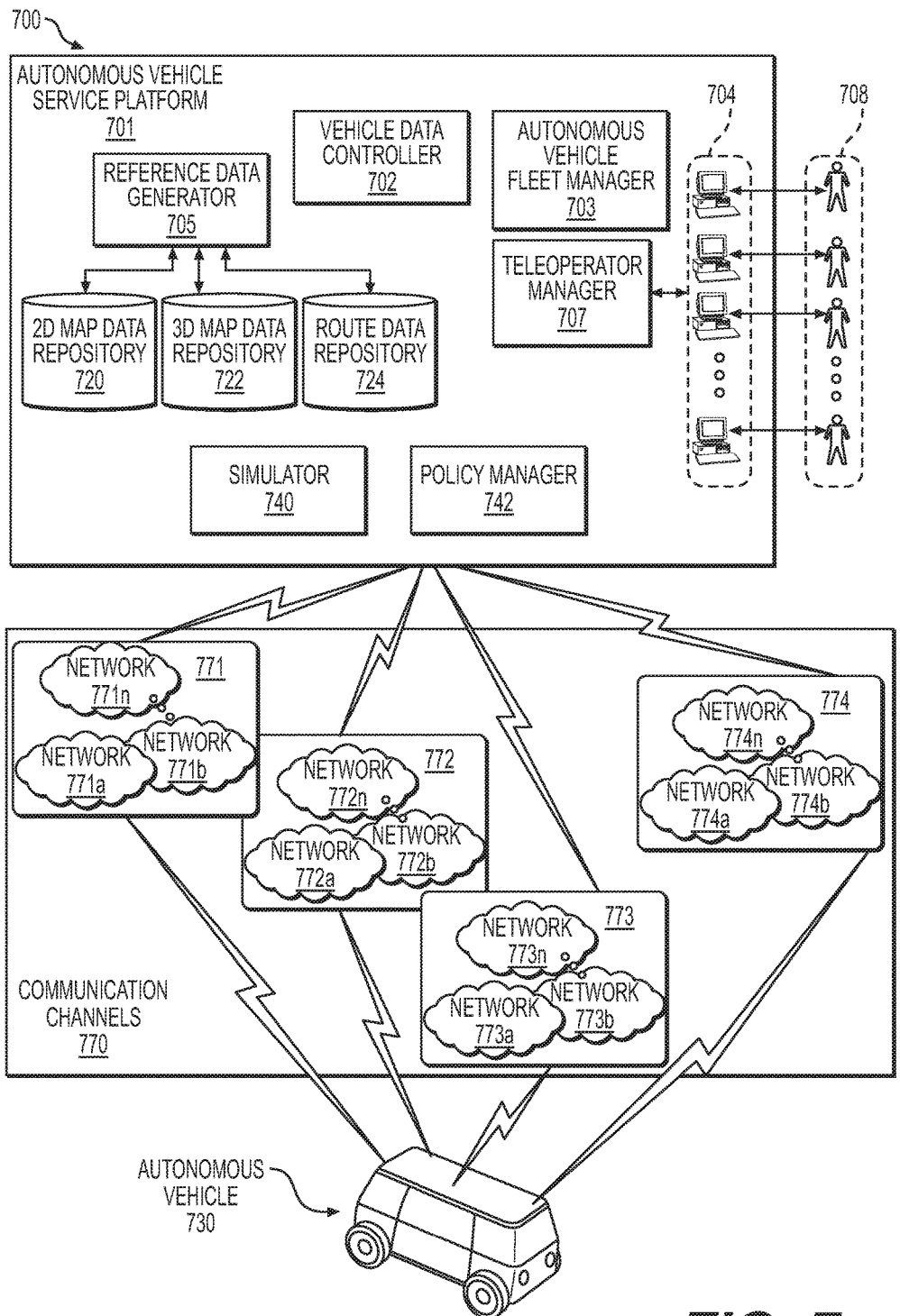
FIG. 7 is a diagram depicting an example of an autonomous vehicle service platform implementing redundant communication channels to maintain reliable communications with a fleet of autonomous vehicles, according to some embodiments.

FIG. 7 is a diagram depicting an example of an autonomous vehicle service platform implementing redundant communication channels to maintain reliable communications with a fleet of autonomous vehicles, according to some embodiments. Diagram 700 depicts an autonomous vehicle service platform 701 including a reference data generator 705, a vehicle data controller 702, an autonomous vehicle fleet manager 703, a teleoperator manager 707, a simulator 740, and a policy manager 742. Reference data generator 705 is configured to generate and modify map data and route data (e.g., RNDF data). Further, reference data generator 705 may be configured to access 2D maps in 2D map data repository 720, access 3D maps in 3D map data repository 722, and access route data in route data repository 724. Other map representation data and repositories may be implemented in some examples, such as 4D map data including Epoch Determination. Vehicle data controller 702 may be configured to perform a variety of operations. For example, vehicle data controller 702 may be configured to change a rate that data is exchanged between a fleet of autonomous vehicles and platform 701 based on quality levels of communication over channels 770. During bandwidth-constrained periods, for example, data communications may be prioritized such that teleoperation requests from autonomous vehicle 730 are prioritized highly to ensure delivery. Further, variable levels of data abstraction may be transmitted per vehicle over channels 770, depending on bandwidth available for a particular channel. For example, in the presence of a robust network connection, full Lidar data (e.g., substantially all Lidar data, but also may be less) may be transmitted, whereas in the presence of a degraded or low-speed connection, simpler or more abstract depictions of the data may be transmitted (e.g., bounding boxes with associated metadata, etc.). Autonomous vehicle fleet manager 703 is configured to coordinate the dispatching of autonomous vehicles 730 to optimize multiple variables, including an efficient use of battery power, times of travel, whether or not an air-conditioning unit in an autonomous vehicle 730 may be used during low charge states of a battery, etc., any or all of which may be monitored in view of optimizing cost functions associated with operating an autonomous vehicle service. An algorithm may be implemented to analyze a variety of variables with which to minimize costs or times of travel for a fleet of autonomous vehicles. Further, autonomous vehicle fleet manager 703 maintains an inventory of autonomous vehicles as well as parts for accommodating a service schedule in view of maximizing up-time of the fleet.

Teleoperator manager 707 is configured to manage a number of teleoperator computing devices 704 with which teleoperators 708 provide input. Simulator 740 is configured to simulate operation of one or more autonomous vehicles 730, as well as the interactions between teleoperator manager 707 and an autonomous vehicle 730. Simulator 740 may also simulate operation of a number of sensors (including the introduction of simulated noise) disposed in autonomous vehicle 730. Further, an environment, such as a city, may be simulated such that a simulated autonomous vehicle can be introduced to the synthetic environment, whereby simulated sensors may receive simulated sensor data, such as simulated laser returns. Simulator 740 may provide other functions as well, including validating software updates and/or map data. Policy manager 742 is configured to maintain data representing policies or rules by which an autonomous vehicle ought to behave in view of a variety of conditions or events that an autonomous vehicle encounters while traveling in a network of roadways. In some cases, updated policies and/or rules may be simulated in simulator 740 to confirm safe operation of a fleet of autonomous vehicles in view of changes to a policy. Some of the above-described elements of autonomous vehicle service platform 701 are further described hereinafter.

Communication channels 770 are configured to provide networked communication links among a fleet of autonomous vehicles 730 and autonomous vehicle service platform 701. For example, communication channel 770 includes a number of different types of networks 771, 772, 773, and 774, with corresponding subnetworks (e.g., 771a to 771n), to ensure a certain level of redundancy for operating an autonomous vehicle service reliably. For example, the different types of networks in communication channels 770 may include different cellular network providers, different types of data networks, etc., to ensure sufficient bandwidth in the event of reduced or lost communications due to outages in one or more networks 771, 772, 773, and 774.

Figure 8:
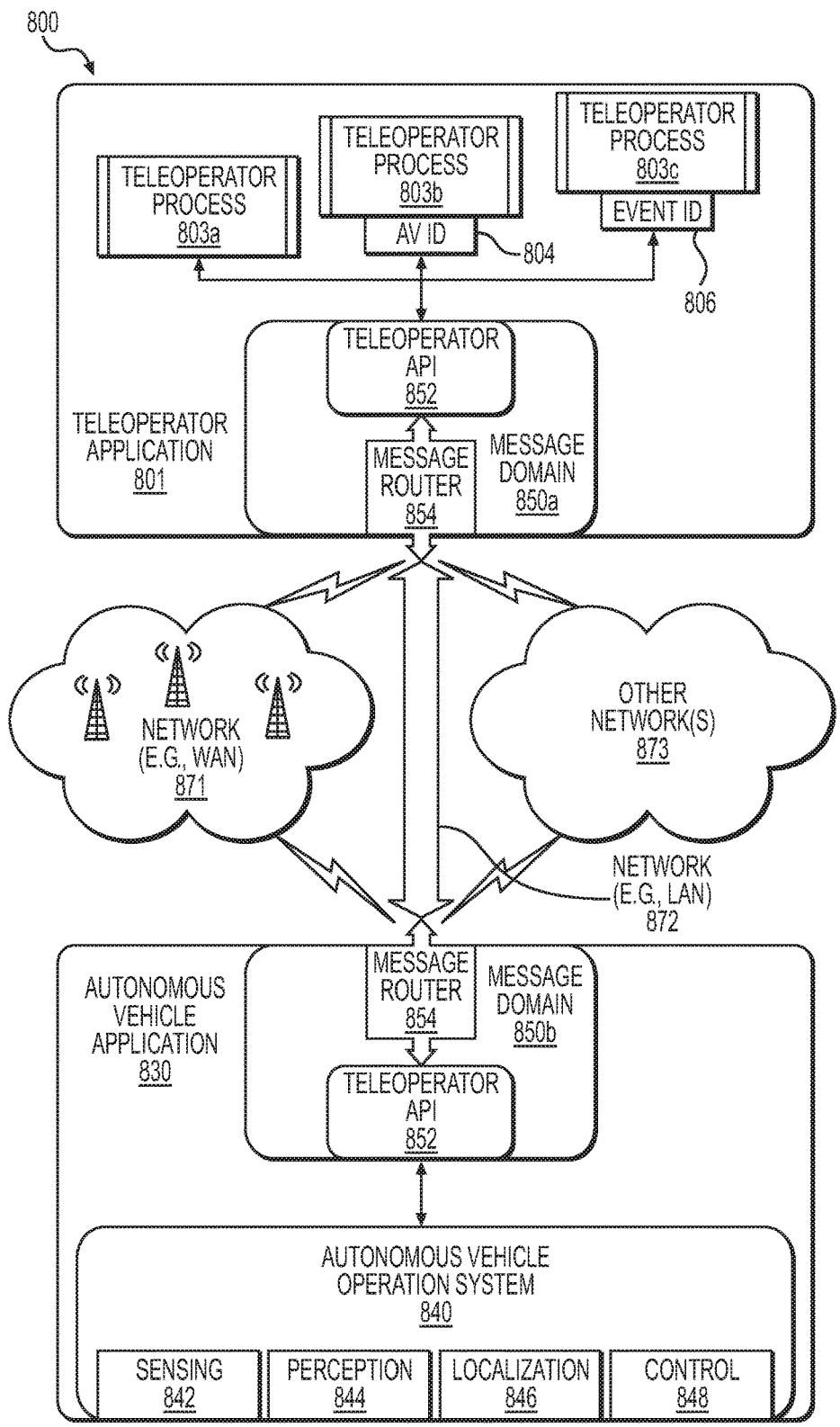
FIG. 8 is a diagram depicting an example of a messaging application configured to exchange data among various applications, according to some embodiment.

FIG. 8 is a diagram depicting an example of a messaging application configured to exchange data among various applications, according to some embodiments. Diagram 800 depicts an teleoperator application 801 disposed in a teleoperator manager, and an autonomous vehicle application 830 disposed in an autonomous vehicle, whereby teleoperator applications 801 and autonomous vehicle application 830 exchange message data via a protocol that facilitates communications over a variety of networks, such as network 871, 872, and other networks 873. According to some examples, the communication protocol is a middleware protocol implemented as a Data Distribution Service™ having a specification maintained by the Object Management Group consortium. In accordance with the communications protocol, teleoperator application 801 and autonomous vehicle application 830 may include a message router 854 disposed in a message domain, the message router being configured to interface with the teleoperator API 852. In some examples, message router 854 is a routing service. In some examples, message domain 850a in teleoperator application 801 may be identified by a teleoperator identifier, whereas message domain 850b be may be identified as a domain associated with a vehicle identifier. Teleoperator API 852 in teleoperator application 801 is configured to interface with teleoperator processes 803a to 803c, whereby teleoperator process 803b is associated with an autonomous vehicle identifier 804, and teleoperator process 803c is associated with an event identifier 806 (e.g., an identifier that specifies an intersection that may be problematic for collision-free path planning). Teleoperator API 852 in autonomous vehicle application 830 is configured to interface with an autonomous vehicle operating system 840, which includes sensing application 842, a perception application 844, a localization application 846, and a control application 848. In view of the foregoing, the above-described communications protocol may facilitate data exchanges to facilitate teleoperations as described herein. Further, the above-described communications protocol may be adapted to provide secure data exchanges among one or more autonomous vehicles and one or more autonomous vehicle service platforms. For example, message routers 854 may be configured to encrypt and decrypt messages to provide for secured interactions between, for example, a teleoperator process 803 and an autonomous vehicle operation system 840.

Figure 9:
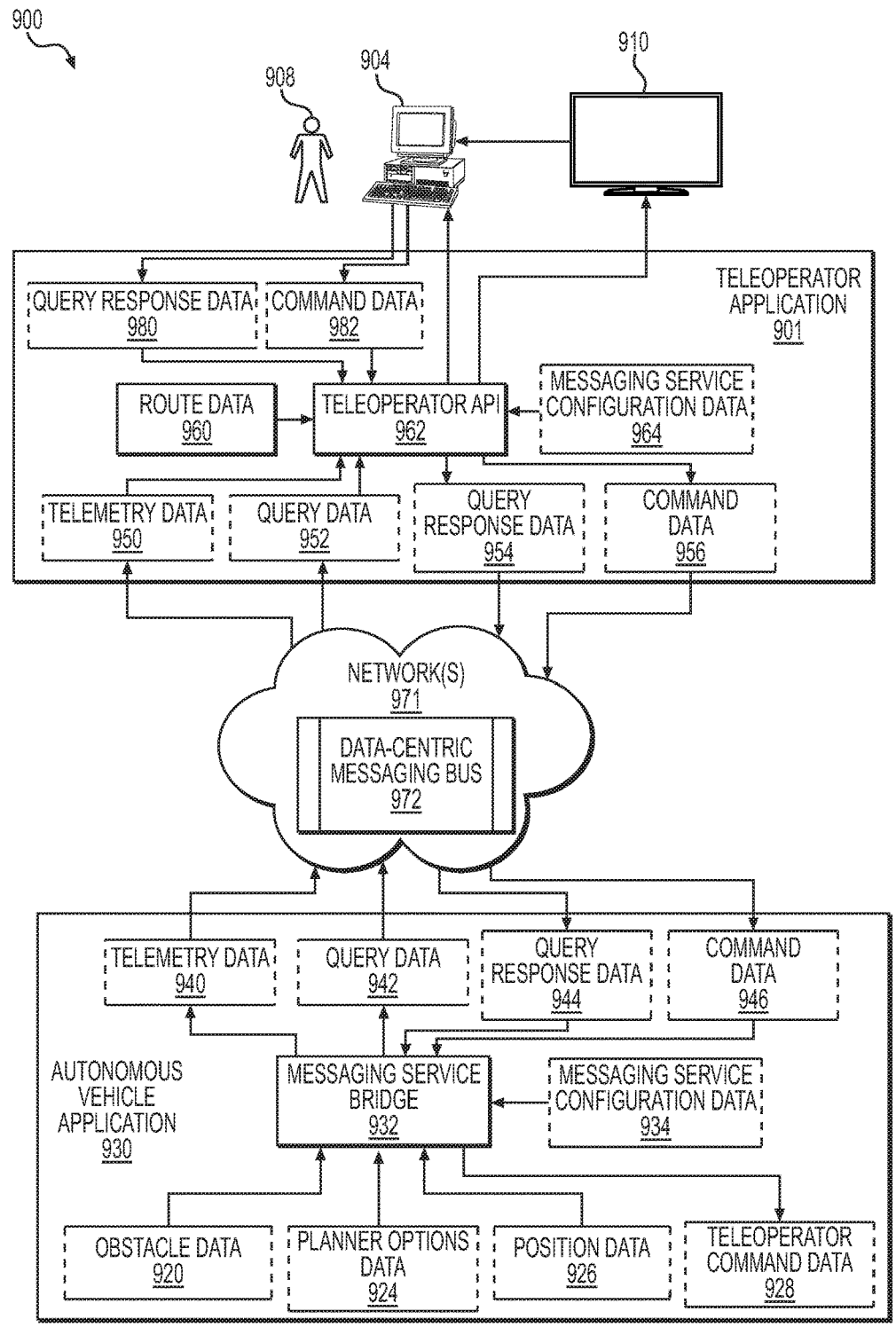
FIG. 9 is a diagram depicting types of data for facilitating teleoperations using a communications protocol described in FIG. 8, according to some examples.

FIG. 9 is a diagram depicting types of data for facilitating teleoperations using a communications protocol described in FIG. 8, according to some examples. Diagram 900 depicts a teleoperator 908 interfacing with a teleoperator computing device 904 coupled to a teleoperator application 901, which is configured to exchange data via a data-centric messaging bus 972 implemented in one or more networks 971. Data-centric messaging bus 972 provides a communication link between teleoperator application 901 and autonomous vehicle application 930. Teleoperator API 962 of teleoperator application 901 is configured to receive message service configuration data 964 and route data 960, such as road network data (e.g., RNDF-like data), mission data (e.g., MDF-data), and the like. Similarly, a messaging service bridge 932 is also configured to receive messaging service configuration data 934. Messaging service configuration data 934 and 964 provide configuration data to configure the messaging service between teleoperator application 901 and autonomous vehicle application 930. An example of messaging service configuration data 934 and 964 includes quality of service ("QoS") configuration data implemented to configure a Data Distribution Service™ application.

An example of a data exchange for facilitating teleoperations via the communications protocol is described as follows. Consider that obstacle data 920 is generated by a perception system of an autonomous vehicle controller. Further, planner options data 924 is generated by a planner to notify a teleoperator of a subset of candidate trajectories, and position data 926 is generated by the localizer. Obstacle data 920, planner options data 924, and position data 926 are transmitted to a messaging service bridge 932, which, in accordance with message service configuration data 934, generates telemetry data 940 and query data 942, both of which are transmitted via data-centric messaging bus 972 into teleoperator application 901 as telemetry data 950 and query data 952. Teleoperator API 962 receives telemetry data 950 and inquiry data 952, which, in turn are processed in view of Route data 960 and message service configuration data 964. The resultant data is subsequently presented to a teleoperator 908 via teleoperator computing device 904 and/or a collaborative display (e.g., a dashboard display visible to a group of collaborating teleoperators 908). Teleoperator 908 reviews the candidate trajectory options that are presented on the display of teleoperator computing device 904, and selects a guided trajectory, which generates command data 982 and query response data 980, both of which are passed through teleoperator API 962 as query response data 954 and command data 956. In turn, query response data 954 and command data 956 are transmitted via data-centric messaging bus 972 into autonomous vehicle application 930 as query response data 944 and command data 946. Messaging service bridge 932 receives query response data 944 and command data 946 and generates teleoperator command data 928, which is configured to generate a teleoperator-selected trajectory for implementation by a planner. Note that the above-described messaging processes are not intended to be limiting, and other messaging protocols may be implemented as well.

Figure 10:
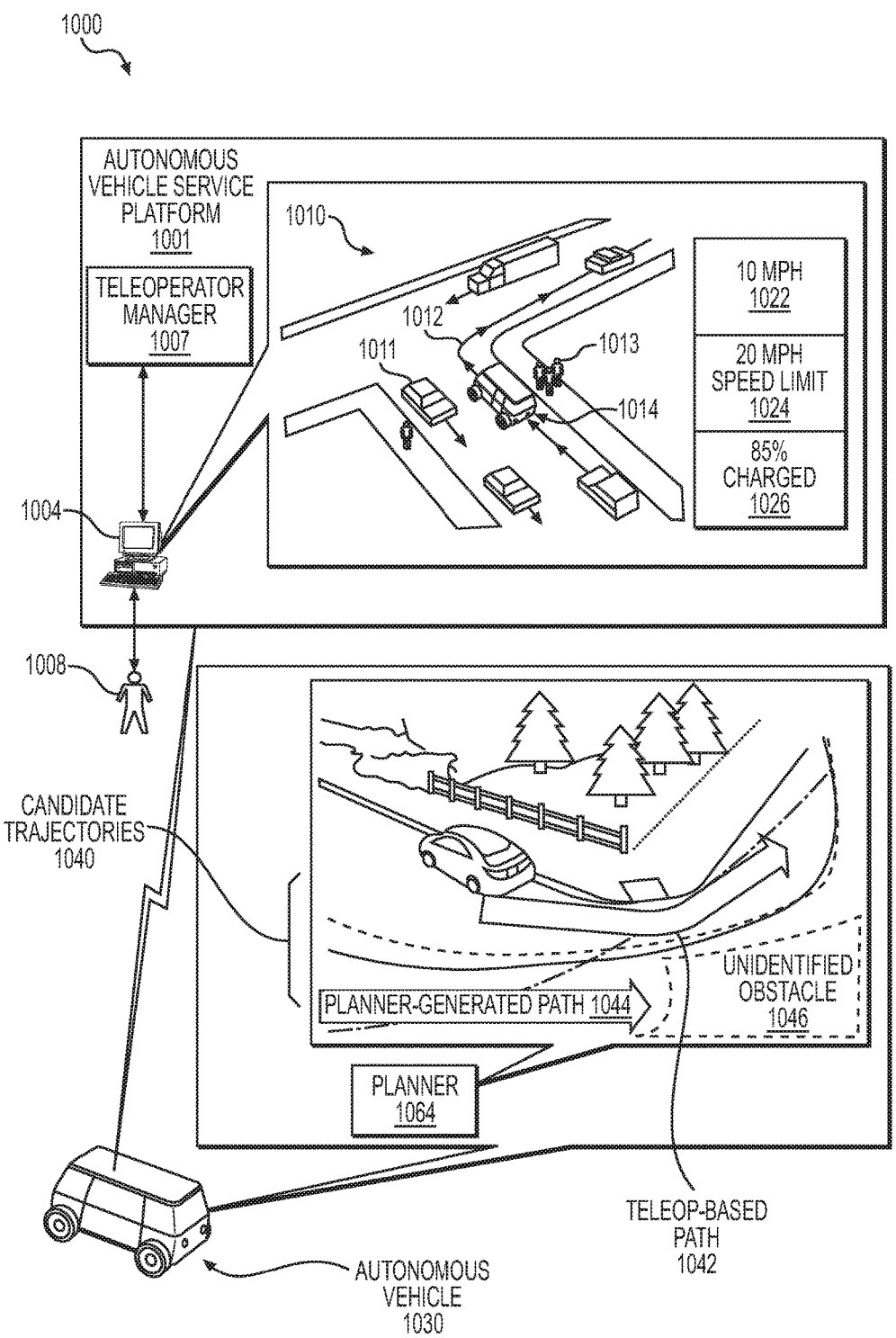
FIG. 10 is a diagram illustrating an example of a teleoperator interface with which a teleoperator may influence path planning, according to some embodiments.

FIG. 10 is a diagram illustrating an example of a teleoperator interface with which a teleoperator may influence path planning, according to some embodiments. Diagram 1000 depicts examples of an autonomous vehicle 1030 in communication with an autonomous vehicle service platform 1001, which includes a teleoperator manager 1007 configured to facilitate teleoperations. In a first example, teleoperator manager 1007 receives data that requires teleoperator 1008 to preemptively view a path of an autonomous vehicle approaching a potential obstacle or an area of low planner confidence levels so that teleoperator 1008 may be able to address an issue in advance. To illustrate, consider that an intersection that an autonomous vehicle is approaching may be tagged as being problematic. As such, user interface 1010 displays a representation 1014 of a corresponding autonomous vehicle 1030 transiting along a path 1012, which has been predicted by a number of trajectories generated by a planner. Also displayed are other vehicles 1011 and dynamic objects 1013, such as pedestrians, that may cause sufficient confusion at the planner, thereby requiring teleoperation support. User interface 1010 also presents to teleoperator 1008 a current velocity 1022, a speed limit 1024, and an amount of charge 1026 presently in the batteries. According to some examples, user interface 1010 may display other data, such as sensor data as acquired from autonomous vehicle 1030. In a second example, consider that planner 1064 has generated a number of trajectories that are coextensive with a planner-generated path 1044 regardless of a detected unidentified object 1046. Planner 1064 may also generate a subset of candidate trajectories 1040, but in this example, the planner is unable to proceed given present confidence levels. If planner 1064 fails to determine an alternative path, a teleoperation request may be transmitted. In this case, a teleoperator may select one of candidate trajectories 1040 to facilitate travel by autonomous vehicle 1030 that is consistent with teleoperator-based path 1042.

Figure 11:
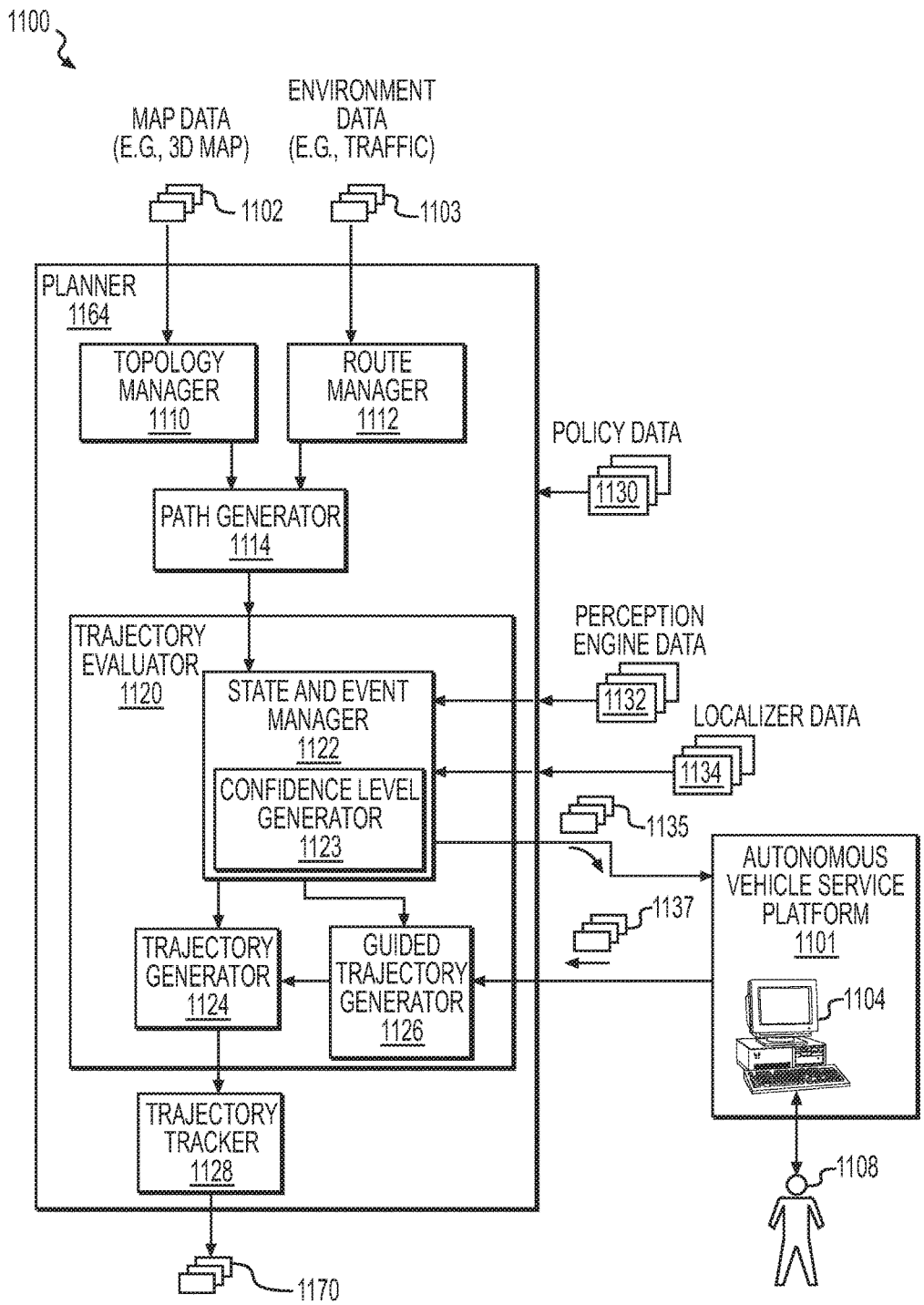
FIG. 11 is a diagram depicting an example of a planner configured to invoke teleoperations, according to some examples.

FIG. 11 is a diagram depicting an example of a planner configured to invoke teleoperations, according to some examples. Diagram 1100 depicts a planner 1164 including a topography manager 1110, a route manager 1112, a path generator 1114, a trajectory evaluator 1120, and a trajectory tracker 1128. Topography manager 1110 is configured to receive map data, such as 3D map data or other like map data that specifies topographic features. Topography manager 1110 is further configured to identify candidate paths based on topographic-related features on a path to a destination. According to various examples, topography manager 1110 receives 3D maps generated by sensors associated with one or more autonomous vehicles in the fleet. Route manager 1112 is configured to receive environmental data 1103, which may include traffic-related information associated with one or more routes that may be selected as a path to the destination. Path generator 1114 receives data from topography manager 1110 and route manager 1112, and generates one or more paths or path segments suitable to direct autonomous vehicle toward a destination. Data representing one or more paths or path segments is transmitted into trajectory evaluator 1120.

Trajectory evaluator 1120 includes a state and event manager 1122, which, in turn, may include a confidence level generator 1123. Trajectory evaluator 1120 further includes a guided trajectory generator 1126 and a trajectory generator 1124. Further, planner 1164 is configured to receive policy data 1130, perception engine data 1132, and localizer data 1134.

Policy data 1130 may include criteria with which planner 1164 uses to determine a path that has a sufficient confidence level with which to generate trajectories, according to some examples. Examples of policy data 1130 include policies that specify that trajectory generation is bounded by stand-off distances to external objects (e.g., maintaining a safety buffer of 3 feet from a cyclist, as possible), or policies that require that trajectories must not cross a center double yellow line, or policies that require trajectories to be limited to a single lane in a 4-lane roadway (e.g., based on past events, such as typically congregating at a lane closest to a bus stop), and any other similar criteria specified by policies. Perception engine data 1132 includes maps of locations of static objects and dynamic objects of interest, and localizer data 1134 includes at least a local pose or position.

State and event manager 1122 may be configured to probabilistically determine a state of operation for an autonomous vehicle. For example, a first state of operation (i.e., "normative operation") may describe a situation in which trajectories are collision-free, whereas a second state of operation (i.e., "non-normative operation") may describe another situation in which the confidence level associated with possible trajectories are insufficient to guarantee collision-free travel. According to some examples, state and event manager 1122 is configured to use perception data 1132 to determine a state of autonomous vehicle that is either normative or non-normative. Confidence level generator 1123 may be configured to analyze perception data 1132 to determine a state for the autonomous vehicle. For example, confidence level generator 1123 may use semantic information associated with static and dynamic objects, as well as associated probabilistic estimations, to enhance a degree of certainty that planner 1164 is determining safe course of action. For example, planner 1164 may use perception engine data 1132 that specifies a probability that an object is either a person or not a person to determine whether planner 1164 is operating safely (e.g., planner 1164 may receive a degree of certainty that an object has a 98% probability of being a person, and a probability of 2% that the object is not a person).

Upon determining a confidence level (e.g., based on statistics and probabilistic determinations) is below a threshold required for predicted safe operation, a relatively low confidence level (e.g., single probability score) may trigger planner 1164 to transmit a request 1135 for teleoperation support to autonomous vehicle service platform 1101. In some cases, telemetry data and a set of candidate trajectories may accompany the request. Examples of telemetry data include sensor data, localization data, perception data, and the like. A teleoperator 1108 may transmit via teleoperator computing device 1104 a selected trajectory 1137 to guided trajectory generator 1126. As such, selected trajectory 1137 is a trajectory formed with guidance from a teleoperator. Upon confirming there is no change in the state (e.g., a non-normative state is pending), guided trajectory generator 1126 passes data to trajectory generator 1124, which, in turn, causes trajectory tracker 1128, as a trajectory tracking controller, to use the teleop-specified trajectory for generating control signals 1170 (e.g., steering angles, velocity, etc.). Note that planner 1164 may trigger transmission of a request 1135 for teleoperation support prior to a state transitioning to a non-normative state. In particular, an autonomous vehicle controller and/or its components can predict that a distant obstacle may be problematic and preemptively cause planner 1164 to invoke teleoperations prior to the autonomous vehicle reaching the obstacle. Otherwise, the autonomous vehicle may cause a delay by transitioning to a safe state upon encountering the obstacle or scenario (e.g., pulling over and off the roadway). In another example, teleoperations may be automatically invoked prior to an autonomous vehicle approaching a particular location that is known to be difficult to navigate. This determination may optionally take into consideration other factors, including the time of day, the position of the sun, if such situation is likely to cause a disturbance to the reliability of sensor readings, and traffic or accident data derived from a variety of sources.

Figure 12:
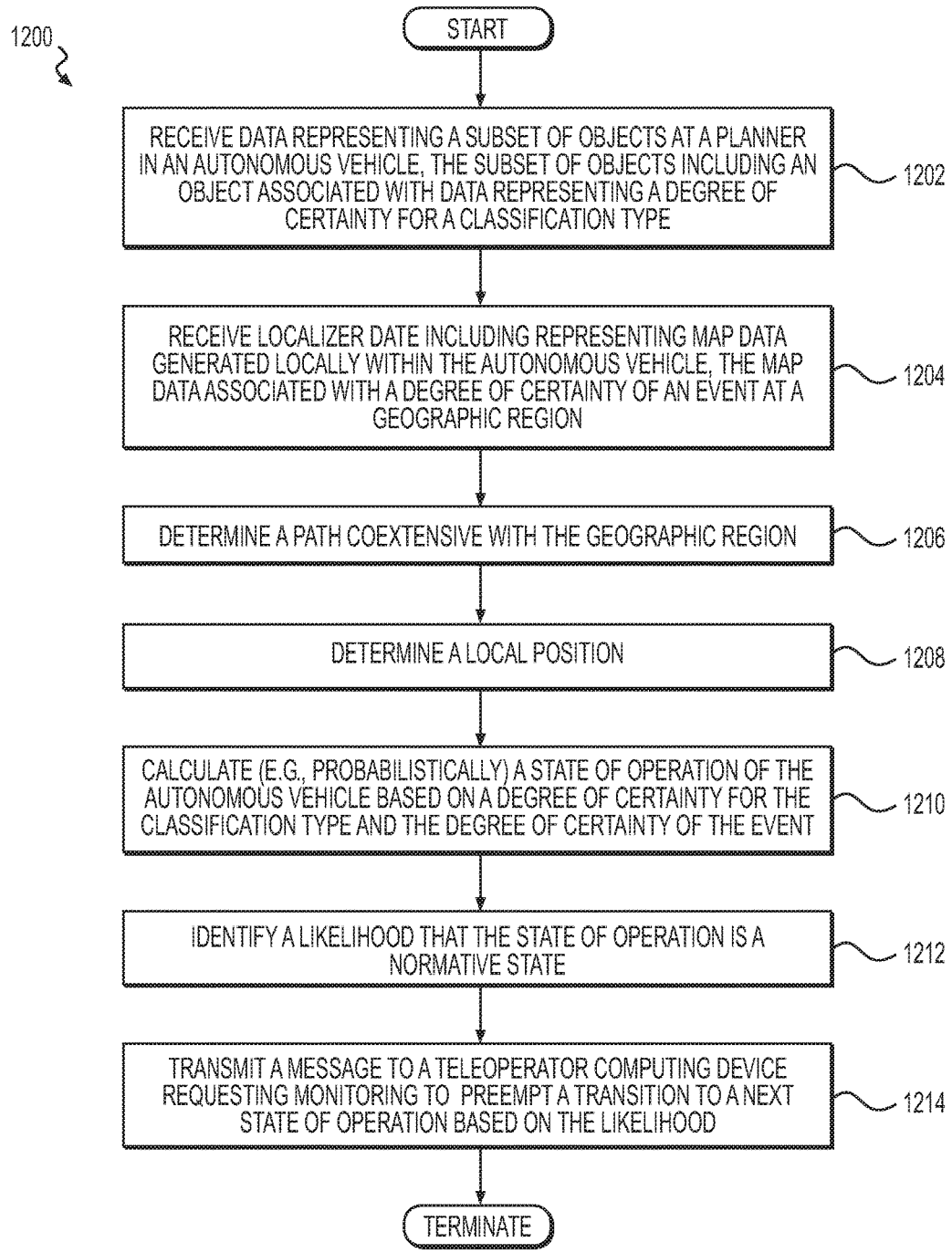
FIG. 12 is an example of a flow diagram configured to control an autonomous vehicle, according to some embodiments.

FIG. 12 is an example of a flow diagram configured to control an autonomous vehicle, according to some embodiments. At 1202, flow 1200 begins. Data representing a subset of objects that are received at a planner in an autonomous vehicle, the subset of objects including at least one object associated with data representing a degree of certainty for a classification type. For example, perception engine data may include metadata associated with objects, whereby the metadata specifies a degree of certainty associated with a specific classification type. For instance, a dynamic object may be classified as a "young pedestrian" with an 85% confidence level of being correct. At 1204, localizer data may be received (e.g., at a planner). The localizer data may include map data that is generated locally within the autonomous vehicle. The local map data may specify a degree of certainty (including a degree of uncertainty) that an event at a geographic region may occur. An event may be a condition or situation affecting operation, or potentially affecting operation, of an autonomous vehicle. The events may be internal (e.g., failed or impaired sensor) to an autonomous vehicle, or external (e.g., roadway obstruction). Examples of events are described herein, such as in FIG. 2 as well as in other figures and passages. A path coextensive with the geographic region of interest may be determined at 1206. For example, consider that the event is the positioning of the sun in the sky at a time of day in which the intensity of sunlight impairs the vision of drivers during rush hour traffic. As such, it is expected or predicted that traffic may slow down responsive to the bright sunlight. Accordingly, a planner may preemptively invoke teleoperations if an alternate path to avoid the event is less likely. At 1208, a local position is determined at a planner based on local pose data. At 1210, a state of operation of an autonomous vehicle may be determined (e.g., probabilistically), for example, based on a degree of certainty for a classification type and a degree of certainty of the event, which is may be based on any number of factors, such as speed, position, and other state information. To illustrate, consider an example in which a young pedestrian is detected by the autonomous vehicle during the event in which other drivers' vision likely will be impaired by the sun, thereby causing an unsafe situation for the young pedestrian. Therefore, a relatively unsafe situation can be detected as a probabilistic event that may be likely to occur (i.e., an unsafe situation for which teleoperations may be invoked). At 1212, a likelihood that the state of operation is in a normative state is determined, and based on the determination, a message is transmitted to a teleoperator computing device requesting teleoperations to preempt a transition to a next state of operation (e.g., preempt transition from a normative to non-normative state of operation).

Figure 13:
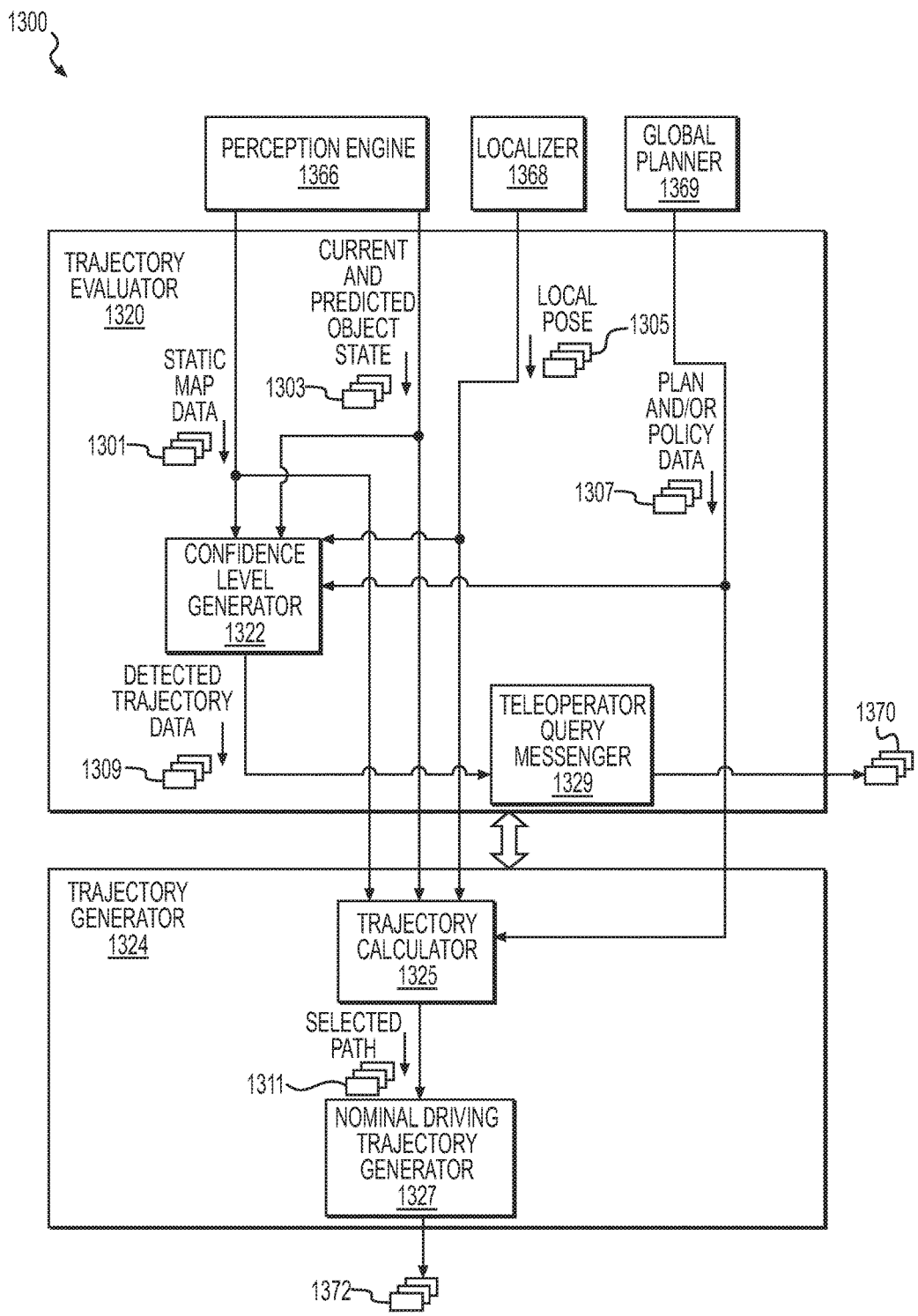
FIG. 13 depicts an example in which a planner may generate a trajectory, according to some examples.

FIG. 13 depicts an example in which a planner may generate a trajectory, according to some examples. Diagram 1300 includes a trajectory evaluator 1320 and a trajectory generator 1324. Trajectory evaluator 1320 includes a confidence level generator 1322 and a teleoperator query messenger 1329. As shown, trajectory evaluator 1320 is coupled to a perception engine 1366 to receive static map data 1301, and current and predicted object state data 1303. Trajectory evaluator 1320 also receives local pose data 1305 from localizer 1368 and plan data 1307 from a global planner 1369. In one state of operation (e.g., non-normative), confidence level generator 1322 receives static map data 1301 and current and predicted object state data 1303. Based on this data, confidence level generator 1322 may determine that detected trajectories are associated with unacceptable confidence level values. As such, confidence level generator 1322 transmits detected trajectory data 1309 (e.g., data including candidate trajectories) to notify a teleoperator via teleoperator query messenger 1329, which, in turn, transmits a request 1370 for teleoperator assistance.

In another state of operation (e.g., a normative state), static map data 1301, current and predicted object state data 1303, local pose data 1305, and plan data 1307 (e.g., global plan data) are received into trajectory calculator 1325, which is configured to calculate (e.g., iteratively) trajectories to determine an optimal one or more paths. Next, at least one path is selected and is transmitted as selected path data 1311. According to some embodiments, trajectory calculator 1325 is configured to implement re-planning of trajectories as an example. Nominal driving trajectory generator 1327 is configured to generate trajectories in a refined approach, such as by generating trajectories based on receding horizon control techniques. Nominal driving trajectory generator 1327 subsequently may transmit nominal driving trajectory path data 1372 to, for example, a trajectory tracker or a vehicle controller to implement physical changes in steering, acceleration, and other components.

Figure 14:
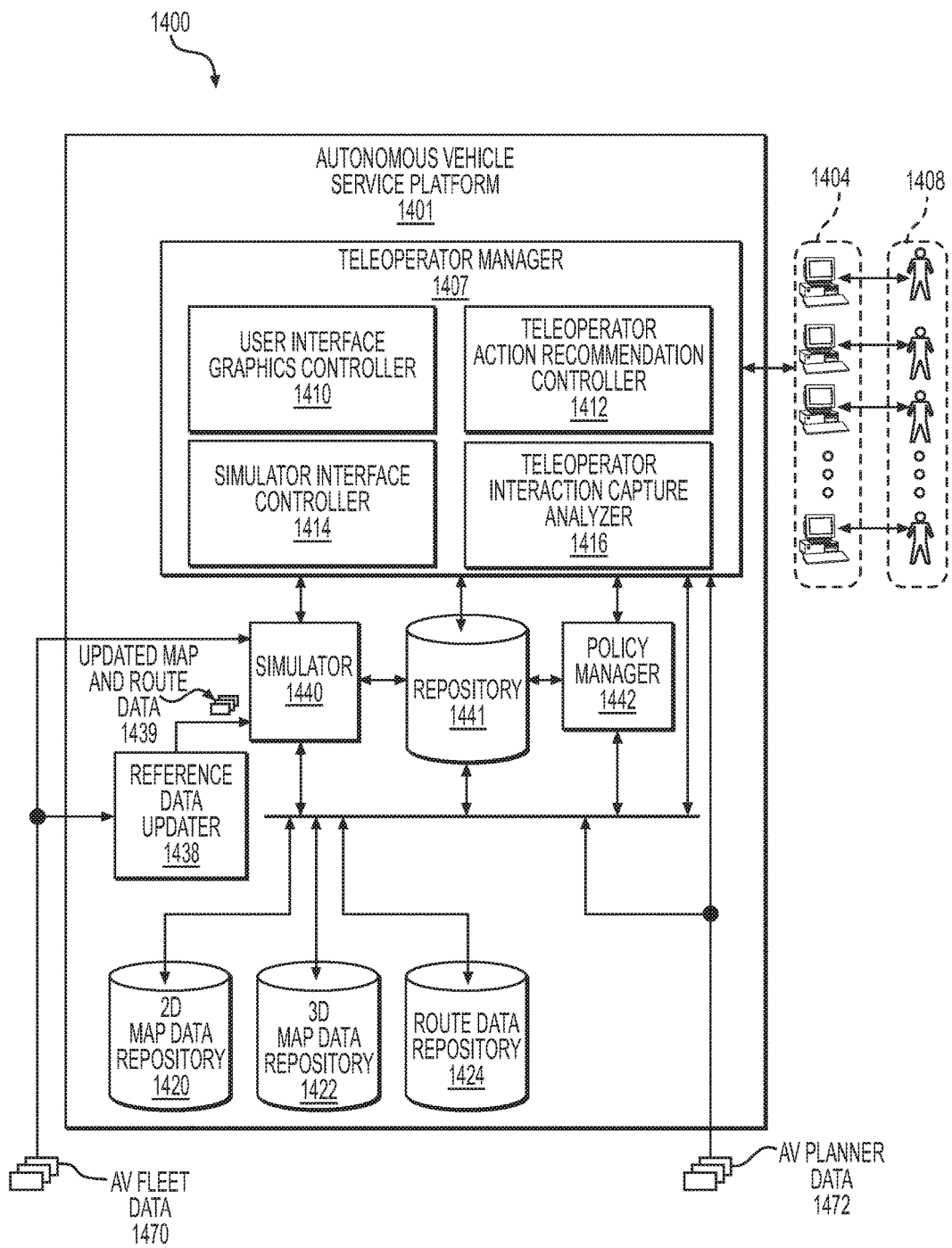
FIG. 14 is a diagram depicting another example of an autonomous vehicle service platform, according to some embodiments.

FIG. 14 is a diagram depicting another example of an autonomous vehicle service platform, according to some embodiments. Diagram 1400 depicts an autonomous vehicle service platform 1401 including a teleoperator manager 1407 that is configured to manage interactions and/or communications among teleoperators 1408, teleoperator computing devices 1404, and other components of autonomous vehicle service platform 1401. Further to diagram 1400, autonomous vehicle service platform 1401 includes a simulator 1440, a repository 1441, a policy manager 1442, a reference data updater 1438, a 2D map data repository 1420, a 3D map data repository 1422, and a route data repository 1424. Other map data, such as 4D map data (e.g., using epoch determination), may be implemented and stored in a repository (not shown).

Teleoperator action recommendation controller 1412 includes logic configured to receive and/or control a teleoperation service request via autonomous vehicle ("AV") planner data 1472, which can include requests for teleoperator assistance as well as telemetry data and other data. As such, planner data 1472 may include recommended candidate trajectories or paths from which a teleoperator 1408 via teleoperator computing device 1404 may select. According to some examples, teleoperator action recommendation controller 1412 may be configured to access other sources of recommended candidate trajectories from which to select an optimum trajectory. For example, candidate trajectories contained in autonomous vehicle planner data 1472 may, in parallel, be introduced into simulator 1440, which is configured to simulate an event or condition being experienced by an autonomous vehicle requesting teleoperator assistance. Simulator 1440 can access map data and other data necessary for performing a simulation on the set of candidate trajectories, whereby simulator 1440 need not exhaustively reiterate simulations to confirm sufficiency. Rather, simulator 1440 may provide either confirm the appropriateness of the candidate trajectories, or may otherwise alert a teleoperator to be cautious in their selection.

Teleoperator interaction capture analyzer 1416 may be configured to capture numerous amounts of teleoperator transactions or interactions for storage in repository 1441, which, for example, may accumulate data relating to a number of teleoperator transactions for analysis and generation of policies, at least in some cases. According to some embodiments, repository 1441 may also be configured to store policy data for access by policy manager 1442. Further, teleoperator interaction capture analyzer 1416 may apply machine learning techniques to empirically determine how best to respond to events or conditions causing requests for teleoperation assistance. In some cases, policy manager 1442 may be configured to update a particular policy or generate a new policy responsive to analyzing the large set of teleoperator interactions (e.g., subsequent to applying machine learning techniques). Policy manager 1442 manages policies that may be viewed as rules or guidelines with which an autonomous vehicle controller and its components operate under to comply with autonomous operations of a vehicle. In some cases, a modified or updated policy may be applied to simulator 1440 to confirm the efficacy of permanently releasing or implementing such policy changes.

Simulator interface controller 1414 is configured to provide an interface between simulator 1440 and teleoperator computing devices 1404. For example, consider that sensor data from a fleet of autonomous vehicles is applied to reference data updater 1438 via autonomous ("AV") fleet data 1470, whereby reference data updater 1438 is configured to generate updated map and route data 1439. In some implementations, updated map and route data 1439 may be preliminarily released as an update to data in map data repositories 1420 and 1422, or as an update to data in route data repository 1424. In this case, such data may be tagged as being a "beta version" in which a lower threshold for requesting teleoperator service may be implemented when, for example, a map tile including preliminarily updated information is used by an autonomous vehicle. Further, updated map and route data 1439 may be introduced to simulator 1440 for validating the updated map data. Upon full release (e.g., at the close of beta testing), the previously lowered threshold for requesting a teleoperator service related to map tiles is canceled. User interface graphics controller 1410 provides rich graphics to teleoperators 1408, whereby a fleet of autonomous vehicles may be simulated within simulator 1440 and may be accessed via teleoperator computing device 1404 as if the simulated fleet of autonomous vehicles were real.

Figure 15:
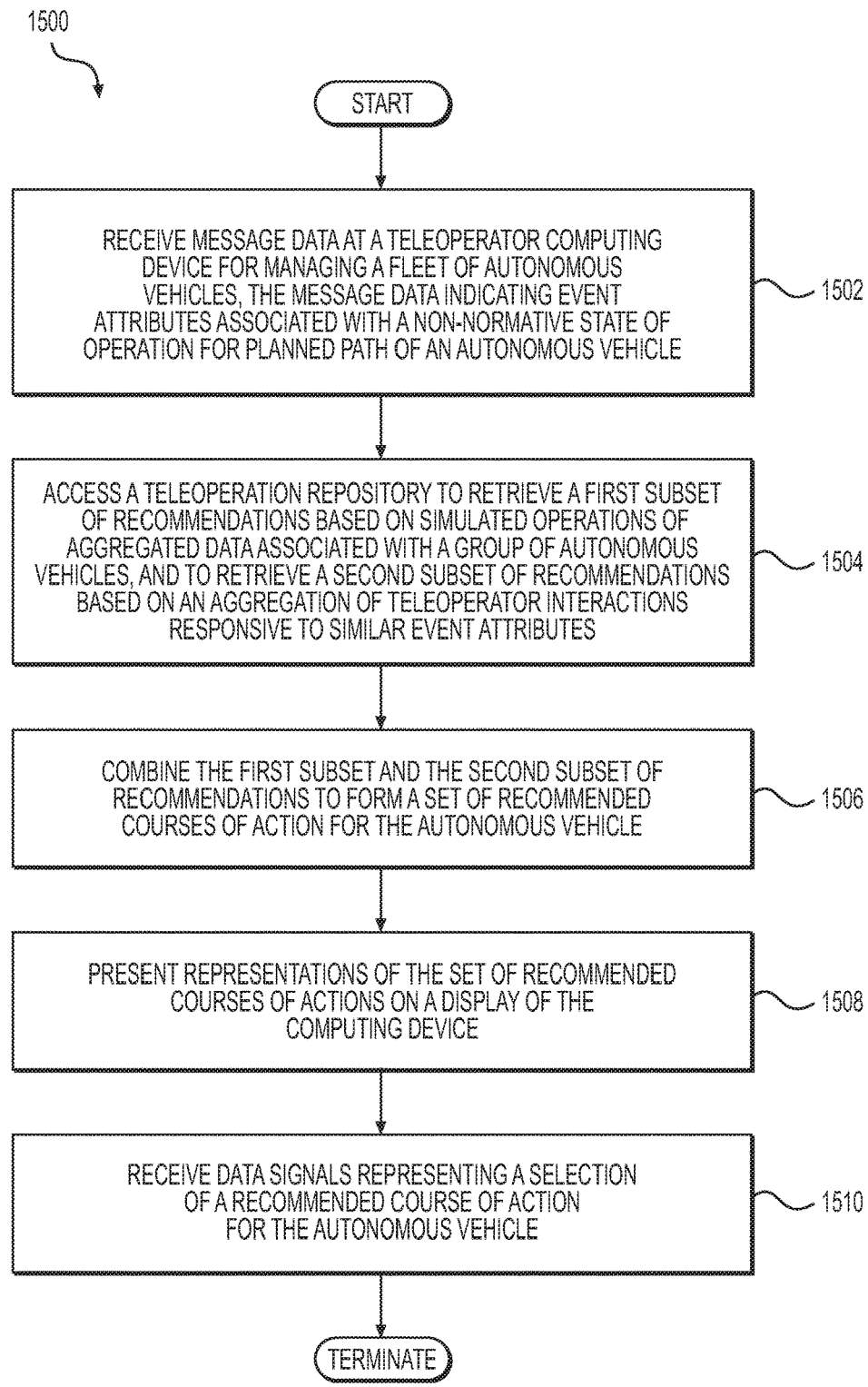
FIG. 15 is an example of a flow diagram to control an autonomous vehicle, according to some embodiments.

FIG. 15 is an example of a flow diagram to control an autonomous vehicle, according to some embodiments. At 1502, flow 1500 begins. Message data may be received at a teleoperator computing device for managing a fleet of autonomous vehicles. The message data may indicate event attributes associated with a non-normative state of operation in the context of a planned path for an autonomous vehicle. For example, an event may be characterized as a particular intersection that becomes problematic due to, for example, a large number of pedestrians, hurriedly crossing the street against a traffic light. The event attributes describe the characteristics of the event, such as, for example, the number of people crossing the street, the traffic delays resulting from an increased number of pedestrians, etc. At 1504, a teleoperation repository may be accessed to retrieve a first subset of recommendations based on simulated operations of aggregated data associated with a group of autonomous vehicles. In this case, a simulator may be a source of recommendations with which a teleoperator may implement. Further, the teleoperation repository may also be accessed to retrieve a second subset of recommendations based on an aggregation of teleoperator interactions responsive to similar event attributes. In particular, a teleoperator interaction capture analyzer may apply machine learning techniques to empirically determine how best to respond to events having similar attributes based on previous requests for teleoperation assistance. At 1506, the first subset and the second subset of recommendations are combined to form a set of recommended courses of action for the autonomous vehicle. At 1508, representations of the set of recommended courses of actions may be presented visually on a display of a teleoperator computing device. At 1510, data signals representing a selection (e.g., by teleoperator) of a recommended course of action may be detected.

Figure 16:
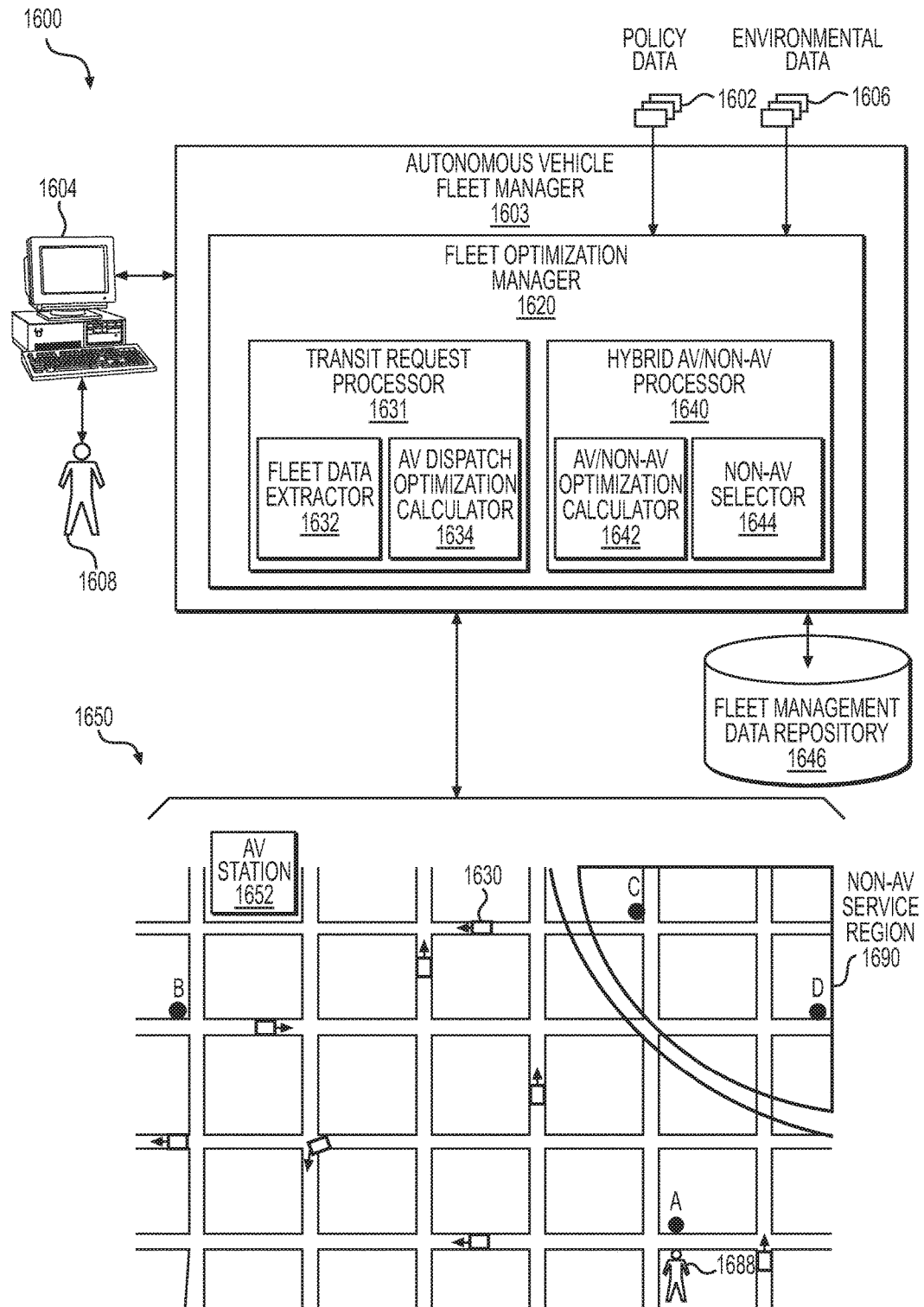
FIG. 16 is a diagram of an example of an autonomous vehicle fleet manager implementing a fleet optimization manager, according to some examples.

FIG. 16 is a diagram of an example of an autonomous vehicle fleet manager implementing a fleet optimization manager, according to some examples. Diagram 1600 depicts an autonomous vehicle fleet manager that is configured to manage a fleet of autonomous vehicles 1630 transiting within a road network 1650. Autonomous vehicle fleet manager 1603 is coupled to a teleoperator 1608 via a teleoperator computing device 1604, and is also coupled to a fleet management data repository 1646. Autonomous vehicle fleet manager 1603 is configured to receive policy data 1602 and environmental data 1606, as well as other data. Further to diagram 1600, fleet optimization manager 1620 is shown to include a transit request processor 1631, which, in turn, includes a fleet data extractor 1632 and an autonomous vehicle dispatch optimization calculator 1634. Transit request processor 1631 is configured to process transit requests, such as from a user 1688 who is requesting autonomous vehicle service. Fleet data extractor 1632 is configured to extract data relating to autonomous vehicles in the fleet. Data associated with each autonomous vehicle is stored in repository 1646. For example, data for each vehicle may describe maintenance issues, scheduled service calls, daily usage, battery charge and discharge rates, and any other data, which may be updated in real-time, may be used for purposes of optimizing a fleet of autonomous vehicles to minimize downtime. Autonomous vehicle dispatch optimization calculator 1634 is configured to analyze the extracted data and calculate optimized usage of the fleet so as to ensure that the next vehicle dispatched, such as from station 1652, provides for the least travel times and/or costs—in the aggregate—for the autonomous vehicle service.

Fleet optimization manager 1620 is shown to include a hybrid autonomous vehicle/non-autonomous vehicle processor 1640, which, in turn, includes an AV/non-AV optimization calculator 1642 and a non-AV selector 1644. According to some examples, hybrid autonomous vehicle/non-autonomous vehicle processor 1640 is configured to manage a hybrid fleet of autonomous vehicles and human-driven vehicles (e.g., as independent contractors). As such, autonomous vehicle service may employ non-autonomous vehicles to meet excess demand, or in areas, such as non-AV service region 1690, that may be beyond a geo-fence or in areas of poor communication coverage. AV/non-AV optimization calculator 1642 is configured to optimize usage of the fleet of autonomous and to invite non-AV drivers into the transportation service (e.g., with minimal or no detriment to the autonomous vehicle service). Non-AV selector 1644 includes logic for selecting a number of non-AV drivers to assist based on calculations derived by AV/non-AV optimization calculator 1642.

Figure 17:
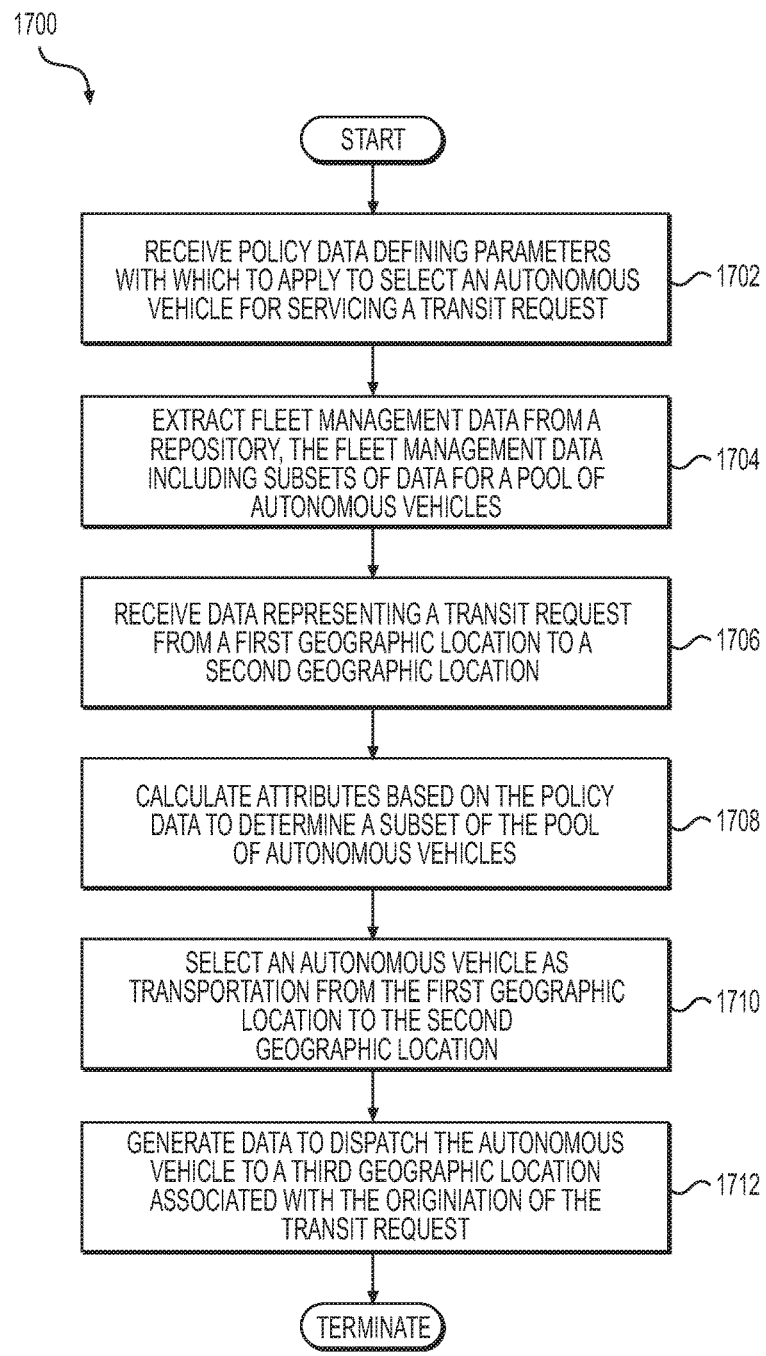
FIG. 17 is an example of a flow diagram for managing a fleet of autonomous vehicles, according to some embodiments.

FIG. 17 is an example of a flow diagram to manage a fleet of autonomous vehicles, according to some embodiments. At 1702, flow 1700 begins. At 1702, policy data is received. The policy data may include parameters that define how best apply to select an autonomous vehicle for servicing a transit request. At 1704, fleet management data from a repository may be extracted. The fleet management data includes subsets of data for a pool of autonomous vehicles (e.g., the data describes the readiness of vehicles to service a transportation request). At 1706, data representing a transit request is received. For exemplary purposes, the transit request could be for transportation from a first geographic location to a second geographic location. At 1708, attributes based on the policy data are calculated to determine a subset of autonomous vehicles that are available to service the request. For example, attributes may include a battery charge level and time until next scheduled maintenance. At 1710, an autonomous vehicle is selected as transportation from the first geographic location to the second geographic location, and data is generated to dispatch the autonomous vehicle to a third geographic location associated with the origination of the transit request.

Figure 18:
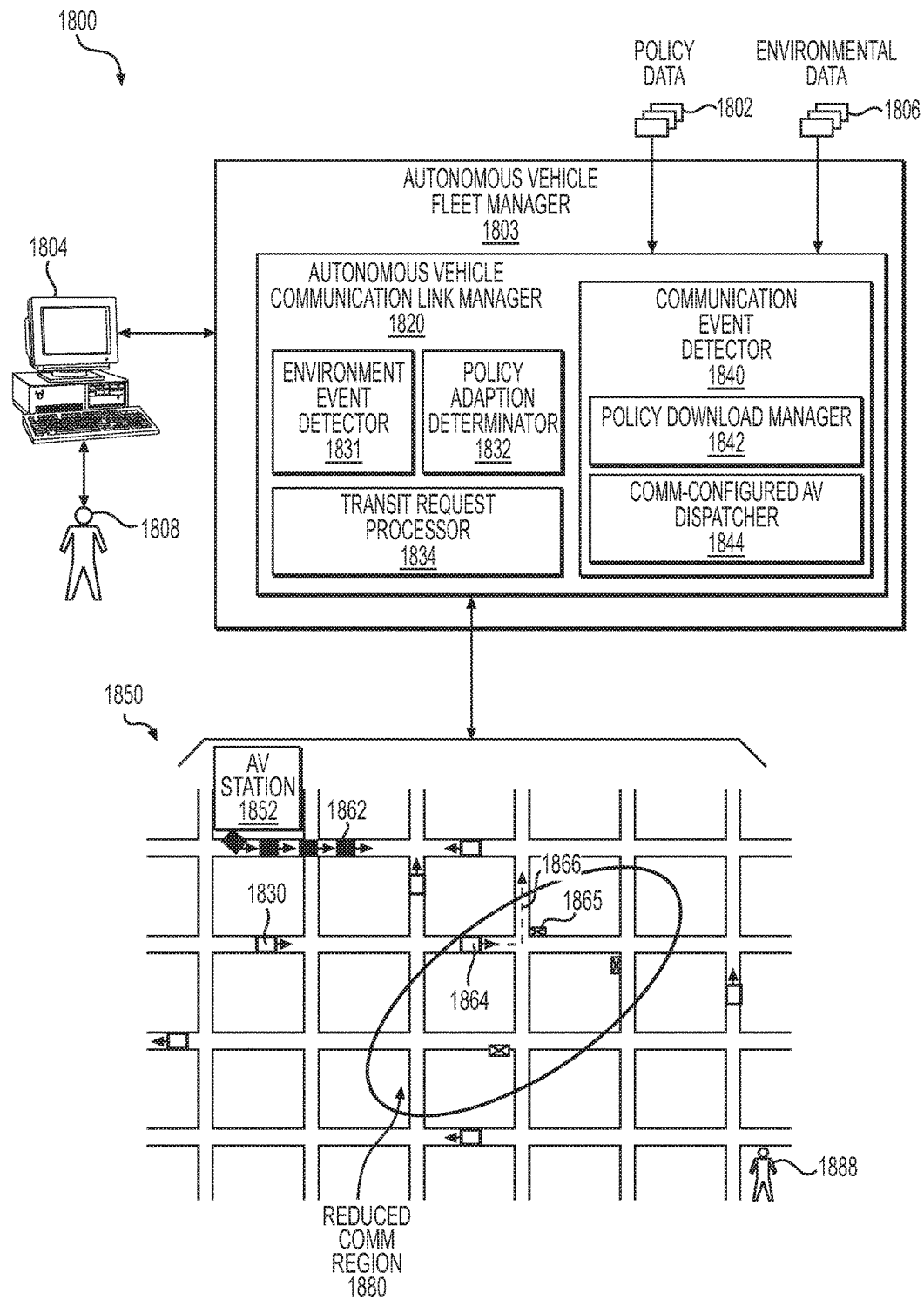
FIG. 18 is a diagram illustrating an autonomous vehicle fleet manager implementing an autonomous vehicle communications link manager, according to some embodiments.

FIG. 18 is a diagram illustrating an autonomous vehicle fleet manager implementing an autonomous vehicle communications link manager, according to some embodiments. Diagram 1800 depicts an autonomous vehicle fleet manager that is configured to manage a fleet of autonomous vehicles 1830 transiting within a road network 1850 that coincides with a communication outage at an area identified as "reduced communication region" 1880. Autonomous vehicle fleet manager 1803 is coupled to a teleoperator 1808 via a teleoperator computing device 1804. Autonomous vehicle fleet manager 1803 is configured to receive policy data 1802 and environmental data 1806, as well as other data. Further to diagram 1800, an autonomous vehicle communications link manager 1820 is shown to include an environment event detector 1831, a policy adaption determinator 1832, and a transit request processor 1834. Environment event detector 1831 is configured to receive environmental data 1806 specifying a change within the environment in which autonomous vehicle service is implemented. For example, environmental data 1806 may specify that region 1880 has degraded communication services, which may affect the autonomous vehicle service. Policy adaption determinator 1832 may specify parameters with which to apply when receiving transit requests during such an event (e.g., during a loss of communications). Transit request processor 1834 is configured to process transit requests in view of the degraded communications. In this example, a user 1888 is requesting autonomous vehicle service. Further, transit request processor 1834 includes logic to apply an adapted policy for modifying the way autonomous vehicles are dispatched so to avoid complications due to poor communications.

Communication event detector 1840 includes a policy download manager 1842 and communications-configured ("COMM-configured") AV dispatcher 1844. Policy download manager 1842 is configured to provide autonomous vehicles 1830 an updated policy in view of reduced communications region 1880, whereby the updated policy may specify routes to quickly exit region 1880 if an autonomous vehicle enters that region. For example, autonomous vehicle 1864 may receive an updated policy moments before driving into region 1880. Upon loss of communications, autonomous vehicle 1864 implements the updated policy and selects route 1866 to drive out of region 1880 quickly. COMM-configured AV dispatcher 1844 may be configured to identify points 1865 at which to park autonomous vehicles that are configured as relays to establishing a peer-to-peer network over region 1880. As such, COMM-configured AV dispatcher 1844 is configured to dispatch autonomous vehicles 1862 (without passengers) to park at locations 1865 for the purposes of operating as communication towers in a peer-to-peer ad hoc network.

Figure 19:
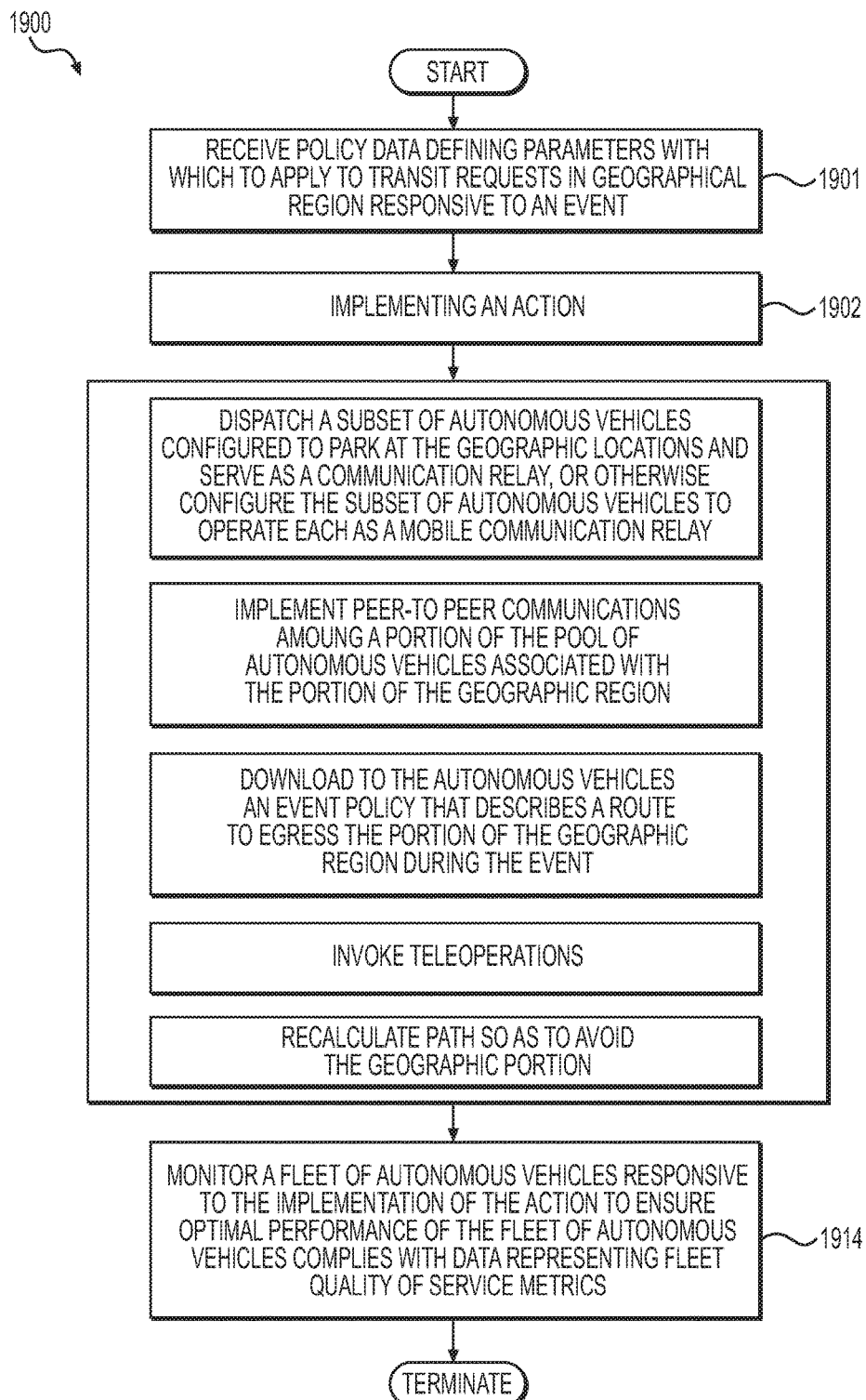
FIG. 19 is an example of a flow diagram to determine actions for autonomous vehicles during an event, according to some embodiments.

FIG. 19 is an example of a flow diagram to determine actions for autonomous vehicles during an event, such as degraded or lost communications, according to some embodiments. At 1901, flow 1900 begins. Policy data is received, whereby the policy data defines parameters with which to apply to transit requests in a geographical region during an event. At 1902, one or more of the following actions may be implemented: (1) dispatch a subset of autonomous vehicles to geographic locations in the portion of the geographic location, the subset of autonomous vehicles being configured to either park at specific geographic locations and each serve as a static communication relay, or transit in a geographic region to each serve as a mobile communication relay, (2) implement peer-to-peer communications among a portion of the pool of autonomous vehicles associated with the portion of the geographic region, (3) provide to the autonomous vehicles an event policy that describes a route to egress the portion of the geographic region during an event, (4) invoke teleoperations, and (5) recalculate paths so as to avoid the geographic portion. Subsequent to implementing the action, the fleet of autonomous vehicles is monitored at 1914.

Figure 20:
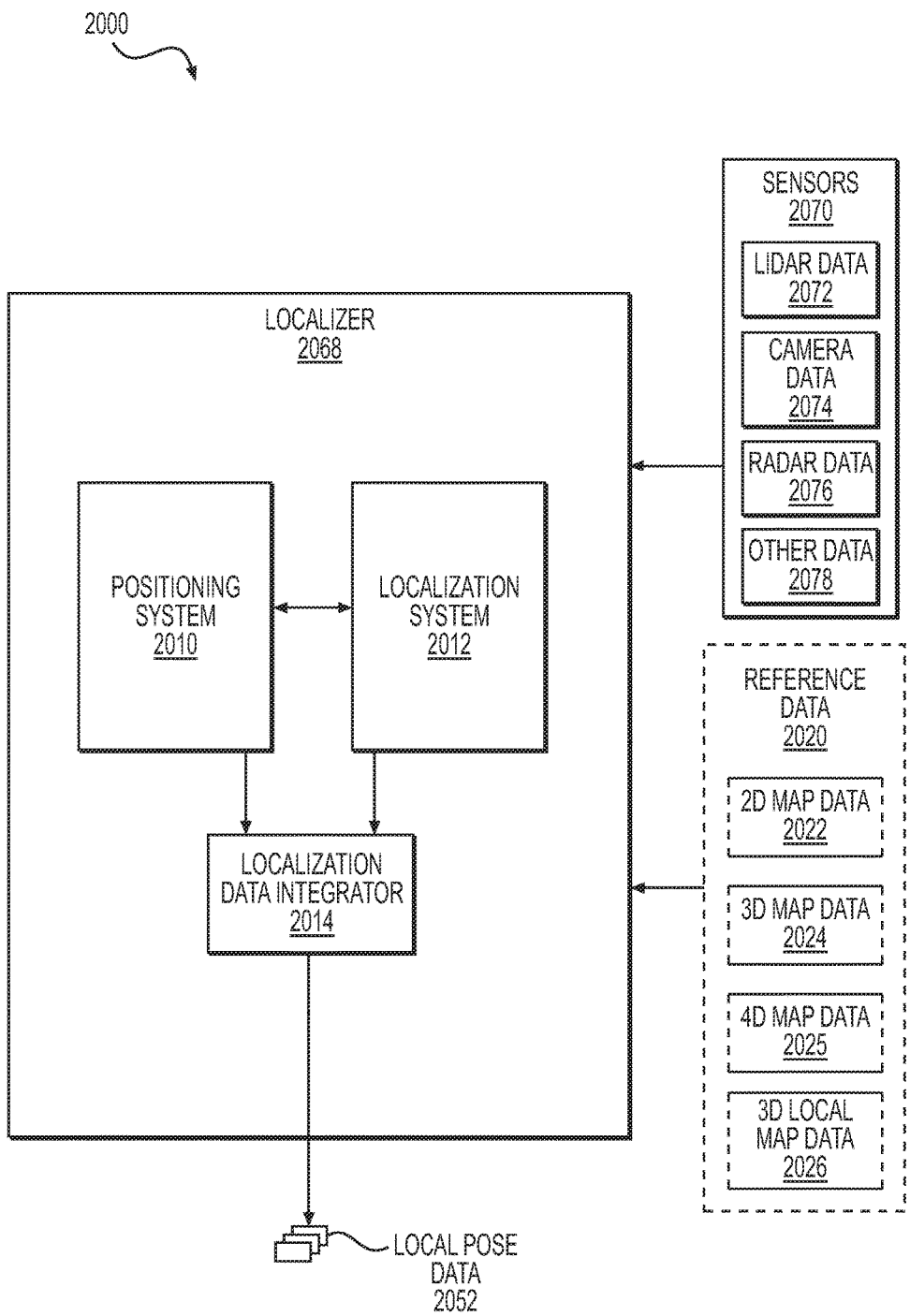
FIG. 20 is a diagram depicting an example of a localizer, according to some embodiments.

FIG. 20 is a diagram depicting an example of a localizer, according to some embodiments. Diagram 2000 includes a localizer 2068 configured to receive sensor data from sensors 2070, such as Lidar data 2072, camera data 2074, radar data 2076, and other data 2078. Further, localizer 2068 is configured to receive reference data 2020, such as 2D map data 2022, 3D map data 2024, and 3D local map data. According to some examples, other map data, such as 4D map data 2025 and semantic map data (not shown), including corresponding data structures and repositories, may also be implemented. Further to diagram 2000, localizer 2068 includes a positioning system 2010 and a localization system 2012, both of which are configured to receive sensor data from sensors 2070 as well as reference data 2020. Localization data integrator 2014 is configured to receive data from positioning system 2010 and data from localization system 2012, whereby localization data integrator 2014 is configured to integrate or fuse sensor data from multiple sensors to form local pose data 2052.

Figure 21:
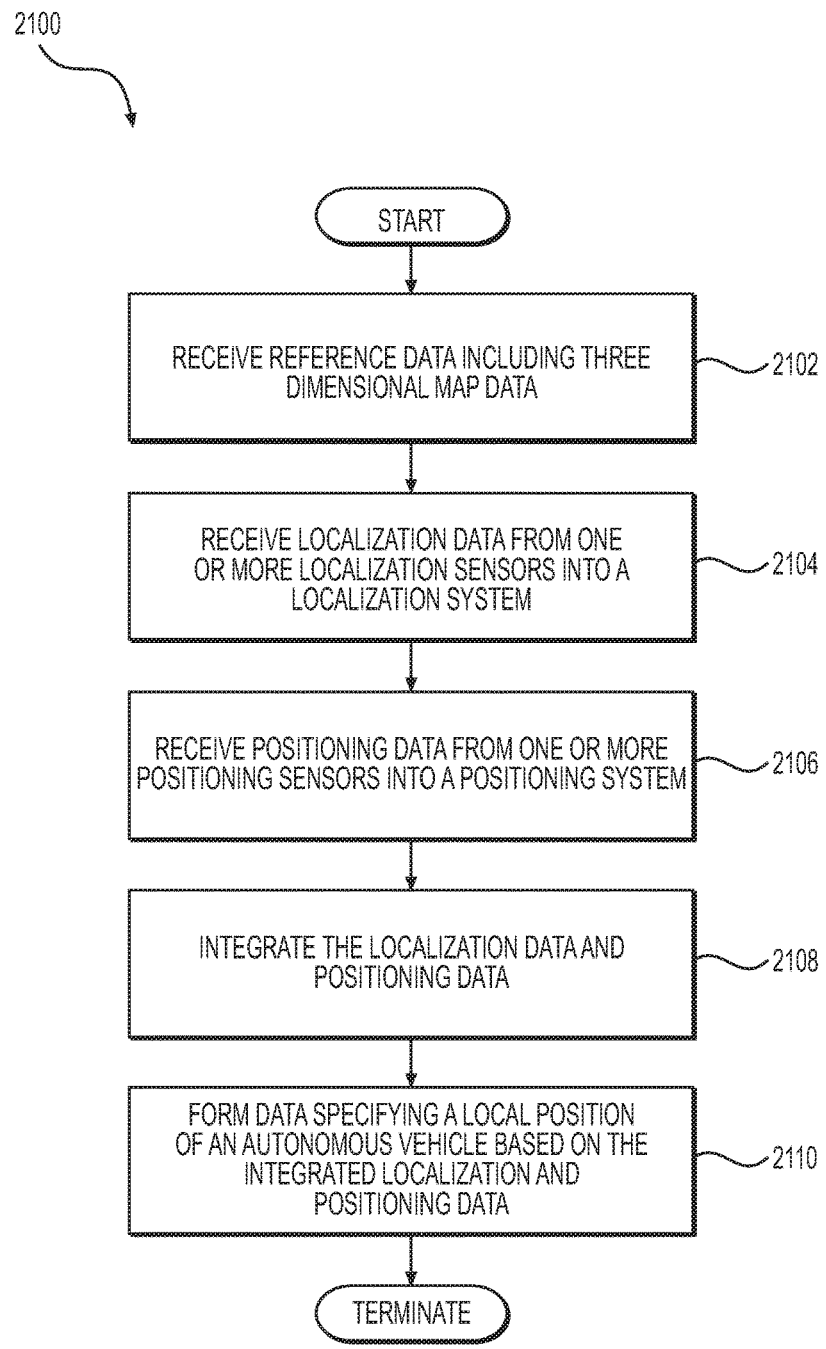
FIG. 21 is an example of a flow diagram to generate local pose data based on integrated sensor data, according to some embodiments.

FIG. 21 is an example of a flow diagram to generate local pose data based on integrated sensor data, according to some embodiments. At 2101, flow 2100 begins. At 2102, reference data is received, the reference data including three dimensional map data. In some examples, reference data, such as 3-D or 4-D map data, may be received via one or more networks. At 2104, localization data from one or more localization sensors is received and placed into a localization system. At 2106, positioning data from one or more positioning sensors is received into a positioning system. At 2108, the localization and positioning data are integrated. At 2110, the localization data and positioning data are integrated to form local position data specifying a geographic position of an autonomous vehicle.

Figure 22:
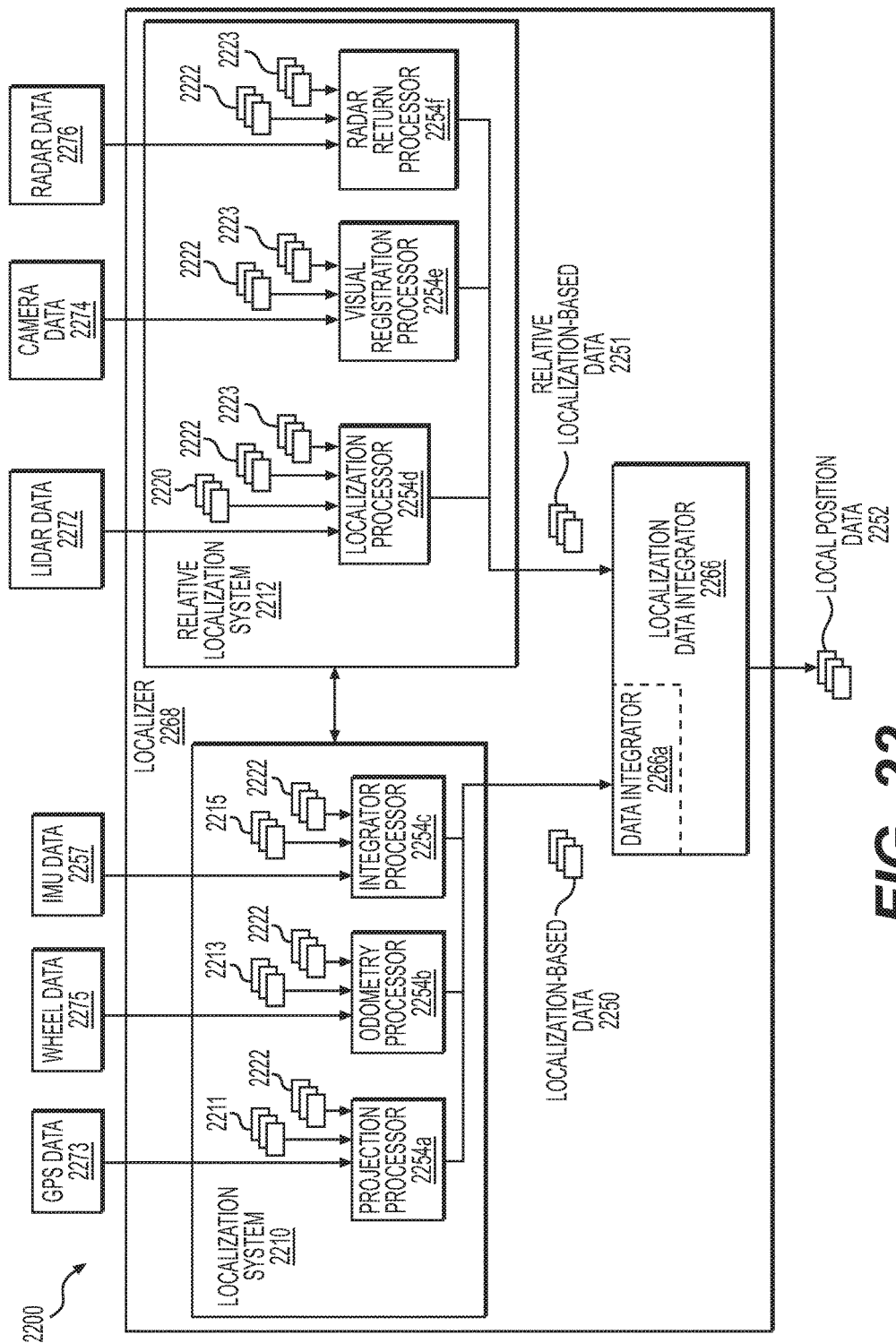
FIG. 22 is a diagram depicting another example of a localizer, according to some embodiments.

FIG. 22 is a diagram depicting another example of a localizer, according to some embodiments. Diagram 2200 includes a localizer 2268, which, in turn, includes a localization system 2210 and a relative localization system 2212 to generate positioning-based data 2250 and local location-based data 2251, respectively. Localization system 2210 includes a projection processor 2254a for processing GPS data 2273, a GPS datum 2211, and 3D Map data 2222, among other optional data (e.g., 4D map data). Localization system 2210 also includes an odometry processor 2254b to process wheel data 2275 (e.g., wheel speed), vehicle model data 2213 and 3D map data 2222, among other optional data. Further yet, localization system 2210 includes an integrator processor 2254c to process IMU data 2257, vehicle model data 2215, and 3D map data 2222, among other optional data. Similarly, relative localization system 2212 includes a Lidar localization processor 2254d for processing Lidar data 2272, 2D tile map data 2220, 3D map data 2222, and 3D local map data 2223, among other optional data. Relative localization system 2212 also includes a visual registration processor 2254e to process camera data 2274, 3D map data 2222, and 3D local map data 2223, among other optional data. Further yet, relative localization system 2212 includes a radar return processor 2254f to process radar data 2276, 3D map data 2222, and 3D local map data 2223, among other optional data. Note that in various examples, other types of sensor data and sensors or processors may be implemented, such as sonar data and the like.

Further to diagram 2200, localization-based data 2250 and relative localization-based data 2251 may be fed into data integrator 2266a and localization data integrator 2266, respectively. Data integrator 2266a and localization data integrator 2266 may be configured to fuse corresponding data, whereby localization-based data 2250 may be fused at data integrator 2266a prior to being fused with relative localization-based data 2251 at localization data integrator 2266. According to some embodiments, data integrator 2266a is formed as part of localization data integrator 2266, or is absent. Regardless, a localization-based data 2250 and relative localization-based data 2251 can be both fed into localization data integrator 2266 for purposes of fusing data to generate local position data 2252. Localization-based data 2250 may include unary-constrained data (and uncertainty values) from projection processor 2254a, as well as binary-constrained data (and uncertainty values) from odometry processor 2254b and integrator processor 2254c. Relative localization-based data 2251 may include unary-constrained data (and uncertainty values) from localization processor 2254d and visual registration processor 2254e, and optionally from radar return processor 2254f. According to some embodiments, localization data integrator 2266 may implement non-linear smoothing functionality, such as a Kalman filter (e.g., a gated Kalman filter), a relative bundle adjuster, pose-graph relaxation, particle filter, histogram filter, or the like.

Figure 23:
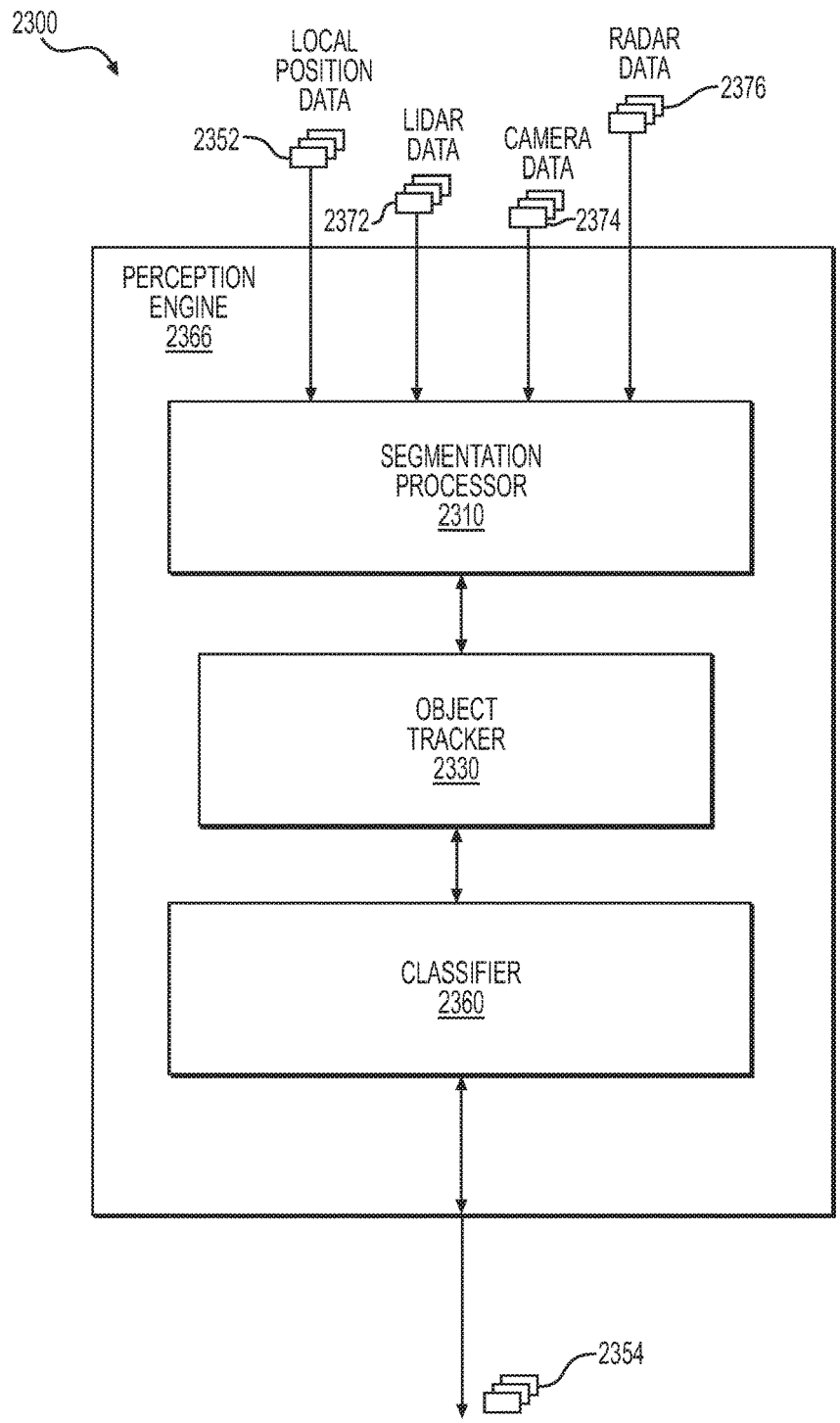
FIG. 23 is a diagram depicting an example of a perception engine, according to some embodiments.

FIG. 23 is a diagram depicting an example of a perception engine, according to some embodiments. Diagram 2300 includes a perception engine 2366, which, in turn, includes a segmentation processor 2310, an object tracker 2330, and a classifier 2360. Further, perception engine 2366 is configured to receive a local position data 2352, Lidar data 2372, camera data 2374, and radar data 2376, for example. Note that other sensor data, such as sonar data, may be accessed to provide functionalities of perception engine 2366. Segmentation processor 2310 is configured to extract ground plane data and/or to segment portions of an image to distinguish objects from each other and from static imagery (e.g., background). In some cases, 3D blobs may be segmented to distinguish each other. In some examples, a blob may refer to a set of features that identify an object in a spatially-reproduced environment and may be composed of elements (e.g., pixels of camera data, points of laser return data, etc.) having similar characteristics, such as intensity and color. In some examples, a blob may also refer to a point cloud (e.g., composed of colored laser return data) or other elements constituting an object. Object tracker 2330 is configured to perform frame-to-frame estimations of motion for blobs, or other segmented image portions. Further, data association is used to associate a blob at one location in a first frame at time, t1, to a blob in a different position in a second frame at time, t2. In some examples, object tracker 2330 is configured to perform real-time probabilistic tracking of 3-D objects, such as blobs. Classifier 2360 is configured to identify an object and to classify that object by classification type (e.g., as a pedestrian, cyclist, etc.) and by energy/activity (e.g. whether the object is dynamic or static), whereby data representing classification is described by a semantic label. According to some embodiments, probabilistic estimations of object categories may be performed, such as classifying an object as a vehicle, bicyclist, pedestrian, etc. with varying confidences per object class. Perception engine 2366 is configured to determine perception engine data 2354, which may include static object maps and/or dynamic object maps, as well as semantic information so that, for example, a planner may use this information to enhance path planning. According to various examples, one or more of segmentation processor 2310, object tracker 2330, and classifier 2360 may apply machine learning techniques to generate perception engine data 2354.

Figure 24:
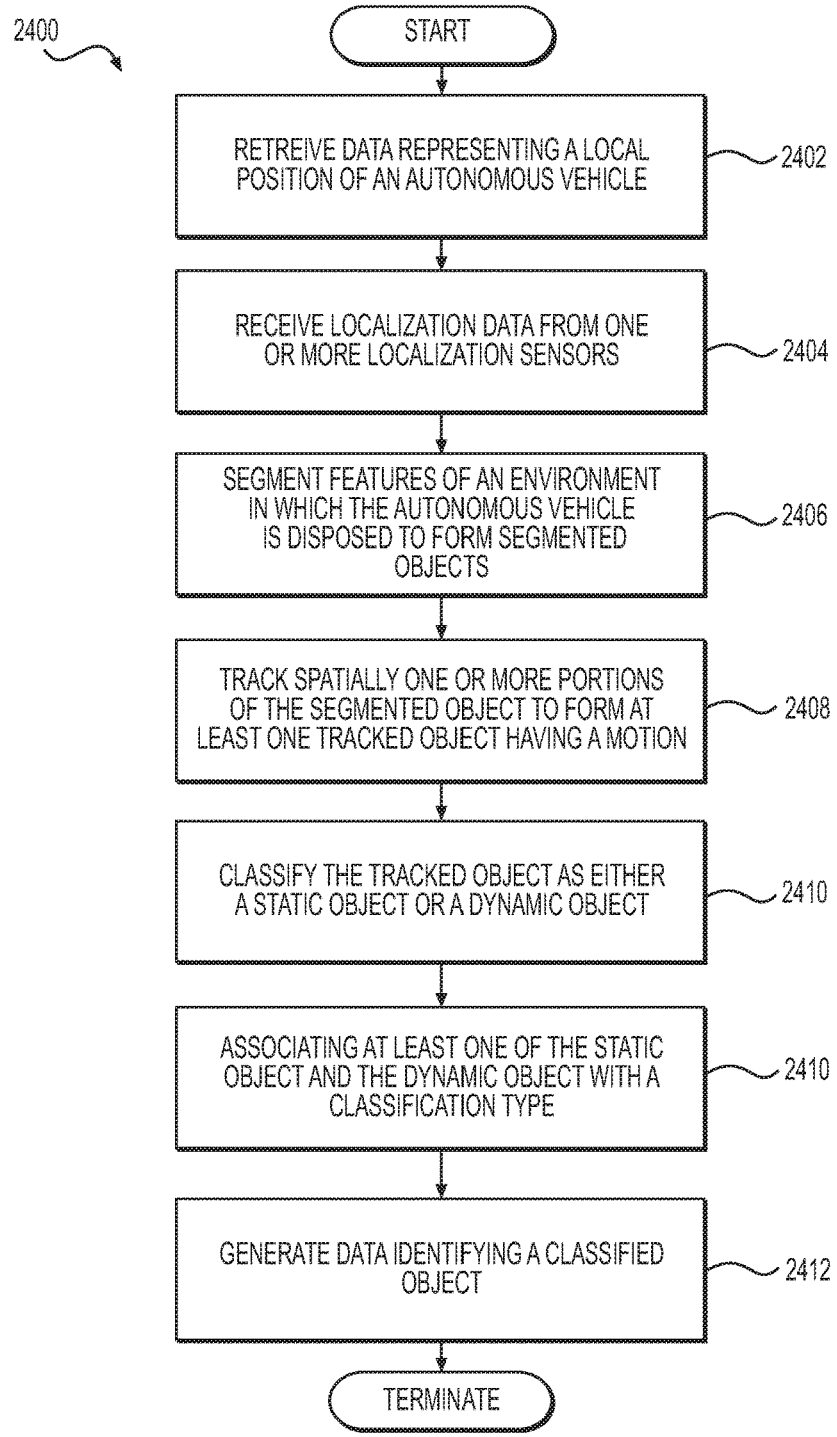
FIG. 24 is an example of a flow chart to generate perception engine data, according to some embodiments.

FIG. 24 is an example of a flow chart to generate perception engine data, according to some embodiments. Flow chart 2400 begins at 2402, at which data representing a local position of an autonomous vehicle is retrieved. At 2404, localization data from one or more localization sensors is received, and features of an environment in which the autonomous vehicle is disposed are segmented at 2406 to form segmented objects. One or more portions of the segmented object are tracked spatially at 2408 to form at least one tracked object having a motion (e.g., an estimated motion). At 2410, a tracked object is classified at least as either being a static object or a dynamic object. In some cases, a static object or a dynamic object may be associated with a classification type. At 2412, data identifying a classified object is generated. For example, the data identifying the classified object may include semantic information.

Figure 25:
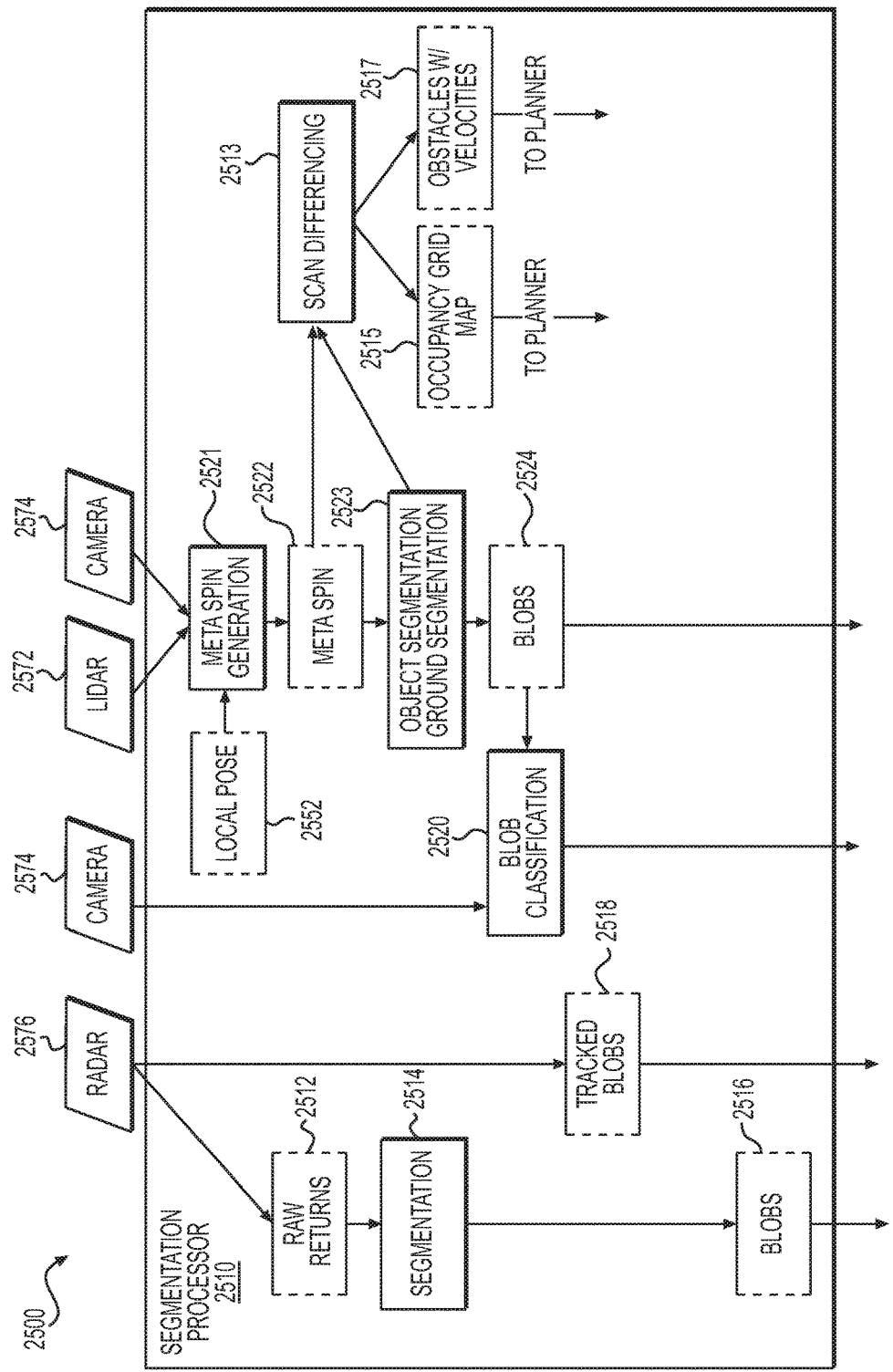
FIG. 25 is an example of a segmentation processor, according to some embodiments.

FIG. 25 is an example of a segmentation processor, according to some embodiments. Diagram 2500 depicts a segmentation processor 2510 receiving Lidar data from one or more Lidars 2572 and camera image data from one or more cameras 2574. Local pose data 2552, Lidar data, and camera image data are received into meta spin generator 2521. In some examples, meta spin generator is configured to partition an image based on various attributes (e.g., color, intensity, etc.) into distinguishable regions (e.g., clusters or groups of a point cloud), at least two or more of which may be updated at the same time or about the same time. Meta spin data 2522 is used to perform object segmentation and ground segmentation at segmentation processor 2523, whereby both meta spin data 2522 and segmentation-related data from segmentation processor 2523 are applied to a scanned differencing processor 2513. Scanned differencing processor 2513 is configured to predict motion and/or relative velocity of segmented image portions, which can be used to identify dynamic objects at 2517. Data indicating objects with detected velocity at 2517 are optionally transmitted to the planner to enhance path planning decisions.

Additionally, data from scanned differencing processor 2513 may be used to approximate locations of objects to form mapping of such objects (as well as optionally identifying a level of motion). In some examples, an occupancy grid map 2515 may be generated. Data representing an occupancy grid map 2515 may be transmitted to the planner to further enhance path planning decisions (e.g., by reducing uncertainties). Further to diagram 2500, image camera data from one or more cameras 2574 are used to classify blobs in blob classifier 2520, which also receives blob data 2524 from segmentation processor 2523. Segmentation processor 2510 also may receive raw radar returns data 2512 from one or more radars 2576 to perform segmentation at a radar segmentation processor 2514, which generates radar-related blob data 2516. Further to FIG. 25, segmentation processor 2510 may also receive and/or generate tracked blob data 2518 related to radar data. Blob data 2516, tracked blob data 2518, data from blob classifier 2520, and blob data 2524 may be used to track objects or portions thereof. According to some examples, one or more of the following may be optional: scanned differencing processor 2513, blob classification 2520, and data from radar 2576.

Figure 26A:
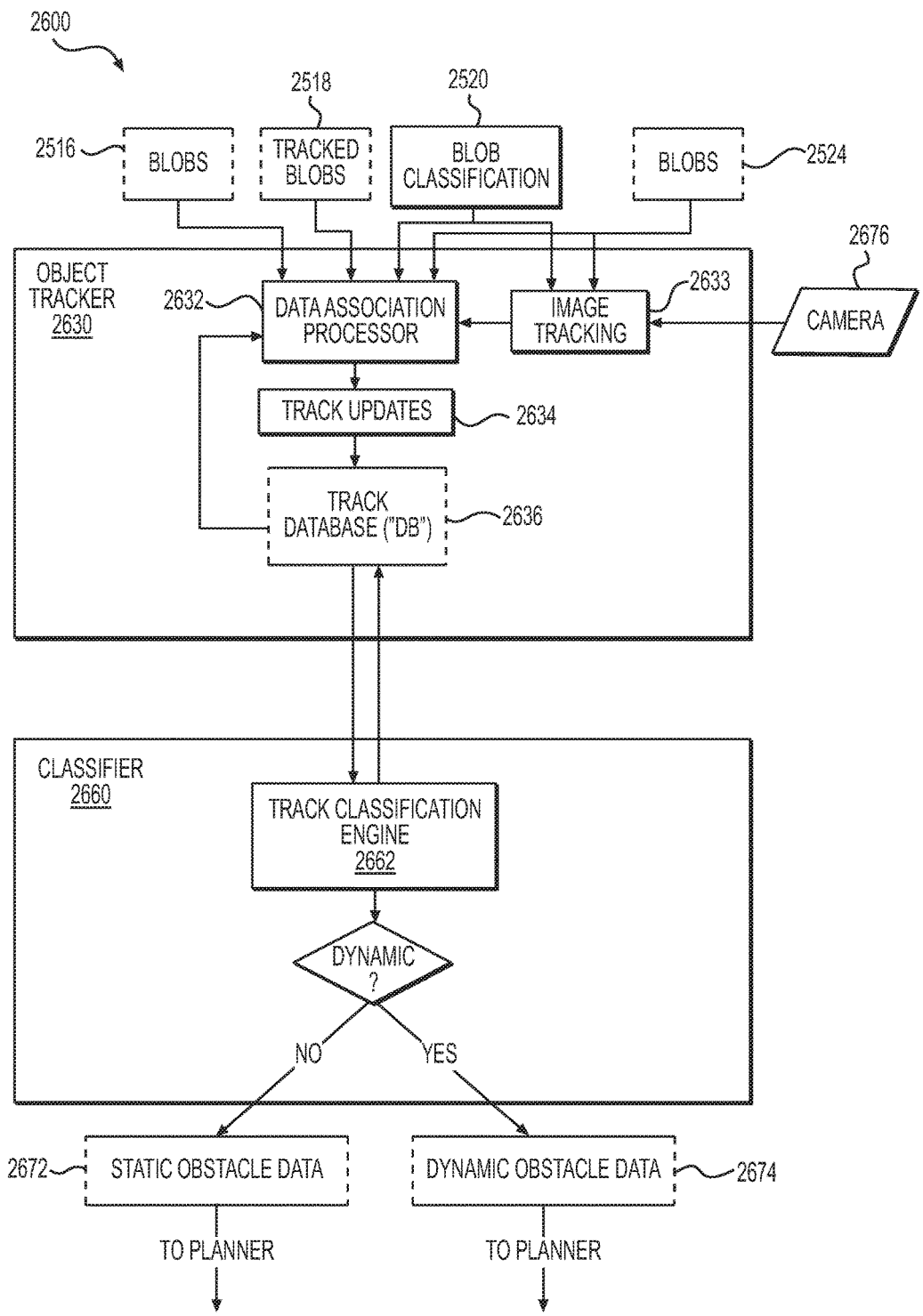
FIG. 26A is a diagram depicting examples of an object tracker and a classifier, according to various embodiments.

FIG. 26A is a diagram depicting examples of an object tracker and a classifier, according to various embodiments. Object tracker 2630 of diagram 2600 is configured to receive blob data 2516, tracked blob data 2518, data from blob classifier 2520, blob data 2524, and camera image data from one or more cameras 2676. Image tracker 2633 is configured to receive camera image data from one or more cameras 2676 to generate tracked image data, which, in turn, may be provided to data association processor 2632. As shown, data association processor 2632 is configured to receive blob data 2516, tracked blob data 2518, data from blob classifier 2520, blob data 2524, and track image data from image tracker 2633, and is further configured to identify one or more associations among the above-described types of data. Data association processor 2632 is configured to track, for example, various blob data from one frame to a next frame to, for example, estimate motion, among other things. Further, data generated by data association processor 2632 may be used by track updater 2634 to update one or more tracks, or tracked objects. In some examples, track updater 2634 may implement a Kalman Filter, or the like, to form updated data for tracked objects, which may be stored online in track database ("DB") 2636. Feedback data may be exchanged via path 2699 between data association processor 2632 and track database 2636. In some examples, image tracker 2633 may be optional and may be excluded. Object tracker 2630 may also use other sensor data, such as radar or sonar, as well as any other types of sensor data, for example.

Figure 26B:
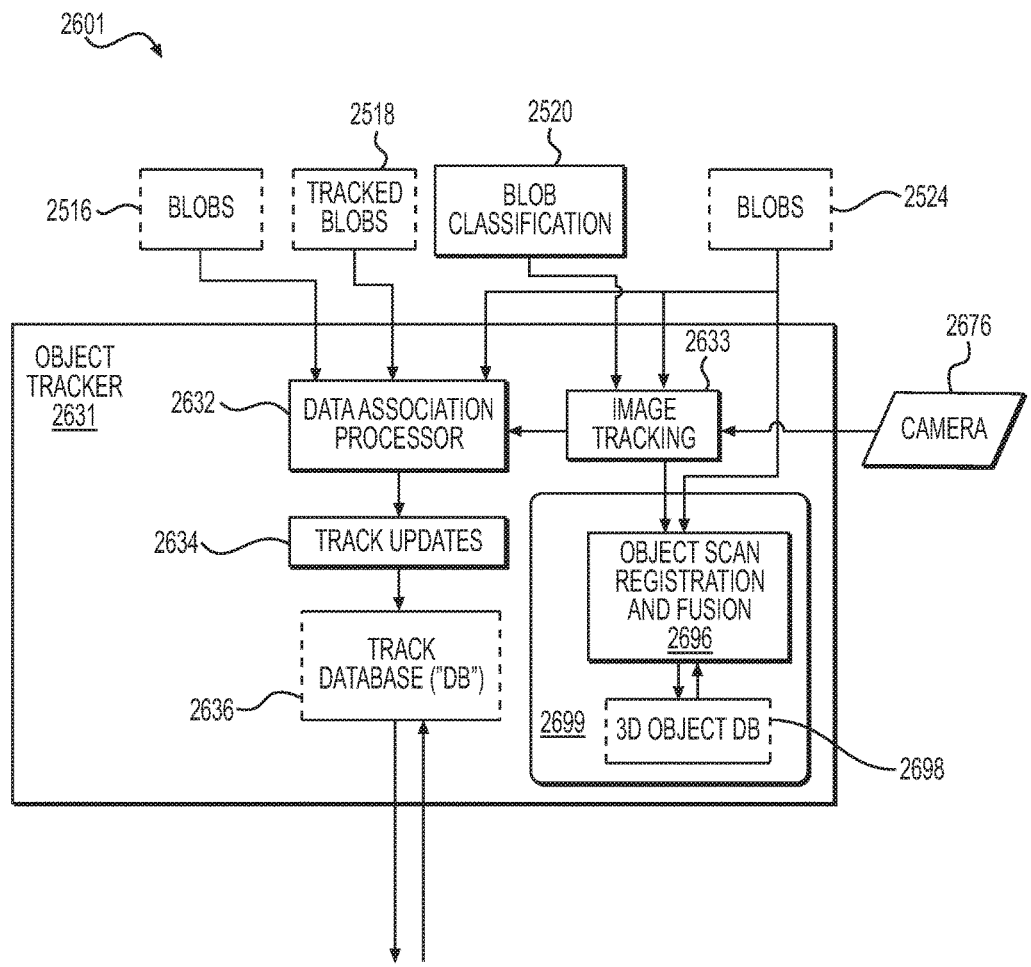
FIG. 26B is a diagram depicting another example of an object tracker according to at least some examples.

FIG. 26B is a diagram depicting another example of an object tracker according to at least some examples. Diagram 2601 includes an object tracker 2631 that may include structures and/or functions as similarly-named elements described in connection to one or more other drawings (e.g., FIG. 26A). As shown, object tracker 2631 includes an optional registration portion 2699 that includes a processor 2696 configured to perform object scan registration and data fusion. Processor 2696 is further configured to store the resultant data in 3D object database 2698.

Referring back to FIG. 26A, diagram 2600 also includes classifier 2660, which may include a track classification engine 2662 for generating static obstacle data 2672 and dynamic obstacle data 2674, both of which may be transmitted to the planner for path planning purposes. In at least one example, track classification engine 2662 is configured to determine whether an obstacle is static or dynamic, as well as another classification type for the object (e.g., whether the object is a vehicle, pedestrian, tree, cyclist, dog, cat, paper bag, etc.). Static obstacle data 2672 may be formed as part of an obstacle map (e.g., a 2D occupancy map), and dynamic obstacle data 2674 may be formed to include bounding boxes with data indicative of velocity and classification type. Dynamic obstacle data 2674, at least in some cases, includes 2D dynamic obstacle map data.

Figure 27:
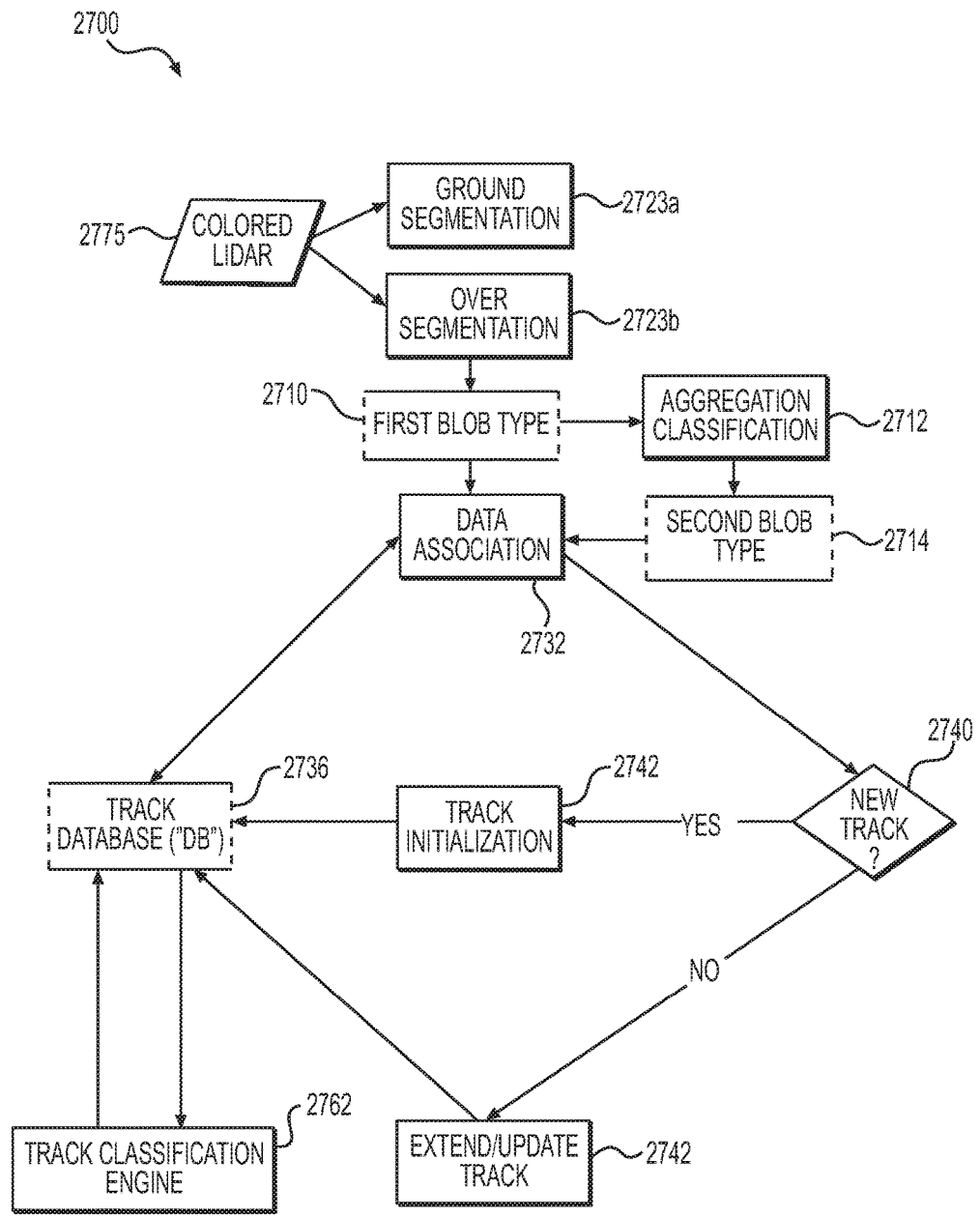
FIG. 27 is an example of front-end processor for a perception engine, according to some examples.

FIG. 27 is an example of front-end processor for a perception engine, according to some examples. Diagram 2700 includes a ground segmentation processor 2723a for performing ground segmentation, and an over segmentation processor 2723b for performing "over-segmentation," according to various examples. Processors 2723a and 2723b are configured to receive optionally colored Lidar data 2775. Over segmentation processor 2723b generates data 2710 of a first blob type (e.g., a relatively small blob), which is provided to an aggregation classification and segmentation engine 2712 that generates data 2714 of a second blob type. Data 2714 is provided to data association processor 2732, which is configured to detect whether data 2714 resides in track database 2736. A determination is made at 2740 whether data 2714 of the second blob type (e.g., a relatively large blob, which may include one or more smaller blobs) is a new track. If so, a track is initialized at 2742, otherwise, the tracked object data stored in track database 2736 and the track may be extended or updated by track updater 2742. Track classification engine 2762 is coupled to track database 2736 to identify and update/modify tracks by, for example, adding, removing or modifying track-related data.

Figure 28:
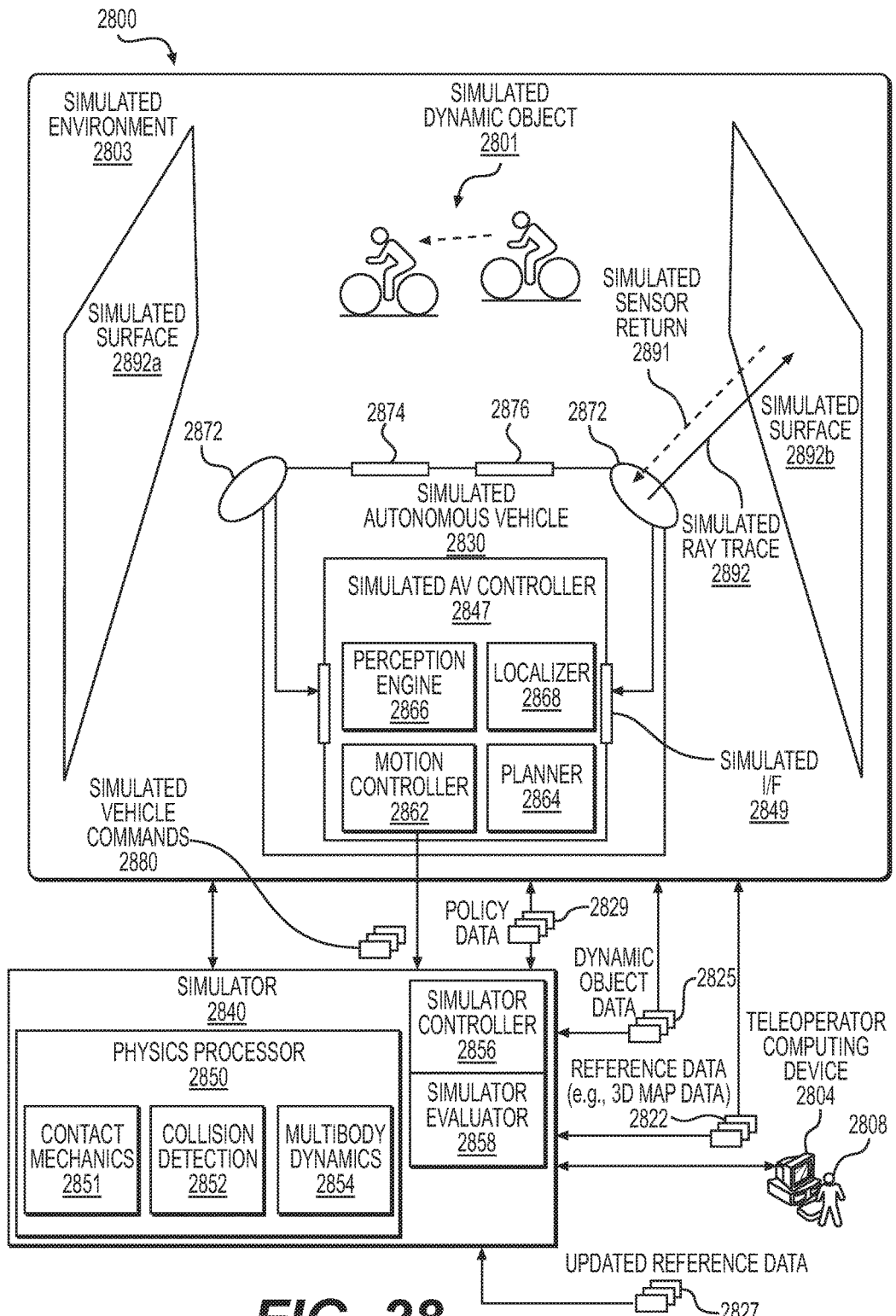
FIG. 28 is a diagram depicting a simulator configured to simulate an autonomous vehicle in a synthetic environment, according to various embodiments.

FIG. 28 is a diagram depicting a simulator configured to simulate an autonomous vehicle in a synthetic environment, according to various embodiments. Diagram 2800 includes a simulator 2840 that is configured to generate a simulated environment 2803. As shown, simulator 2840 is configured to use reference data 2822 (e.g., 3D map data and/or other map or route data including RNDF data or similar road network data) to generate simulated geometries, such as simulated surfaces 2892a and 2892b, within simulated environment 2803. Simulated surfaces 2892a and 2892b may simulate walls or front sides of buildings adjacent a roadway. Simulator 2840 may also pre-generated or procedurally generated use dynamic object data 2825 to simulate dynamic agents in a synthetic environment. An example of a dynamic agent is simulated dynamic object 2801, which is representative of a simulated cyclist having a velocity. The simulated dynamic agents may optionally respond to other static and dynamic agents in the simulated environment, including the simulated autonomous vehicle. For example, simulated object 2801 may slow down for other obstacles in simulated environment 2803 rather than follow a preset trajectory, thereby creating a more realistic simulation of actual dynamic environments that exist in the real world.

Simulator 2840 may be configured to generate a simulated autonomous vehicle controller 2847, which includes synthetic adaptations of a perception engine 2866, a localizer 2868, a motion controller 2862, and a planner 2864, each of which may have functionalities described herein within simulated environment 2803. Simulator 2840 may also generate simulated interfaces ("I/F") 2849 to simulate the data exchanges with different sensors modalities and different sensor data formats. As such, simulated interface 2849 may simulate a software interface for packetized data from, for example, a simulated Lidar sensor 2872. Further, simulator 2840 may also be configured to generate a simulated autonomous vehicle 2830 that implements simulated AV controller 2847. Simulated autonomous vehicle 2830 includes simulated Lidar sensors 2872, simulated camera or image sensors 2874, and simulated radar sensors 2876. In the example shown, simulated Lidar sensor 2872 may be configured to generate a simulated laser consistent with ray trace 2892, which causes generation of simulated sensor return 2891. Note that simulator 2840 may simulate the addition of noise or other environmental effects on sensor data (e.g., added diffusion or reflections that affect simulated sensor return 2891, etc.). Further yet, simulator 2840 may be configured to simulate a variety of sensor defects, including sensor failure, sensor miscalibration, intermittent data outages, and the like.

Simulator 2840 includes a physics processor 2850 for simulating the mechanical, static, dynamic, and kinematic aspects of an autonomous vehicle for use in simulating behavior of simulated autonomous vehicle 2830. For example, physics processor 2850 includes a content mechanics module 2851 for simulating contact mechanics, a collision detection module 2852 for simulating the interaction between simulated bodies, and a multibody dynamics module 2854 to simulate the interaction between simulated mechanical interactions.

Simulator 2840 also includes a simulator controller 2856 configured to control the simulation to adapt the functionalities of any synthetically-generated element of simulated environment 2803 to determine cause-effect relationship, among other things. Simulator 2840 includes a simulator evaluator 2858 to evaluate the performance synthetically-generated element of simulated environment 2803. For example, simulator evaluator 2858 may analyze simulated vehicle commands 2880 (e.g., simulated steering angles and simulated velocities) to determine whether such commands are an appropriate response to the simulated activities within simulated environment 2803. Further, simulator evaluator 2858 may evaluate interactions of a teleoperator 2808 with the simulated autonomous vehicle 2830 via teleoperator computing device 2804. Simulator evaluator 2858 may evaluate the effects of updated reference data 2827, including updated map tiles and route data, which may be added to guide the responses of simulated autonomous vehicle 2830. Simulator evaluator 2858 may also evaluate the responses of simulator AV controller 2847 when policy data 2829 is updated, deleted, or added. The above-description of simulator 2840 is not intended to be limiting. As such, simulator 2840 is configured to perform a variety of different simulations of an autonomous vehicle relative to a simulated environment, which include both static and dynamic features. For example, simulator 2840 may be used to validate changes in software versions to ensure reliability. Simulator 2840 may also be used to determine vehicle dynamics properties and for calibration purposes. Further, simulator 2840 may be used to explore the space of applicable controls and resulting trajectories so as to effect learning by self-simulation.

Figure 29:
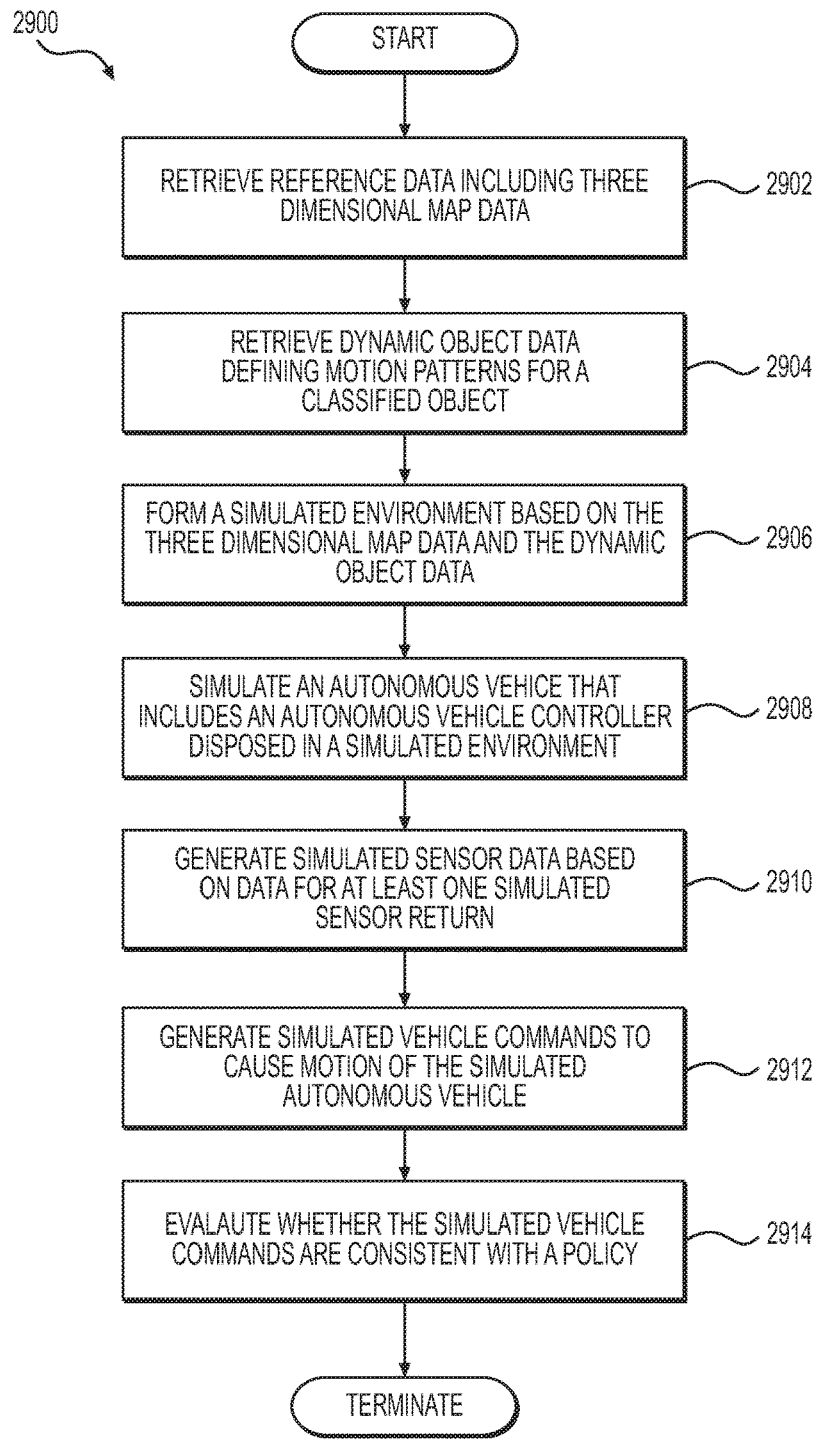
FIG. 29 is an example of a flow chart to simulate various aspects of an autonomous vehicle, according to some embodiments.

FIG. 29 is an example of a flow chart to simulate various aspects of an autonomous vehicle, according to some embodiments. Flow chart 2900 begins at 2902, at which reference data including three dimensional map data is received into a simulator. Dynamic object data defining motion patterns for a classified object may be retrieved at 2904. At 2906, a simulated environment is formed based on at least three dimensional ("3D") map data and the dynamic object data. The simulated environment may include one or more simulated surfaces. At 2908, an autonomous vehicle is simulated that includes a simulated autonomous vehicle controller that forms part of a simulated environment. The autonomous vehicle controller may include a simulated perception engine and a simulated localizer configured to receive sensor data. At 2910, simulated sensor data are generated based on data for at least one simulated sensor return, and simulated vehicle commands are generated at 2912 to cause motion (e.g., vectored propulsion) by a simulated autonomous vehicle in a synthetic environment. At 2914, simulated vehicle commands are evaluated to determine whether the simulated autonomous vehicle behaved consistent with expected behaviors (e.g., consistent with a policy).

Figure 30:
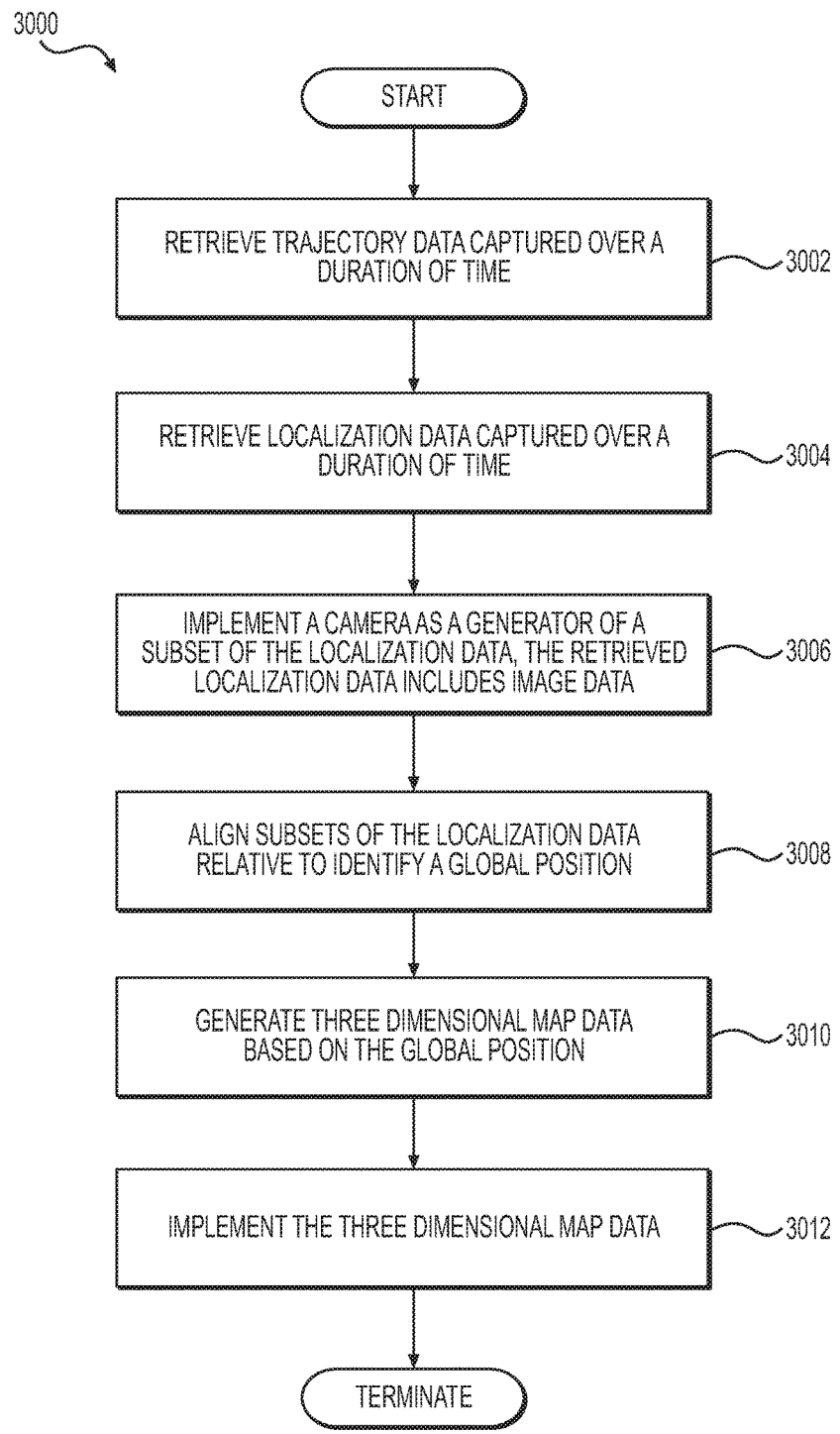
FIG. 30 is an example of a flow chart to generate map data, according to some embodiments.

FIG. 30 is an example of a flow chart to generate map data, according to some embodiments. Flow chart 3000 begins at 3002, at which trajectory data is retrieved. The trajectory data may include trajectories captured over a duration of time (e.g., as logged trajectories). At 3004, at least localization data may be received. The localization data may be captured over a duration of time (e.g., as logged localization data). At 3006, a camera or other image sensor may be implemented to generate a subset of the localization data. As such, the retrieved localization data may include image data. At 3008, subsets of localization data are aligned to identifying a global position (e.g., a global pose). At 3010, three dimensional ("3D") map data is generated based on the global position, and at 3012, the 3 dimensional map data is available for implementation by, for example, a manual route data editor (e.g., including a manual road network data editor, such as an RNDF editor), an automated route data generator (e.g., including an automatic road network generator, including an automatic RNDF generator), a fleet of autonomous vehicles, a simulator, a teleoperator computing device, and any other component of an autonomous vehicle service.

Figure 31:
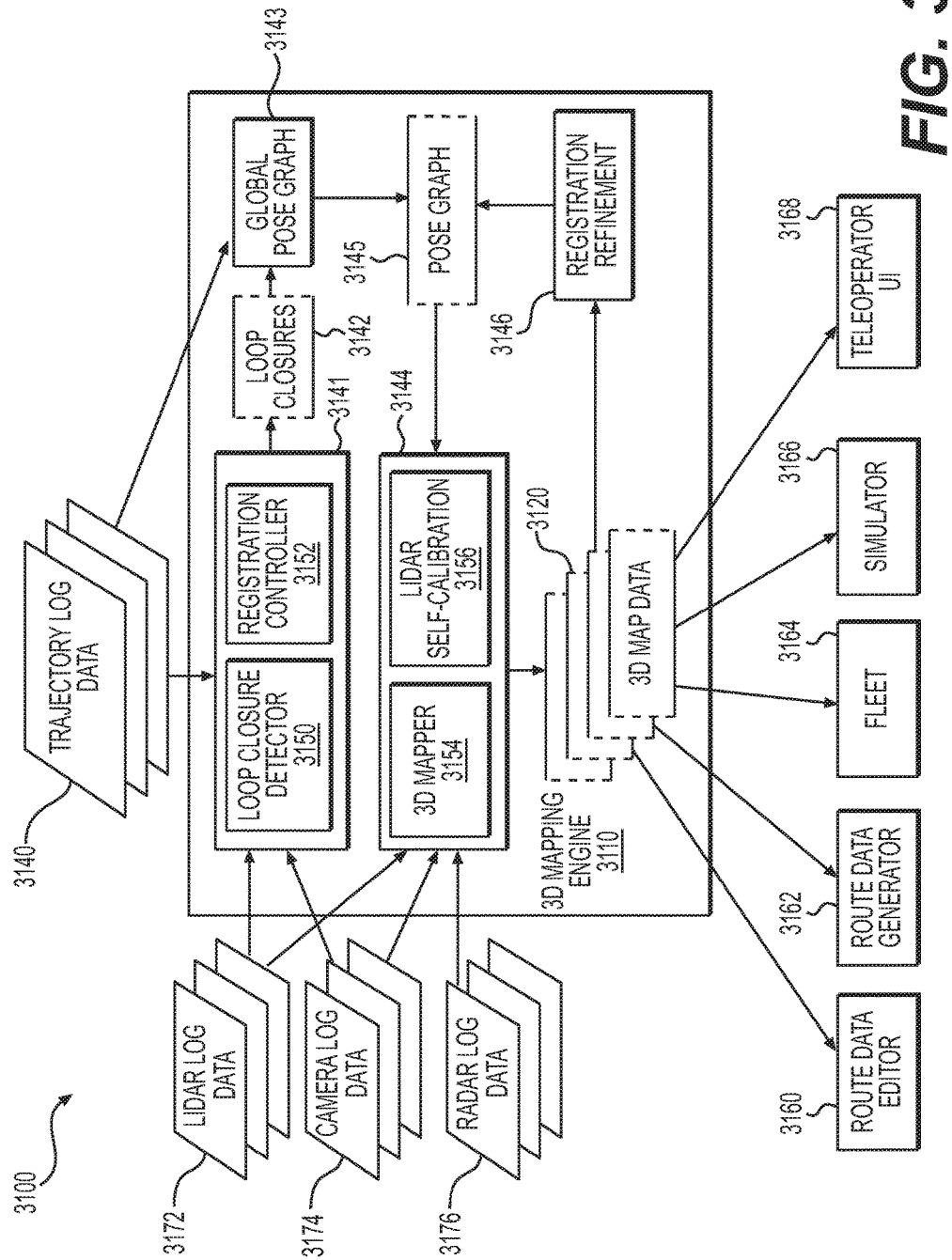
FIG. 31 is a diagram depicting an architecture of a mapping engine, according to some embodiments

FIG. 31 is a diagram depicting an architecture of a mapping engine, according to some embodiments. Diagram 3100 includes a 3D mapping engine that is configured to receive trajectory log data 3140, Lidar log data 3172, camera log data 3174, radar log data 3176, and other optional logged sensor data (not shown). Logic 3141 includes a loop-closure detector 3150 configured to detect whether sensor data indicates a nearby point in space has been previously visited, among other things. Logic 3141 also includes a registration controller 3152 for aligning map data, including 3D map data in some cases, relative to one or more registration points. Further, logic 3141 provides data 3142 representing states of loop closures for use by a global pose graph generator 3143, which is configured to generate pose graph data 3145. In some examples, pose graph data 3145 may also be generated based on data from registration refinement module 3146. Logic 3144 includes a 3D mapper 3154 and a Lidar self-calibration unit 3156. Further, logic 3144 receives sensor data and pose graph data 3145 to generate 3D map data 3120 (or other map data, such as 4D map data). In some examples, logic 3144 may implement a truncated sign distance function ("TSDF") to fuse sensor data and/or map data to form optimal three-dimensional maps. Further, logic 3144 is configured to include texture and reflectance properties. 3D map data 3120 may be released for usage by a manual route data editor 3160 (e.g., an editor to manipulate Route data or other types of route or reference data), an automated route data generator 3162 (e.g., logic to configured to generate route data or other types of road network or reference data), a fleet of autonomous vehicles 3164, a simulator 3166, a teleoperator computing device 3168, and any other component of an autonomous vehicle service. Mapping engine 3110 may capture semantic information from manual annotation or automatically-generated annotation as well as other sensors, such as sonar or instrumented environment (e.g., smart stop-lights).

Figure 32:
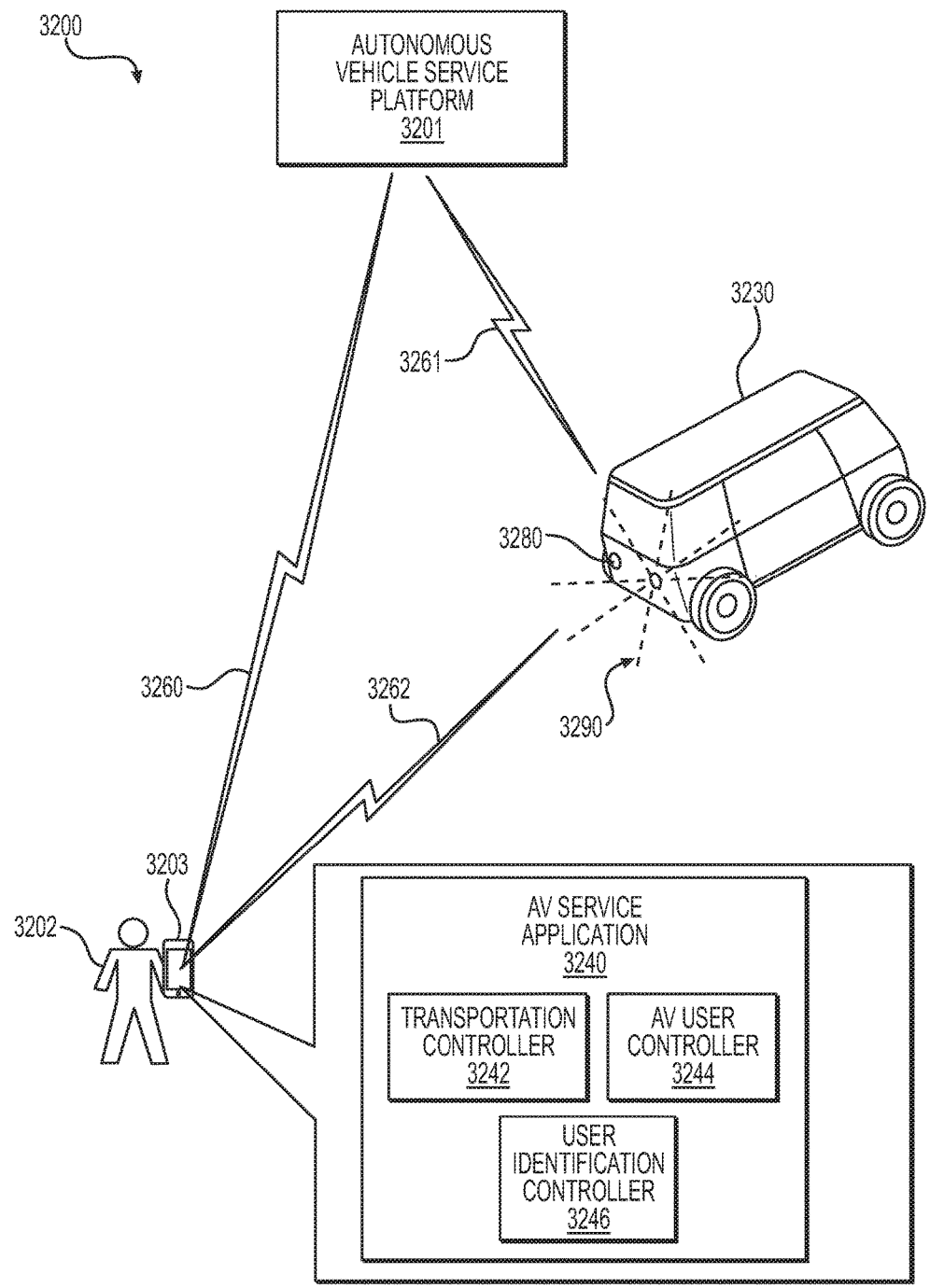
FIG. 32 is a diagram depicting an autonomous vehicle application, according to some examples.

FIG. 32 is a diagram depicting an autonomous vehicle application, according to some examples. Diagram 3200 depicts a mobile computing device 3203 including an autonomous service application 3240 that is configured to contact an autonomous vehicle service platform 3201 to arrange transportation of user 3202 via an autonomous vehicle 3230. As shown, autonomous service application 3240 may include a transportation controller 3242, which may be a software application residing on a computing device (e.g., a mobile phone 3203, etc.). Transportation controller 3242 is configured to receive, schedule, select, or perform operations related to autonomous vehicles and/or autonomous vehicle fleets for which a user 3202 may arrange transportation from the user's location to a destination. For example, user 3202 may open up an application to request vehicle 3230. The application may display a map and user 3202 may drop a pin to indicate their destination within, for example, a geo-fenced region. Alternatively, the application may display a list of nearby pre-specified pick-up locations, or provide the user with a text entry field in which to type a destination either by address or by name.

Further to the example shown, autonomous vehicle application 3240 may also include a user identification controller 3246 that may be configured to detect that user 3202 is in a geographic region, or vicinity, near autonomous vehicle 3230, as the vehicle approaches. In some situations, user 3202 may not readily perceive or identify autonomous vehicle 3230 as it approaches for use by user 3203 (e.g., due to various other vehicles, including trucks, cars, taxis, and other obstructions that are typical in city environments). In one example, autonomous vehicle 3230 may establish a wireless communication link 3262 (e.g., via a radio frequency ("RF") signal, such as WiFi or Bluetooth®, including BLE, or the like) for communicating and/or determining a spatial location of user 3202 relative to autonomous vehicle 3230 (e.g., using relative direction of RF signal and signal strength). In some cases, autonomous vehicle 3230 may detect an approximate geographic location of user 3202 using, for example, GPS data or the like. A GPS receiver (not shown) of mobile computing device 3203 may be configured to provide GPS data to autonomous vehicle service application 3240. Thus, user identification controller 3246 may provide GPS data via link 3260 to autonomous vehicle service platform 3201, which, in turn, may provide that location to autonomous vehicle 3230 via link 3261. Subsequently, autonomous vehicle 3230 may determine a relative distance and/or direction of user 3202 by comparing the user's GPS data to the vehicle's GPS-derived location.

Autonomous vehicle 3230 may also include additional logic to identify the presence of user 3202, such that logic configured to perform face detection algorithms to detect either user 3202 generally, or to specifically identify the identity (e.g., name, phone number, etc.) of user 3202 based on the user's unique facial characteristics. Further, autonomous vehicle 3230 may include logic to detect codes for identifying user 3202. Examples of such codes include specialized visual codes, such as QR codes, color codes, etc., specialized audio codes, such as voice activated or recognized codes, etc., and the like. In some cases, a code may be an encoded security key that may be transmitted digitally via link 3262 to autonomous vehicle 3230 to ensure secure ingress and/or egress. Further, one or more of the techniques described herein for identifying user 3202 may be used as a secured means to grant ingress and egress privileges to user 3202 so as to prevent others from entering autonomous vehicle 3230 (e.g., to ensure third party persons do not enter an unoccupied autonomous vehicle prior to arriving at user 3202). According to various examples, any other means for identifying user 3202 and providing secured ingress and egress may also be implemented in one or more of autonomous vehicle service application 3240, autonomous vehicle service platform 3201, and autonomous vehicle 3230.

To assist user 3302 in identifying the arrival of its requested transportation, autonomous vehicle 3230 may be configured to notify or otherwise alert user 3202 to the presence of autonomous vehicle 3230 as it approaches user 3202. For example, autonomous vehicle 3230 may activate one or more light-emitting devices 3280 (e.g., LEDs) in accordance with specific light patterns. In particular, certain light patterns are created so that user 3202 may readily perceive that autonomous vehicle 3230 is reserved to service the transportation needs of user 3202. As an example, autonomous vehicle 3230 may generate light patterns 3290 that may be perceived by user 3202 as a "wink," or other animation of its exterior and interior lights in such a visual and temporal way. The patterns of light 3290 may be generated with or without patterns of sound to identify to user 3202 that this vehicle is the one that they booked.

According to some embodiments, autonomous vehicle user controller 3244 may implement a software application that is configured to control various functions of an autonomous vehicle. Further, an application may be configured to redirect or reroute the autonomous vehicle during transit to its initial destination. Further, autonomous vehicle user controller 3244 may be configured to cause on-board logic to modify interior lighting of autonomous vehicle 3230 to effect, for example, mood lighting. Controller 3244 may also control a source of audio (e.g., an external source such as Spotify, or audio stored locally on the mobile computing device 3203), select a type of ride (e.g., modify desired acceleration and braking aggressiveness, modify active suspension parameters to select a set of "road-handling" characteristics to implement aggressive driving characteristics, including vibrations, or to select "soft-ride" qualities with vibrations dampened for comfort), and the like. For example, mobile computing device 3203 may be configured to control HVAC functions as well, like ventilation and temperature.

Figure 33:
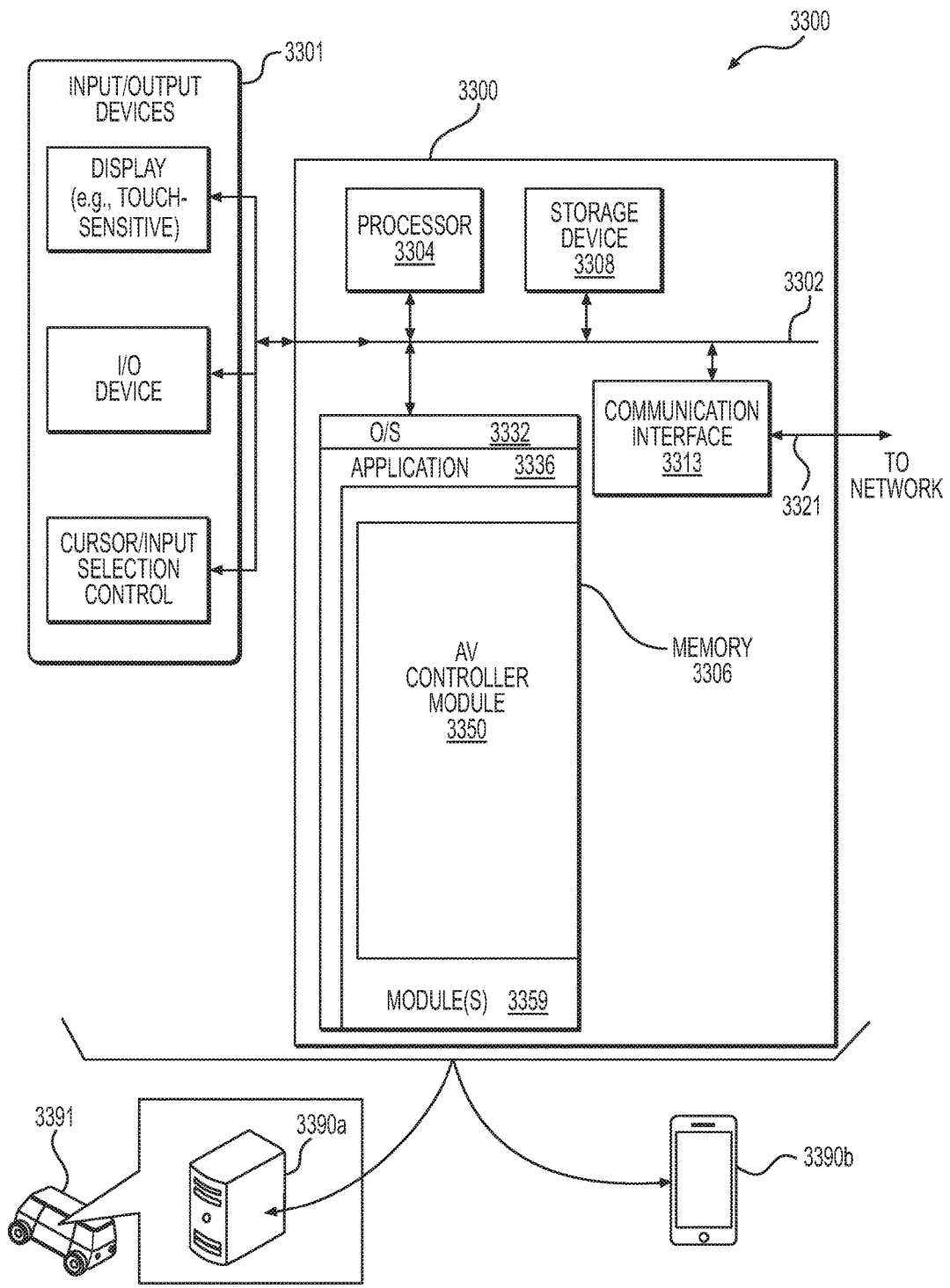
FIGS. 33 to 35 illustrate examples of various computing platforms configured to provide various functionalities to components of an autonomous vehicle service, according to various embodiments.
Figure 34:
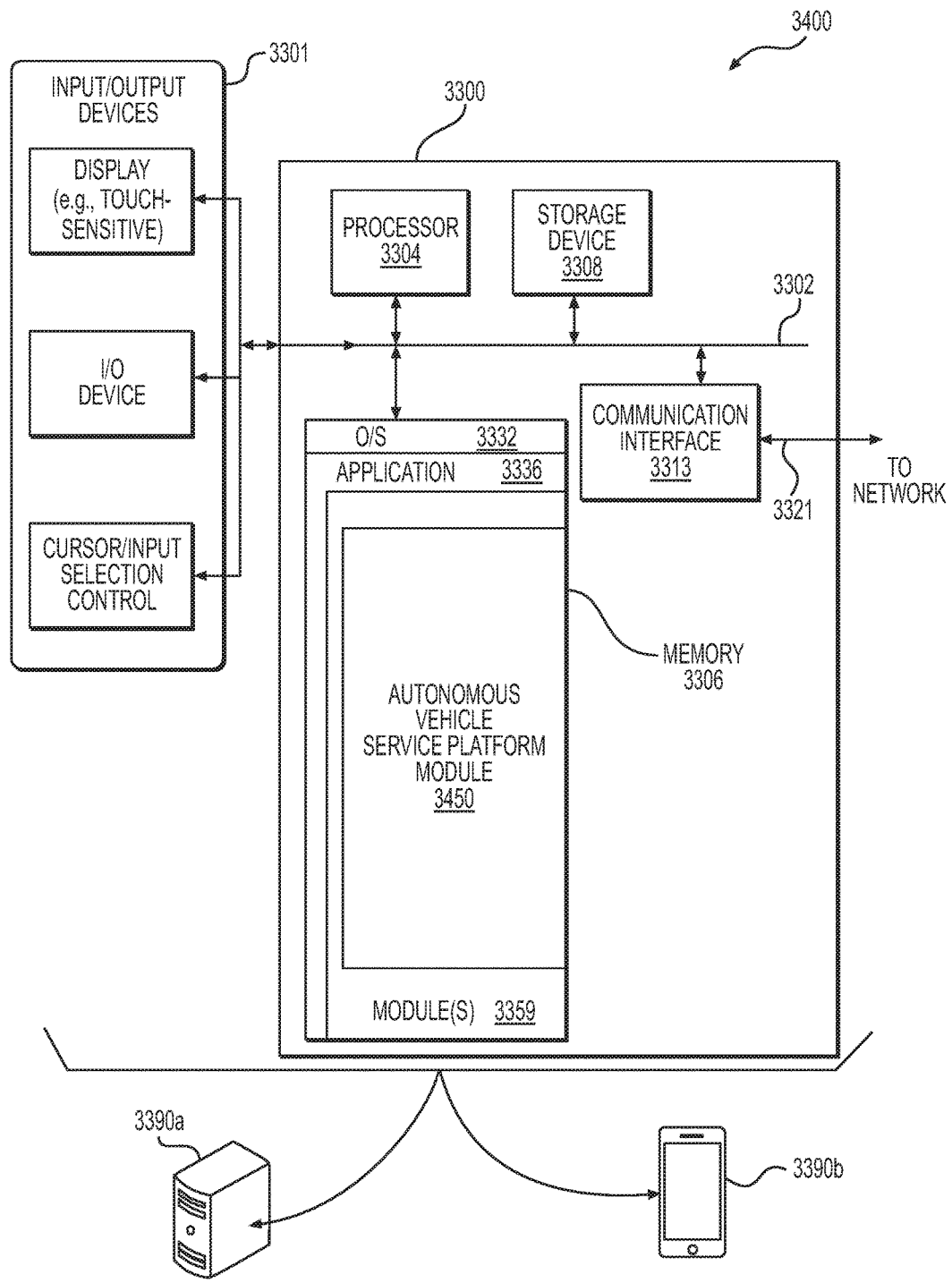
Figure 35:
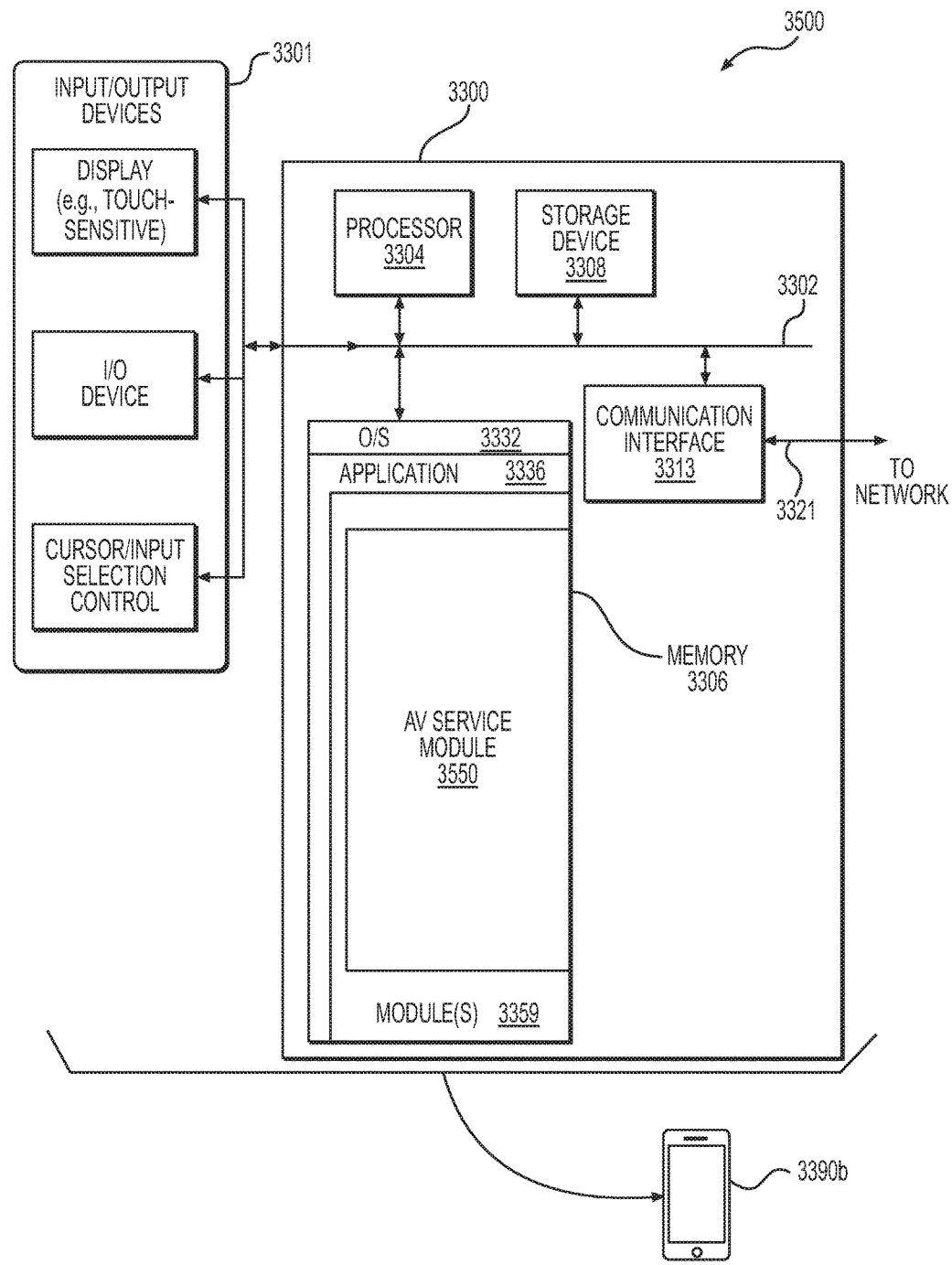

FIGS. 33 to 35 illustrate examples of various computing platforms configured to provide various functionalities to components of an autonomous vehicle service, according to various embodiments. In some examples, computing platform 3300 may be used to implement computer programs, applications, methods, processes, algorithms, or other software to perform any of the techniques described herein.

Note that various structures and/or functionalities of FIG. 33 are applicable to FIGS. 34 and 35, and, as such, some elements in those figures may be discussed in the context of FIG. 33.

In some cases, computing platform 3300 can be disposed in any device, such as a computing device 3390a, which may be disposed in one or more computing device in an autonomous vehicle service platform, an autonomous vehicle 3391, and/or mobile computing device 3390b.

Computing platform 3300 includes a bus 3302 or other communication mechanism for communicating information, which interconnects subsystems and devices, such as processor 3304, system memory 3306 (e.g., RAM, etc.), storage device 3308 (e.g., ROM, etc.), an in-memory cache (which may be implemented in RAM 3306 or other portions of computing platform 3300), a communication interface 3313 (e.g., an Ethernet or wireless controller, a Bluetooth controller, NFC logic, etc.) to facilitate communications via a port on communication link 3321 to communicate, for example, with a computing device, including mobile computing and/or communication devices with processors. Processor 3304 can be implemented with one or more graphics processing units ("GPUs"), with one or more central processing units ("CPUs"), such as those manufactured by Intel® Corporation, or one or more virtual processors, as well as any combination of CPUs and virtual processors. Computing platform 3300 exchanges data representing inputs and outputs via input-and-output devices 3301, including, but not limited to, keyboards, mice, audio inputs (e.g., speech-to-text devices), user interfaces, displays, monitors, cursors, touch-sensitive displays, LCD or LED displays, and other I/O-related devices.

According to some examples, computing platform 3300 performs specific operations by processor 3304 executing one or more sequences of one or more instructions stored in system memory 3306, and computing platform 3300 can be implemented in a client-server arrangement, peer-to-peer arrangement, or as any mobile computing device, including smart phones and the like. Such instructions or data may be read into system memory 3306 from another computer readable medium, such as storage device 3308. In some examples, hard-wired circuitry may be used in place of or in combination with software instructions for implementation. Instructions may be embedded in software or firmware. The term "computer readable medium" refers to any tangible medium that participates in providing instructions to processor 3304 for execution. Such a medium may take many forms, including but not limited to, non-volatile media and volatile media. Non-volatile media includes, for example, optical or magnetic disks and the like. Volatile media includes dynamic memory, such as system memory 3306.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read. Instructions may further be transmitted or received using a transmission medium. The term "transmission medium" may include any tangible or intangible medium that is capable of storing, encoding or carrying instructions for execution by the machine, and includes digital or analog communications signals or other intangible medium to facilitate communication of such instructions. Transmission media includes coaxial cables, copper wire, and fiber optics, including wires that comprise bus 3302 for transmitting a computer data signal.

In some examples, execution of the sequences of instructions may be performed by computing platform 3300. According to some examples, computing platform 3300 can be coupled by communication link 3321 (e.g., a wired network, such as LAN, PSTN, or any wireless network, including WiFi of various standards and protocols, Bluetooth®, NFC, Zig-Bee, etc.) to any other processor to perform the sequence of instructions in coordination with (or asynchronous to) one another. Computing platform 3300 may transmit and receive messages, data, and instructions, including program code (e.g., application code) through communication link 3321 and communication interface 3313. Received program code may be executed by processor 3304 as it is received, and/or stored in memory 3306 or other non-volatile storage for later execution.

In the example shown, system memory 3306 can include various modules that include executable instructions to implement functionalities described herein. System memory 3306 may include an operating system ("O/S") 3332, as well as an application 3336 and/or logic module(s) 3359. In the example shown in FIG. 33, system memory 3306 includes an autonomous vehicle ("AV") controller module 3350 and/or its components (e.g., a perception engine module, a localization module, a planner module, and/or a motion controller module), any of which, or one or more portions of which, can be configured to facilitate an autonomous vehicle service by implementing one or more functions described herein.

Referring to the example shown in FIG. 34, system memory 3306 includes an autonomous vehicle service platform module 3450 and/or its components (e.g., a teleoperator manager, a simulator, etc.), any of which, or one or more portions of which, can be configured to facilitate managing an autonomous vehicle service by implementing one or more functions described herein.

Referring to the example shown in FIG. 35, system memory 3306 includes an autonomous vehicle ("AV") module and/or its components for use, for example, in a mobile computing device. One or more portions of module 3550 can be configured to facilitate delivery of an autonomous vehicle service by implementing one or more functions described herein.

Referring back to FIG. 33, the structures and/or functions of any of the features described or incorporated by reference herein can be implemented in software, hardware, firmware, circuitry, or a combination thereof. Note that the structures and constituent elements above, as well as their functionality, may be aggregated with one or more other structures or elements. Alternatively, the elements and their functionality may be subdivided into constituent sub-elements, if any. As software, the techniques described or incorporated by reference herein may be implemented using various types of programming or formatting languages, frameworks, syntax, applications, protocols, objects, or techniques. As hardware and/or firmware, the techniques described or incorporated by reference herein may be implemented using various types of programming or integrated circuit design languages, including hardware description languages, such as any register transfer language ("RTL") configured to design field-programmable gate arrays ("FPGAs"), application-specific integrated circuits ("ASICs"), or any other type of integrated circuit. According to some embodiments, the term "module" can refer, for example, to an algorithm or a portion thereof, and/or logic implemented in either hardware circuitry or software, or a combination thereof. These can be varied and are not limited to the examples or descriptions provided.

In some embodiments, module 3350 of FIG. 33, module 3450 of FIG. 34, and module 3550 of FIG. 35, or one or more of their components, or any process or device described herein, can be in communication (e.g., wired or wirelessly) with a mobile device, such as a mobile phone or computing device, or can be disposed therein.

In some cases, a mobile device, or any networked computing device (not shown) in communication with one or more modules 3359 (module 3350 of FIG. 33, module 3450 of FIG. 34, and module 3550 of FIG. 35) or one or more of its components (or any process or device described herein), can provide at least some of the structures and/or functions of any of the features described herein. As depicted in the figures described or incorporated by reference herein, the structures and/or functions of any of the features described or incorporated by reference herein can be implemented in software, hardware, firmware, circuitry, or any combination thereof. Note that the structures and constituent elements above, as well as their functionality, may be aggregated or combined with one or more other structures or elements. Alternatively, the elements and their functionality may be subdivided into constituent sub-elements, if any. As software, at least some of the techniques described or incorporated by reference herein may be implemented using various types of programming or formatting languages, frameworks, syntax, applications, protocols, objects, or techniques. For example, at least one of the elements depicted in any of the figures can represent one or more algorithms. Or, at least one of the elements can represent a portion of logic including a portion of hardware configured to provide constituent structures and/or functionalities.

For example, module 3350 of FIG. 33, module 3450 of FIG. 34, and module 3550 of FIG. 35, or one or more of its components, or any process or device described herein, can be implemented in one or more computing devices (i.e., any mobile computing device, such as a wearable device, an audio device (such as headphones or a headset) or mobile phone, whether worn or carried) that include one or more processors configured to execute one or more algorithms in memory. Thus, at least some of the elements in the figures described or incorporated by reference herein can represent one or more algorithms. Or, at least one of the elements can represent a portion of logic including a portion of hardware configured to provide constituent structures and/or functionalities. These can be varied and are not limited to the examples or descriptions provided.

As hardware and/or firmware, the structures and/or techniques described or incorporated by reference herein can be implemented using various types of programming or integrated circuit design languages, including hardware description languages, such as any register transfer language ("RTL") configured to design field-programmable gate arrays ("FPGAs"), application-specific integrated circuits ("ASICs"), multi-chip modules, or any other type of integrated circuit.

For example, module 3350 of FIG. 33, module 3450 of FIG. 34, and module 3550 of FIG. 35, or one or more of its components, or any process or device described herein, can be implemented in one or more computing devices that include one or more circuits. Thus, at least one of the elements in the figures described or incorporated by reference herein can represent one or more components of hardware. Or, at least one of the elements can represent a portion of logic including a portion of a circuit configured to provide constituent structures and/or functionalities.

According to some embodiments, the term "circuit" can refer, for example, to any system including a number of components through which current flows to perform one or more functions, the components including discrete and complex components. Examples of discrete components include transistors, resistors, capacitors, inductors, diodes, and the like, and examples of complex components include memory, processors, analog circuits, digital circuits, and the like, including field-programmable gate arrays ("FPGAs"), application-specific integrated circuits ("ASICs"). Therefore, a circuit can include a system of electronic components and logic components (e.g., logic configured to execute instructions, such that a group of executable instructions of an algorithm, for example, and, thus, is a component of a circuit). According to some embodiments, the term "module" can refer, for example, to an algorithm or a portion thereof, and/or logic implemented in either hardware circuitry or software, or a combination thereof (i.e., a module can be implemented as a circuit). In some embodiments, algorithms and/or the memory in which the algorithms are stored are "components" of a circuit. Thus, the term "circuit" can also refer, for example, to a system of components, including algorithms. These can, be varied and are not limited to the examples or descriptions provided.

Figure 36:
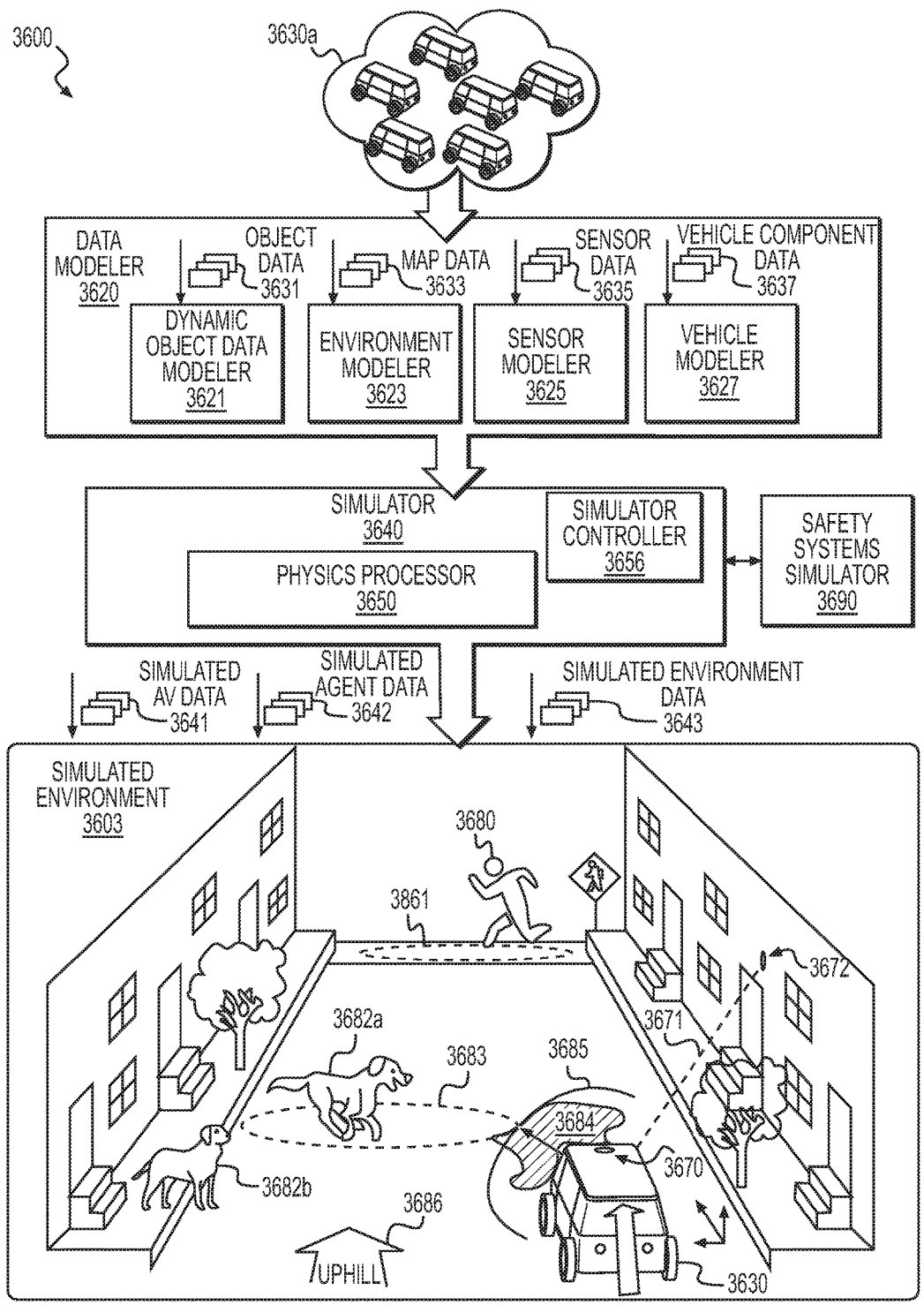
FIG. 36 is a diagram depicting a simulator configured to simulate one or more functions of a simulated autonomous vehicle in a simulated environment, according to some examples.

FIG. 36 is a diagram depicting a simulator configured to simulate one or more functions of a simulated autonomous vehicle in a simulated environment, according to some examples. Diagram 3600 depicts a simulator 3640 configured to synthesize a simulated world or environment 3603 in which operation of an autonomous vehicle 3630 (and any of its components, such as sensors) may be simulated to determine, for example, the efficacy of hardware and software, or a combination thereof, for a fleet 3630a of one or more autonomous vehicles that may constitute an autonomous vehicle service. Further, simulator 3640 may be configured to simulate, for example, vehicle dynamics as simulated autonomous vehicle 3630 travels in different driving conditions or scenarios. For example, simulator 3640 may simulate operation of autonomous vehicle 3630 in a driving scenario that include driving over unique terrain that may be unique to a city (e.g., hills of San Francisco, city traffic of New York City, etc.), as well as during different driving conditions (e.g., simulations of reduced wheel friction due to rain, ice, etc.). In the example shown, simulated environment 3603 includes a road segment has a grade or slope that is increasing in the direction of travel of simulated autonomous vehicle 3630 (i.e., vehicle 3630 is traveling uphill as indicated by notation 3686), and also is depicted as having a formation of ice 3684 over which simulated autonomous vehicle 3630 may traverse.

Further, simulator 3640 may also generate simulated environment 3603 based on synthesis of laser and camera data, as well as any other data, such as radar data, sonar data, etc. Simulated environment 3603 may be based on, for example, 3D map data including 3D point clouds generated using laser scanners in combination with camera vision/image data (or any other sensor data). Examples of sensor data includes, but is not limited to, Lidar data, image or camera data, GPS data, inertial measurement unit ("IMU") data, acoustic data, odometry data, wheel angle data, battery charge levels, drive current for one or more drive trains or electric motors, thermal energy data (e.g., temperature) of any component, acceleration or deceleration data, braking pressures or forces may be applied to one or more wheels, etc., as well as other sensor data described or otherwise incorporated by reference herein. Simulator 3640 may also simulate sensor return data that may be detected by a sensor disposed on or in simulated autonomous vehicle 3630. An example of simulated sensor return data includes simulated Lidar laser return 3671 reflected from a portion 3672 of an external feature, such as a façade of a building adjacent a roadway.

Diagram 3600 depicts a data modeler 3620 and a simulator 3640 that may operate cooperatively to generate simulated environment 3603 including dynamic objects 3680 and 3682a, as well as simulated road conditions (e.g., ice 3684). Simulator 3640 may include a physics processor 3650 configured to simulate the mechanical, static, dynamic, and kinematic aspects of an autonomous vehicle for use in simulating behavior of simulated autonomous vehicle 3630. For example, physics processor 3650 may include simulated contact mechanics, as well as interactions between simulated bodies and/or simulated mechanical interactions. Simulator 3640 may also include a simulator controller 3656 configured to control the simulation to adapt the functionalities of any synthetically-generated element of simulated environment 3603 to determine and evaluate cause-effect relationships, among other things. Note that elements depicted in diagram 3600 of FIG. 36 may include structures and/or functions as similarly-named elements described in connection to one or more other drawings describe or incorporated by reference herein.

In some examples, data modeler 3620 receives log file data from a fleet 3630a of autonomous vehicles, the log file data providing various types of data, including, but not limited to, object data 3631, map data 3633, sensor data 3635, and vehicle component data 3637, as well as any other data that may describe the structures and/or functions of one or more autonomous vehicles in fleet 3630a. In some examples, the above-described data may be logged over numerous miles traveled at different times and seasons of the year, and under many different conditions. The logged data may be generated from any number of autonomous vehicles that may travel a road network any number of times. Further, data modeler 3620 may include logic to characterize roadways (e.g., features, such as grade, roughness (e.g., due to bumps, pot holes, etc.), slope angles toward the side of a road, etc.), typical or expected values of friction or surface types, dynamic objects expected probabilistically at one or more portions of a roadway network (e.g., simulated autonomous vehicle 3630 may expect to encounter numerous children as dynamic objects near a school that is over for the day), and any other characteristic. Data modeler 3620 may further include logic to characterize the roadways under a variety of weather conditions. Therefore, data modeler 3620 may use the data representing characterize roadways to form data models of a roadway network or any other path or road segment. In some cases, the logic in data modeler 3620 may aggregate or otherwise fuse data (e.g., sensor data) based on hundreds of thousands to millions of miles traveled (e.g., by fleet 3630a), or any other amounts of data logged over few or greater amount of distances for the same or different roadways.

As shown, data modeler 3620 includes a dynamic object data modeler 3621, an environment modeler 3623, a sensor modeler 3625, and a vehicle modeler 3627, or any other hardware and/or software implementation thereof to generate one or more data models, which may be used by simulator 3640 to generate one or more portions of simulated environment 3603. Dynamic object data modeler 3621 may be configured to receive data (e.g., logged data) representing characteristics of one or more objects in environments from which fleet 3630a autonomous vehicles obtains the characteristic data. Such data may include 3D point clouds or as another other data representation that may visually define the class of an object (e.g., as a pedestrian, a pet or animal, a bicyclist, an automobile, etc.), whereby the classified object may be associated with a certain level of dynamism and/or predicted range of motion (e.g., per unit time), whereby the predicted range of motion may also describe, at least in some examples, a predicted direction of the motion (e.g., represented by a vector of predicted motion). According to some examples, a predicted range of motion may describe a probability that an object may transition from a static object to a dynamic object and/or a speed or acceleration associated with the motion of the object.

In view of the foregoing, dynamic object data modeler 3621 may be configured to identify any number of objects, and may be further configured to classify the objects into any number of classes. According to some examples, dynamic object data modeler 3621 may also identify and classify static objects, including objects that may be static at one point in time and dynamic at another point in time (e.g., a pet dog 3682b sitting roadside at one point in time may suddenly jump up and run into the roadway at another point in time). To illustrate, consider that dynamic object data modeler 3621 may classify object 3682b as a dog, and may associate dynamic-characteristics and/or predicted ranges of motion to the dog. Further, dynamic object data modeler 3621 may generate a data model describing predictive motion of object 3682b in relation to interactions with other dynamic objects, such as dynamic object 3680 or dynamic object 3682a, which is shown as a dog in motion. In the absence of dynamic object 3682a, dog 3682b may be associated with a first probability of engaging in an activity (e.g., leaping forward and running). However, in the event that dog 3682b encounters or interacts with (or chases) dog 3682a (having a predicted range of motion 3683), the probability that dog 3682b engages in the activity may increase sharply. For instance, the probability that dog 3682b leaps forward and instinctively chases dog 3682a may increase from about 10% (e.g., based on, for example, logged data) to about 85%. Based on this data model, simulator may generate simulated environment 3603 to include two (2) dynamic objects 3682a and 3682b to consider in navigation and planning rather than one (1) dynamic object 3682a, based on modeled behaviors derived from dynamic object data modeler 3621.

Dynamic object data modeler 3621 may generate data models describing a classification for any object, as well as motion-related data (e.g., predicted ranges of motion, speeds, predicted paths of motion, etc.). Further to diagram 3600, dynamic object data modeler 3621 may generate a data model, which simulator 3640 may use to generate a rate of simulated dynamic object 3680 (e.g., a jogger) associated with a predicted range of motion (e.g., includes a direction of motion within a crosswalk). Other dynamic objects may be classified and, in some cases, may be further subclassified. For example, a road segment may be adjacent to several bars or nightclubs, whereby a classified dynamic object (e.g., young adult pedestrians) may have a first predicted behavior or motion during the day time, but may exhibit, or be predicted to exhibit, other predicted behaviors (or unpredictable behaviors) at 2:00 am after the bars and nightclubs close. Simulator 3640 may use with dynamic object data models generated by modeler 3621 to provide enhanced accuracies in a simulated environment 3603 relative to the physical environment in which an autonomous vehicle 3603 physically travels through.

Environment modeler 3623 may be configured to generate various portions of simulated environment 3603, such as static portions in some examples. An example shown, environment modeler 3623 may receive map data 3633 to generate an environmental model describing the geometries of a physical external environment. The environmental model data generated by environment modeler 3623 may be used by simulator 3640 to generate simulated environment 3603 based on, for example, 3D map data 3633. Note that in some cases, environment modeler 3623 may include or may be similar to one or more portions of a mapping engine or a mapper structure and/or function, as described or incorporated by reference herein, or the like, to generate a 3D (or 4D) simulated environment 3603.

Sensor modeler 3625 is configured to generate data models representing various functions of one or more sensors of various types of sensors, based on sensor data 3635 extracted, as logged data, from fleet 3630a of autonomous vehicles. For example, sensor data 3635 may include one or more subsets of sensor data of one or more types of sensor data, such as, but not limited to, Lidar data, radar data, sonar data, image/camera data, acoustic data, ultrasonic data, IMU-related data, odometry data, wheel angle data, and any other types of sensor data. Simulator 3640 may use data generated by sensor modeler 3625 to model any number of sensors implemented in a simulated autonomous vehicle 3630. For example, consider that an autonomous vehicle controller (not shown), which may be simulated, may be configured to identify a pose 3670 of simulated autonomous vehicle 3630 or a simulated Lidar sensor configured to ray-trace laser scans, at least one of which is depicted as a laser return 3671, as reflected from surface portion 3672. Further, the autonomous vehicle controller may access 3D map data to identify an external geometry 3672 (as well as the range or locations of such geometries), and may also be configured to identify one or more of an x-coordinate, a y-coordinate, z coordinate, a roll value, a pitch value, and a yaw value to describe the pose of the simulated Lidar sensor. In some examples, a simulator controller 3656 of simulator 3640 may be configured to compare the simulated values and measurements (e.g., intensities, ranges, reflectivity, etc.) for simulated laser return 3671 against empirically-derived Lidar data (e.g., sensor data 3635) to determine the accuracy of the simulation.

Vehicle modeler 3627 may be configured to receive data representing various types and values associated with various vehicle components, and may be further configured to generate data representing structural and/or functional characteristics of mechanical and/or electrical components of an autonomous vehicle. Further, vehicle modeler 3627 may generate a vehicle component data model that describes the dynamics and kinematics of an autonomous vehicle, as well as its electrical and mechanical functionalities.

Data modeler 3620 may also be configured to correlate one or more subsets of one type of data to one or more subsets of other types of data. According to various examples, data modeler 3620 may implement off-line or on-line deep learning techniques to determine various states of autonomous vehicle. The state data may be used by simulator 3640 and physics processor 3650 to evaluate various logic modules to determine whether a simulated response by simulated autonomous vehicle 3630 is appropriate. For example, data modeler 3620 may model the depicted road segment as having an uphill 3686 incline, and further may include normative ranges of acceleration and/or torque applied by the wheels to travel uphill. Therefore, simulated autonomous vehicle 3630 may lose friction (i.e., wheels spin) as a wheel encounters an "event," such as ice 3684. In this case, simulator controller 3656 may expect an increased rate of angular velocity of a wheel to confirm accuracy of the simulation and to take appropriate courses of action. As another example, consider simulated autonomous vehicle 3630 is slowing to a stop before a crosswalk. As such, simulator controller 3656 expects to detect a rate of deceleration and certain levels of braking (e.g., braking forces or pressure), otherwise an issue may be determined. As another example, consider that simulator controller 3656 to determine that a steering system of simulated autonomous vehicle 3630 is pulling to the right or off-road. Thus, simulator 3640 may simulate road conditions in which the road is sloping to the right (e.g., based on map data 3633), simulate a flat tire, or simulate a misalignment.

According to some examples, a simulator is configured to simulate a predicted response of a data representation of one or more functions of a simulated autonomous vehicle 3630 based on a range of motion 3683 of a classified dynamic object 3682a, which is depicted as a running dog. Simulator 3640 may further be configured to calculate a rate of change of distance 3685 between simulated autonomous vehicle 3630 and the predicted range of motion 3683 of classified dynamic object 3682a, and, if a threshold is passed (e.g., in terms of location, distance, time, etc.), simulator 3640 is configured to cause simulated autonomous vehicle 3630 to avoid simulated dynamic object 3682a in simulated environment 3603 based on the calculated rate of change of distance 3685. In some cases, autonomous vehicle 3630 may stop driving to avoid a collision with dynamic object 3682a. In some other cases, simulator 3640 may implement a safety system simulator 3690 to simulate the use of one or more safety systems on-board simulated autonomous vehicle 3630. Examples of safety system include directing sound via beam-forming and/or lights to warn dynamic object 3682a, or may implement external and/or internal safety systems. Examples of safety systems that may be simulated by simulator 3640 are described in U.S. patent application Ser. No. 14/756,994 filed Nov. 4, 2015 entitled "SYSTEM OF CONFIGURING ACTIVE LIGHTING TO INDICATE DIRECTIONALITY OF AN AUTONOMOUS VEHICLE," U.S. patent application Ser. No. 14/756,993 filed Nov. 4, 2015 entitled "METHOD FOR ROBOTIC VEHICLE COMMUNICATION WITH AN EXTERNAL ENVIRONMENT VIA ACOUSTIC BEAM FORMING," U.S. patent application Ser. No. 14/932,948 filed Nov. 4, 2015 entitled "ACTIVE LIGHTING CONTROL FOR COMMUNICATING A STATE OF AN AUTONOMOUS VEHICLE TO ENTITIES IN A SURROUNDING ENVIRONMENT," U.S. patent application Ser. No. 14/932,952 filed Nov. 4, 2015 entitled "RESILIENT SAFETY SYSTEM FOR A ROBOTIC VEHICLE," U.S. patent application Ser. No. 14/932,954 filed Nov. 4, 2015 entitled "INTERNAL SAFETY SYSTEMS FOR ROBOTIC VEHICLES," and U.S. patent application Ser. No. 14/932,962 filed Nov. 4, 2015, all of which are hereby incorporated by reference.

According to some examples, simulator 3640 may generate and use "ground truth" data for labeling (e.g., semantic labeling), and identification of which algorithm may be tested or validated (e.g., validating a software change as well as validating a change to map data 3633 or any modeled data). Moreover, simulator 3640 may be used for classifier training based on, for example, computer vision classifiers and deep neural networks (e.g., implementing Bayesian and probability inference algorithms, as well as other like techniques) to identify dynamic objects or agents in simulated environment 3603, such as dynamic objects 3680 and 3682a. Note while the techniques of implementing data modeler 3620 may be used in the context of simulation, data modeler 3620 may be implemented in any component described or incorporated by reference herein. For example, a perception engine or system may include or implement one or more portions of data modeler 3620, as well as any other structures and/or functions described the context of simulator 3640. Note that any of the components shown in FIG. 36, or described or incorporated by reference herein may be implemented in hardware or software, or a combination thereof.

Figure 37:
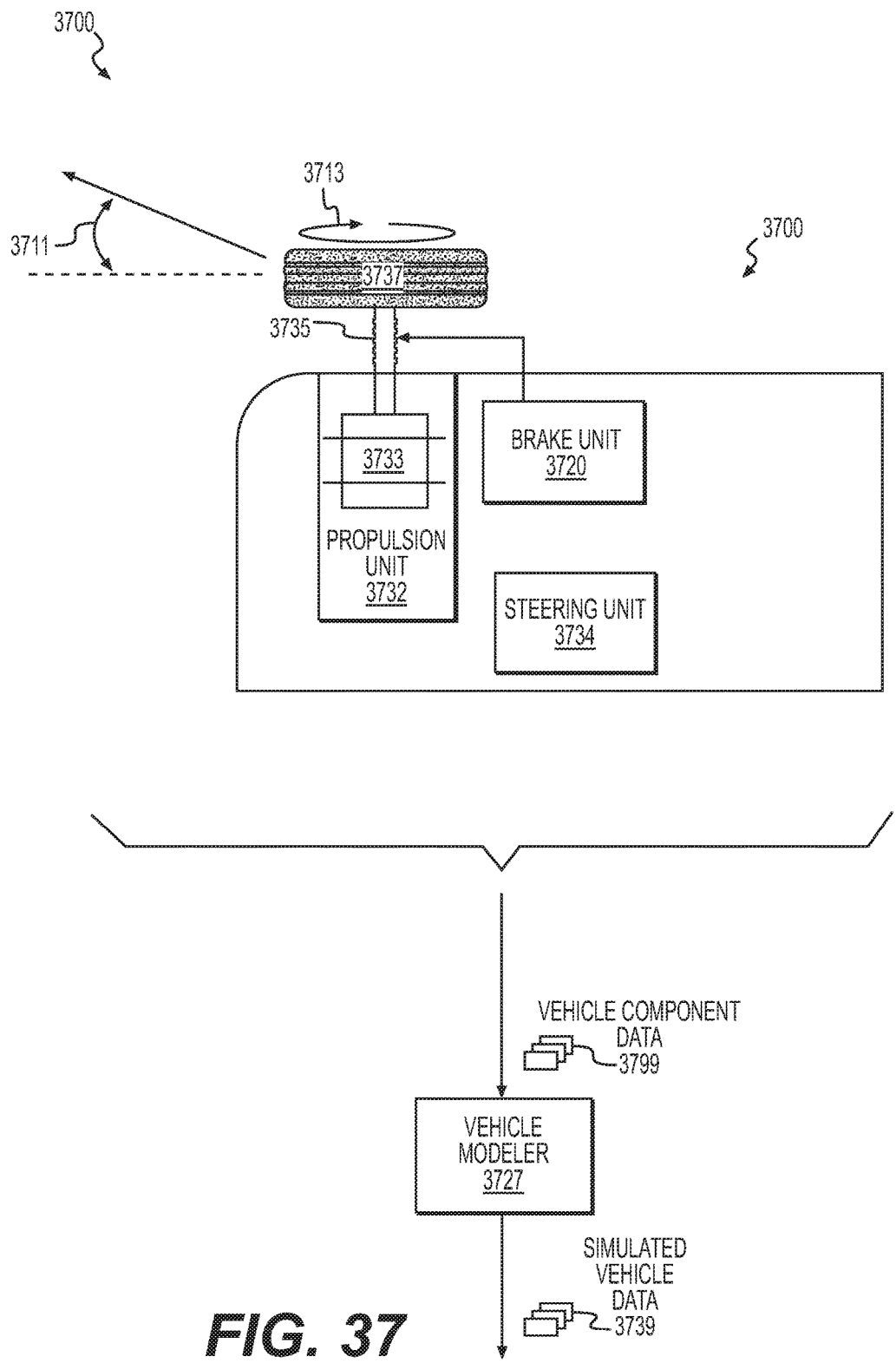
FIG. 37 depicts a vehicle modeler according to some examples.

FIG. 37 depicts a vehicle modeler according to some examples. Diagram 3700 depicts a portion 3700 of an autonomous vehicle including a propulsion unit 3732, including drive train (e.g., motor) 3733, axle 3735 and wheel 3737, a brake unit 3720 and a steering unit 3734, examples of which are described in U.S. patent application Ser. No. 14/932,958 filed Nov. 4, 2015 entitled "QUADRANT CONFIGURATION OF ROBOTIC VEHICLES," which is herein incorporated by reference. Vehicle modeler 3727 is configured to receive vehicle component data 3799, which includes model data that describes operability of the vehicle components in portion 3700, including sensed data (e.g., wheel angle 3711, angular speed 3713 of tire, and the like). Vehicle modeler 3727 is configured to receive data representing one or more components of an autonomous vehicle and identify data representing component characteristics (e.g., motor current of motor 3733) associated with the one or more components of the autonomous vehicle. Vehicle modeler 3727 generates data models of the one or more components based on the component characteristics, for which a simulator may be configured to simulate operation of one or more components (e.g., propulsion unit 3732, brake unit 3720, steering unit 3734, and the like) based on the data models to predict behavior of a simulated autonomous vehicle. In some cases, a simulator may be configured to access an event data model of that includes data representing event characteristics (e.g., an event model describing characteristics of a portion of a roadway covered in ice). Then, the simulator may be configured to simulate the event (e.g., an ice patch) in a simulated environment based on event characteristics data (e.g., reduced friction).

Figure 38:
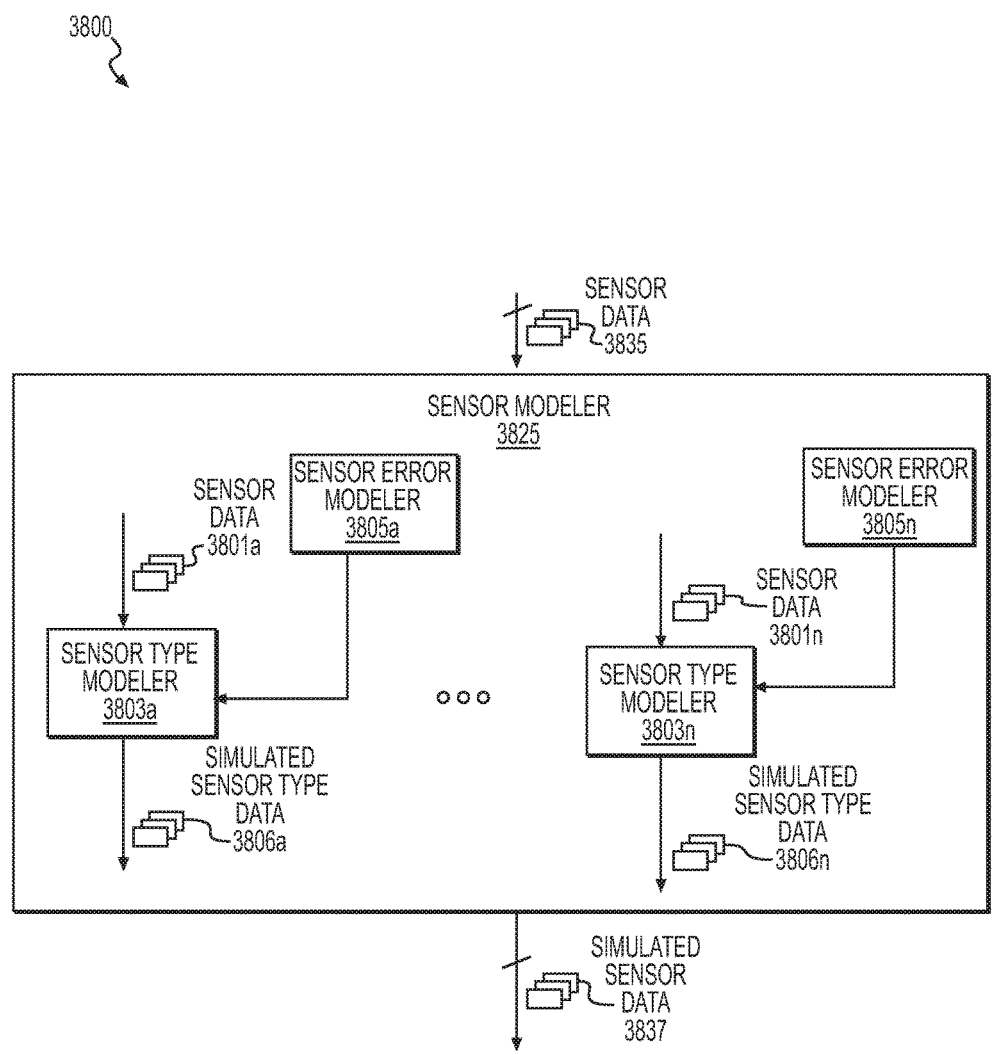
FIG. 38 is a diagram depicting an example of a sensor modeler, according to some examples.

FIG. 38 is a diagram depicting an example of a sensor modeler, according to some examples. Diagram 3000 includes a sensor modeler 3825, which, in turn, is shown to include sensor type modelers 3803 and sensor air modelers 3805 to generate simulated sensor type data 3806 based on sensor data 3801. Therefore, sensor modeler 3825 is configured to receive different types and different amounts of sensor data 3835 to generate corresponding simulated sensor data 3837. According to some examples, sensor modeler 3825 may be configured to receive data representing sensor data 3801 derived in the environments in which one or more autonomous vehicles transit, and may be further configured to model a subset of the sensor data using sensor type modeler 3803 to characterize a sensor device (e.g., a Lidar sensor) to form characterized sensor data. Thus, sensor type modeler 3803 may generate data 3806 representing a simulated sensor device based on the characterized sensor data.

In some cases, sensor error modeler 3805 may be configured to model data representing a subset of measurement deviations (e.g., an error) associated with a sensor device. Sensor type modeler 3803 may be configured to adjust data representing the simulated sensor device based on the subset of measurement deviations (e.g., as generated by sensor error modeler 3805). As an example, sensor type modeler 3803 may be configured to model a subset of Lidar sensor data to characterize a Lidar sensor to form characterized Lidar data, and to generate data representing a simulated Lidar device. Further, a subset of Lidar measurement deviations or errors may be modeled and used to adjust the data representing the simulated Lidar device based on the subset of Lidar measurement deviations.

Figure 39:
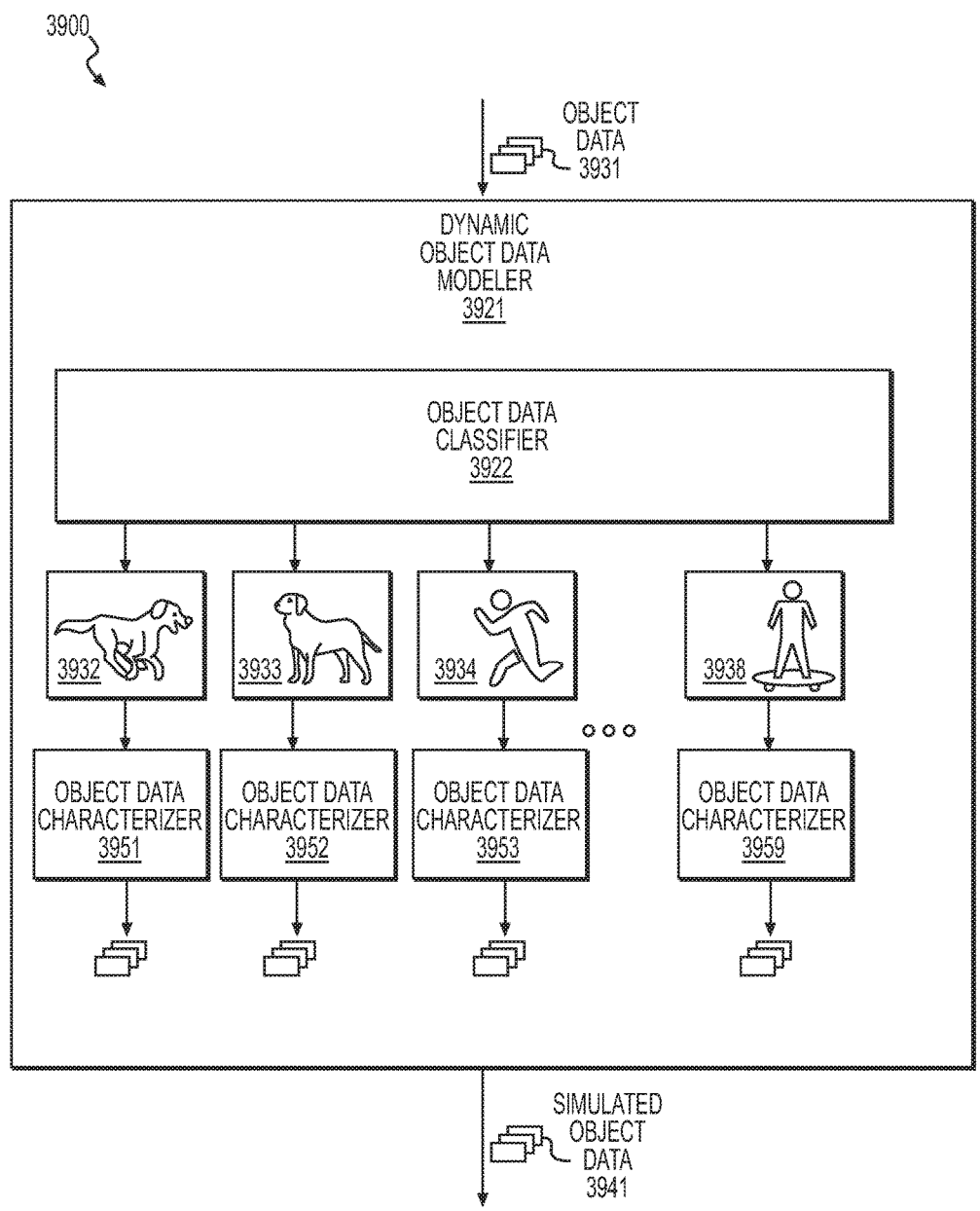
FIG. 39 is a diagram depicting an example of a dynamic object data modeler, according to some examples.

FIG. 39 is a diagram depicting an example of a dynamic object data modeler, according to some examples. Diagram 3900 includes a dynamic object data modeler 3921 configured to receive object data 3931 for generating simulated object data 3941. In this example, dynamic object data modeler 3921 includes an object data classifier 3922 (e.g., a Bayesian classifier, among others) configured to identify a classification of a dynamic object, and to identify data representing a set of characteristics (or predicted behaviors) associated with the classification. A simulator then may be configured to use the set of characteristics to simulate a predicted range of motion of a simulated dynamic object in a simulated environment. As shown, object data classifier 3922 classifies dynamic objects 3932, 3933, 3934, and 3938 as a first animal dynamic object, a second animal dynamic object, a pedestrian dynamic object, and a skate boarder dynamic object. Based on the classifications, object data characterizer's 3951, 3952, 3953, and 3959 are configured to provide data representing, for example, a predicted range of motion based on the identified dynamic object. In some cases, the object data characterizer's may implement randomized data, based on probabilities, relating to predicted range of motion. Based on the randomized data, a simulator may be able to simulate possibly rare behaviors of an object, such as a dog randomly leaping up and running into the street (e.g., after a ball, etc.).

Figure 40:
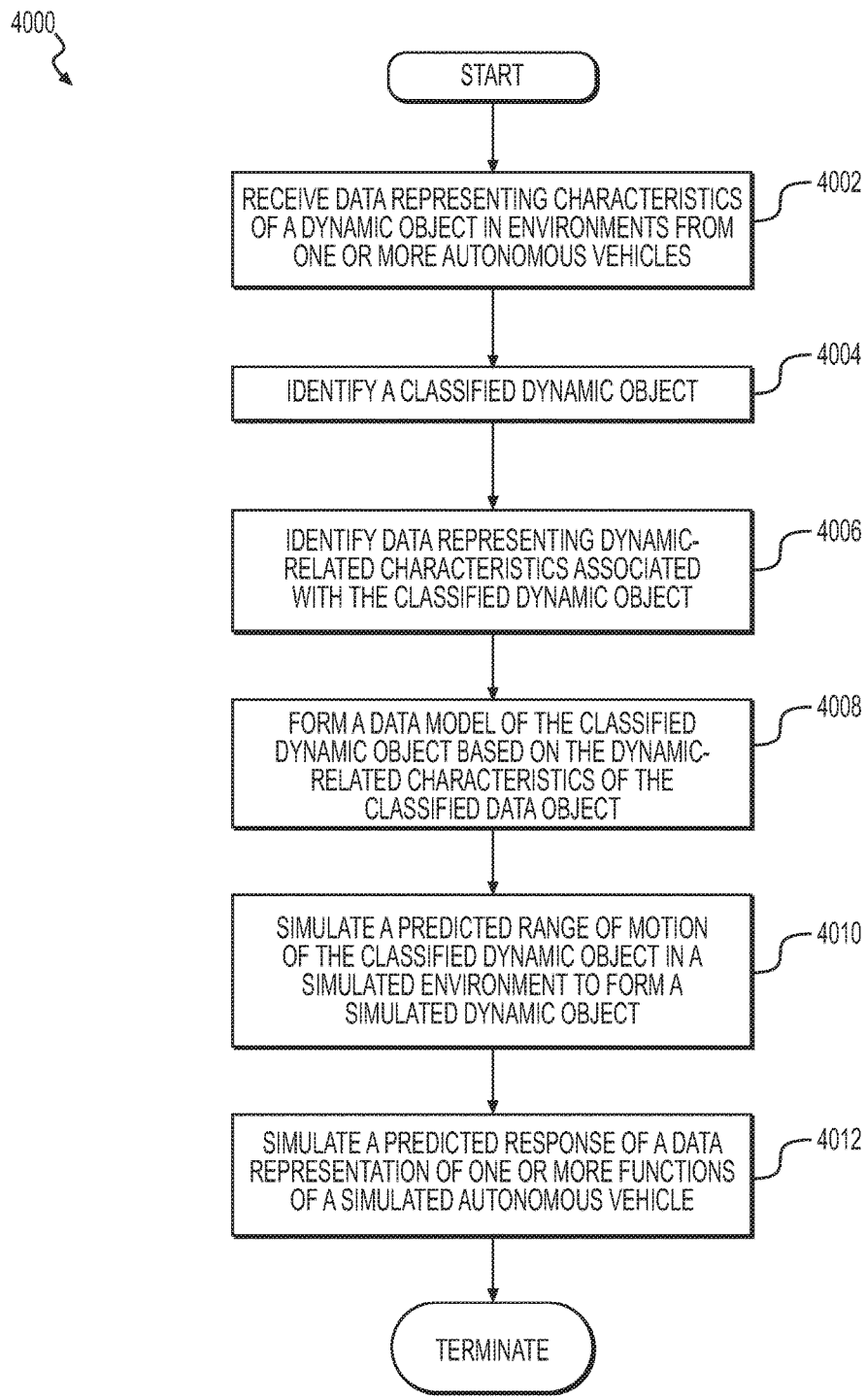
FIG. 40 is a flow chart illustrating an example of generating a simulated environment, according to some examples.

FIG. 40 is a flow chart illustrating an example of generating a simulated environment, according to some examples. Flow 4000 begins with 4002 at which data representing characteristics of a dynamic object in environments from one or more autonomous vehicles is received. At 4004, a classified dynamic object is identified. At 4006, data representing dynamic-related characteristics associated with the classified dynamic object is identified. At 4008, a data model of the classified dynamic object is formed based on the dynamic-related characteristics of the classified data object. At 4010, a predicted range of motion of the classified dynamic object is simulated in a simulated environment to form a simulated dynamic object. At 4012, a predicted response of a data representation of one or more functions of a simulated autonomous vehicle may be simulated. Note that the order depicted in this and other flow charts herein are not intended to imply a requirement to linearly perform various functions as each portion of a flow chart may be performed serially or in parallel with any one or more other portions of the flow chart, as well as independent or dependent on other portions of the flow chart.

Figure 41:
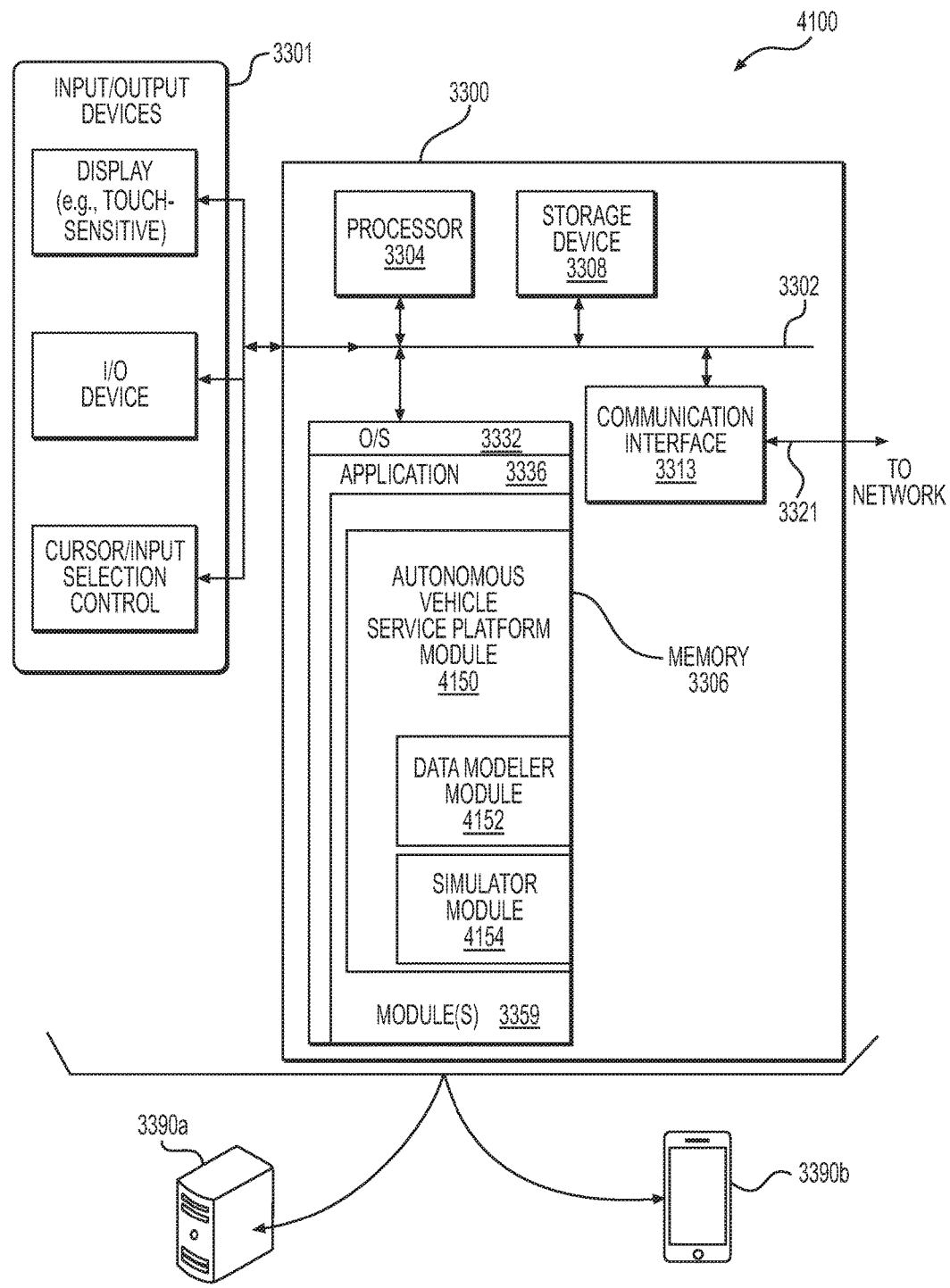
FIG. 41 illustrates examples of various computing platforms configured to provide various simulator-related functionalities and/or structures to simulate an autonomous vehicle service, according to various embodiments.

FIG. 41 illustrates examples of various computing platforms configured to provide various simulator-related functionalities and/or structures to simulate an autonomous vehicle service, according to various embodiments. In some examples, computing platform 3300 may be used to implement computer programs, applications, methods, processes, algorithms, or other software to perform the above-described techniques. Note that various structures and/or functionalities of FIG. 33 may be applicable to FIG. 41, and, as such, some elements in those figures may be discussed in the context of FIG. 33. Note further that elements depicted in diagram 4100 of FIG. 41 may include structures and/or functions as similarly-named elements described in connection to one or more other drawings herein.

Referring to the example shown in FIG. 41, system memory 3306 includes an autonomous vehicle service platform module 4150 and/or its components (e.g., a data modeler module 4152, a simulator module 4154, etc.), any of which, or one or more portions of which, can be configured to facilitate simulation of an autonomous vehicle service by implementing one or more functions described herein. In some cases, computing platform 3300 can be disposed in any device, such as a computing device 3390a, which may be disposed in an autonomous vehicle service platform, an autonomous vehicle 3391, and/or mobile computing device 3390b.

FIGS. 33 to 35 illustrate examples of various computing platforms configured to provide various functionalities to components of an autonomous vehicle service, according to various embodiments. In some examples, computing platform 3300 may be used to implement computer programs, applications, methods, processes, algorithms, or other software to perform any of the techniques described herein.

Note that various structures and/or functionalities of FIG. 33 are applicable to FIGS. 34 and 35, and, as such, some elements in those figures may be discussed in the context of FIG. 33.

In some cases, computing platform 3300 can be disposed in any device, such as a computing device 3390a, which may be disposed in one or more computing device in an autonomous vehicle service platform, an autonomous vehicle 3391, and/or mobile computing device 3390b.

Computing platform 3300 includes a bus 3302 or other communication mechanism for communicating information, which interconnects subsystems and devices, such as processor 3304, system memory 3306 (e.g., RAM, etc.), storage device 3308 (e.g., ROM, etc.), an in-memory cache (which may be implemented in RAM 3306 or other portions of computing platform 3300), a communication interface 3313 (e.g., an Ethernet or wireless controller, a Bluetooth controller, NFC logic, etc.) to facilitate communications via a port on communication link 3321 to communicate, for example, with a computing device, including mobile computing and/or communication devices with processors. Processor 3304 can be implemented with one or more graphics processing units ("GPUs"), with one or more central processing units ("CPUs"), such as those manufactured by Intel® Corporation, or one or more virtual processors, as well as any combination of CPUs and virtual processors. Computing platform 3300 exchanges data representing inputs and outputs via input-and-output devices 3301, including, but not limited to, keyboards, mice, audio inputs (e.g., speech-to-text devices), user interfaces, displays, monitors, cursors, touch-sensitive displays, LCD or LED displays, and other I/O-related devices.

According to some examples, computing platform 3300 performs specific operations by processor 3304 executing one or more sequences of one or more instructions stored in system memory 3306, and computing platform 3300 can be implemented in a client-server arrangement, peer-to-peer arrangement, or as any mobile computing device, including smart phones and the like. Such instructions or data may be read into system memory 3306 from another computer readable medium, such as storage device 3308. In some examples, hard-wired circuitry may be used in place of or in combination with software instructions for implementation. Instructions may be embedded in software or firmware. The term "computer readable medium" refers to any tangible medium that participates in providing instructions to processor 3304 for execution. Such a medium may take many forms, including but not limited to, non-volatile media and volatile media. Non-volatile media includes, for example, optical or magnetic disks and the like. Volatile media includes dynamic memory, such as system memory 3306.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read. Instructions may further be transmitted or received using a transmission medium. The term "transmission medium" may include any tangible or intangible medium that is capable of storing, encoding or carrying instructions for execution by the machine, and includes digital or analog communications signals or other intangible medium to facilitate communication of such instructions. Transmission media includes coaxial cables, copper wire, and fiber optics, including wires that comprise bus 3302 for transmitting a computer data signal.

In some examples, execution of the sequences of instructions may be performed by computing platform 3300. According to some examples, computing platform 3300 can be coupled by communication link 3321 (e.g., a wired network, such as LAN, PSTN, or any wireless network, including WiFi of various standards and protocols, Bluetooth®, NFC, Zig-Bee, etc.) to any other processor to perform the sequence of instructions in coordination with (or asynchronous to) one another. Computing platform 3300 may transmit and receive messages, data, and instructions, including program code (e.g., application code) through communication link 3321 and communication interface 3313. Received program code may be executed by processor 3304 as it is received, and/or stored in memory 3306 or other non-volatile storage for later execution.

In the example shown, system memory 3306 can include various modules that include executable instructions to implement functionalities described herein. System memory 3306 may include an operating system ("O/S") 3332, as well as an application 3336 and/or logic module(s) 3359. In the example shown in FIG. 33, system memory 3306 includes an autonomous vehicle ("AV") controller module 3350 and/or its components (e.g., a perception engine module, a localization module, a planner module, and/or a motion controller module), any of which, or one or more portions of which, can be configured to facilitate an autonomous vehicle service by implementing one or more functions described herein.

Referring to the example shown in FIG. 34, system memory 3306 includes an autonomous vehicle service platform module 3450 and/or its components (e.g., a teleoperator manager, a simulator, etc.), any of which, or one or more portions of which, can be configured to facilitate managing an autonomous vehicle service by implementing one or more functions described herein.

Referring to the example shown in FIG. 35, system memory 3306 includes an autonomous vehicle ("AV") module and/or its components for use, for example, in a mobile computing device. One or more portions of module 3550 can be configured to facilitate delivery of an autonomous vehicle service by implementing one or more functions described herein.

Referring back to FIG. 33, the structures and/or functions of any of the features described or incorporated by reference herein can be implemented in software, hardware, firmware, circuitry, or a combination thereof. Note that the structures and constituent elements above, as well as their functionality, may be aggregated with one or more other structures or elements. Alternatively, the elements and their functionality may be subdivided into constituent sub-elements, if any. As software, the techniques described or incorporated by reference herein may be implemented using various types of programming or formatting languages, frameworks, syntax, applications, protocols, objects, or techniques. As hardware and/or firmware, the techniques described or incorporated by reference herein may be implemented using various types of programming or integrated circuit design languages, including hardware description languages, such as any register transfer language ("RTL") configured to design field-programmable gate arrays ("FPGAs"), application-specific integrated circuits ("ASICs"), or any other type of integrated circuit. According to some embodiments, the term "module" can refer, for example, to an algorithm or a portion thereof, and/or logic implemented in either hardware circuitry or software, or a combination thereof. These can be varied and are not limited to the examples or descriptions provided.

In some embodiments, module 3350 of FIG. 33, module 3450 of FIG. 34, and module 3550 of FIG. 35, or one or more of their components, or any process or device described herein, can be in communication (e.g., wired or wirelessly) with a mobile device, such as a mobile phone or computing device, or can be disposed therein.

In some cases, a mobile device, or any networked computing device (not shown) in communication with one or more modules 3359 (module 3350 of FIG. 33, module 3450 of FIG. 34, and module 3550 of FIG. 35) or one or more of its components (or any process or device described herein), can provide at least some of the structures and/or functions of any of the features described herein. As depicted in the figures described or incorporated by reference herein, the structures and/or functions of any of the features described or incorporated by reference herein can be implemented in software, hardware, firmware, circuitry, or any combination thereof. Note that the structures and constituent elements above, as well as their functionality, may be aggregated or combined with one or more other structures or elements. Alternatively, the elements and their functionality may be subdivided into constituent sub-elements, if any. As software, at least some of the techniques described or incorporated by reference herein may be implemented using various types of programming or formatting languages, frameworks, syntax, applications, protocols, objects, or techniques. For example, at least one of the elements depicted in any of the figures can represent one or more algorithms. Or, at least one of the elements can represent a portion of logic including a portion of hardware configured to provide constituent structures and/or functionalities.

For example, module 3350 of FIG. 33, module 3450 of FIG. 34, and module 3550 of FIG. 35, or one or more of its components, or any process or device described herein, can be implemented in one or more computing devices (i.e., any mobile computing device, such as a wearable device, an audio device (such as headphones or a headset) or mobile phone, whether worn or carried) that include one or more processors configured to execute one or more algorithms in memory. Thus, at least some of the elements in the figures described or incorporated by reference herein can represent one or more algorithms. Or, at least one of the elements can represent a portion of logic including a portion of hardware configured to provide constituent structures and/or functionalities. These can be varied and are not limited to the examples or descriptions provided.

As hardware and/or firmware, the structures and/or techniques described or incorporated by reference herein can be implemented using various types of programming or integrated circuit design languages, including hardware description languages, such as any register transfer language ("RTL") configured to design field-programmable gate arrays ("FPGAs"), application-specific integrated circuits ("ASICs"), multi-chip modules, or any other type of integrated circuit.

For example, module 3350 of FIG. 33, module 3450 of FIG. 34, and module 3550 of FIG. 35, or one or more of its components, or any process or device described herein, can be implemented in one or more computing devices that include one or more circuits. Thus, at least one of the elements in the figures described or incorporated by reference herein can represent one or more components of hardware. Or, at least one of the elements can represent a portion of logic including a portion of a circuit configured to provide constituent structures and/or functionalities.

According to some embodiments, the term "circuit" can refer, for example, to any system including a number of components through which current flows to perform one or more functions, the components including discrete and complex components. Examples of discrete components include transistors, resistors, capacitors, inductors, diodes, and the like, and examples of complex components include memory, processors, analog circuits, digital circuits, and the like, including field-programmable gate arrays ("FPGAs"), application-specific integrated circuits ("ASICs"). Therefore, a circuit can include a system of electronic components and logic components (e.g., logic configured to execute instructions, such that a group of executable instructions of an algorithm, for example, and, thus, is a component of a circuit). According to some embodiments, the term "module" can refer, for example, to an algorithm or a portion thereof, and/or logic implemented in either hardware circuitry or software, or a combination thereof (i.e., a module can be implemented as a circuit). In some embodiments, algorithms and/or the memory in which the algorithms are stored are "components" of a circuit. Thus, the term "circuit" can also refer, for example, to a system of components, including algorithms. These can be varied and are not limited to the examples or descriptions provided. Accordingly, any of the above-described structures and/or functions may by implemented in hardware, including circuitry.

Although the foregoing examples have been described in some detail for purposes of clarity of understanding, the above-described inventive techniques are not limited to the details provided. There are many alternative ways of implementing the above-described invention techniques. The disclosed examples are illustrative and not restrictive.

What is claimed:

1. A method, comprising:
receiving first data representing a dynamic object in a physical environment;
determining, by a vehicle controller, a classification of the dynamic object based at least in part on the first data;
determining second data representing dynamic-related characteristics associated with the dynamic object;
generating, by the vehicle controller, a data model of the dynamic object based at least in part on at least one of the first data, the second data, or the classification;
simulating, by the vehicle controller and based at least in part on the data model of the dynamic object, a predicted range of motion of the dynamic object in a simulated environment;
generating, by the vehicle controller and based at least in part on the predicted range of motion of the dynamic object, a command for controlling an autonomous vehicle; and
controlling, based at least in part on the command, the autonomous vehicle.

2. The method of claim 1, wherein generating the command comprises:
calculating a rate of change of distance between the autonomous vehicle and the predicted range of motion of the dynamic object;
generating a plurality of candidate trajectories;
selecting, based at least in part on the rate of change of distance, a trajectory from among the plurality of candidate trajectories; and
generating, based at least in part on the trajectory, the command.

3. The method of claim 1, further comprising validating one or more changes to functionality associated with the autonomous vehicle based at least in part on simulating controlling the autonomous vehicle based on the command.

4. The method of claim 1, wherein:
determining the classification of the dynamic object comprises determining that the dynamic object is at least one of an animal dynamic object, a pedestrian dynamic object, cyclist dynamic object, or a motorized vehicle dynamic object; and
simulating the predicted range of motion based at least in part on the classification of the dynamic object.

5. The method of claim 1, further comprising:
transmitting, to a computing device associated with a teleoperator, at least one of the first data, the second data, the data model, the command, or the predicted range of motion;
receiving teleoperator data from the computing device associated with the teleoperator; and
controlling an operation of the autonomous vehicle based at least in part on the teleoperator data.

6. The method of claim 4, further comprising randomizing the predicted range of motion based at least in part on the classification of the dynamic object.

7. The method of claim 1, wherein at least one of the first data or the second data comprises sensor data obtained by a physical sensor in the physical environment, and further comprising:
modeling, based at least in part on at least one of the first data or the second data, a sensor device to form a simulated sensor device; and
generating third data representing output of the simulated sensor device,
wherein the predicted range of motion is further based at least in part on the third data.

8. The method of claim 7, wherein modeling the sensor device comprises adjusting the third data representing output of the simulated sensor device based at least in part on measurement deviations.

9. The method of claim 7, wherein generating third data representing output of the simulated sensor device comprises:
modeling Lidar sensor data to characterize a Lidar sensor to form characterized Lidar data;
generating first data representing output of a simulated Lidar device based at least in part on the characterized Lidar data;
modeling second data representing Lidar measurement deviations associated with the simulated Lidar device; and
adjusting the first data representing the output of the simulated Lidar device based at least in part on the Lidar measurement deviations.

10. The method of claim 1, further comprising:
identifying a component characteristic associated with a component of the autonomous vehicle;
generating, based at least in part on the component characteristic, a data model of the component; and
simulating operation of the component based at least in part on the data model to predict behavior of the autonomous vehicle.

11. The method of claim 10, further comprising:
accessing an event data model that comprises data representing an event characteristic associated with an event; and
simulating, based at least in part on the event characteristic, the event,
wherein simulating the predicted range of motion is further based at least in part on the event.

12. A system, comprising:
one or more processors; and
one or more computer-readable media storing instructions executable by the one or more processors, wherein the instructions, when executed, cause the system to:
receive first data representing a dynamic object in a physical environment;
determine, based at least in part on the first data, a classification of the dynamic object;
identify second data representing dynamic-related characteristics associated with the classified dynamic object;
generate, by a dynamic data modeler of a vehicle controller of an autonomous vehicle, a data model of the dynamic object based at least in part on at least one of the first data or the second data;
simulate a predicted range of motion of the classified dynamic object in a simulated environment;
generate, based at least in part on the predicted range of motion, a command for controlling the autonomous vehicle in the physical environment; and
control, based at least in part on the command, the autonomous vehicle.

13. The system of claim 12, wherein the instructions further cause the system to:
execute simulation instructions to cause a simulated autonomous vehicle to perform a simulated maneuver based at least in part on the command and the predicted range of motion, the simulated autonomous vehicle being associated with the autonomous vehicle;
generate simulation data associated with the simulated autonomous vehicle performing the simulated maneuver;
provide the simulation data to a computing device associated with a teleoperator;
receive, from the computing device associated with the teleoperator, an instruction; and
control, based at least in part on the instruction, the autonomous vehicle.

14. The system of claim 12, wherein the instructions further cause the system to:
model, based at least in part on at least one of the first data or the second data, a sensor device to form characterized sensor data; and
generate third data representing output of a simulated sensor device based at least in part on the characterized sensor data.

15. The system of claim 12, wherein the instructions further cause the system to:
identify a component characteristic associated with a component of the autonomous vehicle;
generate, based at least in part on the component characteristic, a data model of the component; and
simulate operation of the component based at least in part on the data model to predict behavior of a simulated autonomous vehicle.

16. The system of claim 12, wherein the instructions further cause the system to:
receive, from a computing device associated with a teleoperator, first data associated with controlling a simulated maneuver;
execute simulation instructions to cause a simulated autonomous vehicle to perform the simulated maneuver;
generate second data associated with the simulated autonomous vehicle performing the simulated maneuver;

determine that at least one of the first data or the second data complies with one or more policies; and control the autonomous vehicle based at least in part on determining that the at least one of the first data or the second data complies with the one or more policies.

17. The system of claim 12, wherein the instructions further cause the system to provide at least one of the data model, the predicted range of motion, or the command to a computing device associated with a physical autonomous vehicle.

18. The system of claim 12, wherein generating the data model of the dynamic object is subsequent to at least one of receiving the first data, determining the classification, or identifying the second data.

19. A non-transitory computer-readable storage medium having computer-executable instructions stored thereupon which, when executed by a computer, cause the computer to:
receive sensor data associated with a dynamic object in a physical environment;
determine, based at least in part on the sensor data, a classification of the dynamic object;
identify, based at least in part on the sensor data, dynamic-related characteristics associated with the dynamic object;
generate, based at least in part on at least one of the dynamic-related characteristics or the classification and by an autonomous vehicle service platform of an autonomous vehicle, a data model of the dynamic object based at least in part on the dynamic-related characteristics;
simulate an event associated with the autonomous vehicle in the physical environment based at least in part on a predicted range of motion of the dynamic object; and
generate, based at least in part on at least one of the event or the data model, a command for controlling the autonomous vehicle.

20. The non-transitory computer-readable storage medium of claim 19, wherein simulating the event, comprises:
calculating, based at least in part on the sensor data, a classification associated with the dynamic object;
calculating a rate of change of distance between a simulated autonomous vehicle and the predicted range of motion of the dynamic object, wherein the simulated autonomous vehicle is associated with the autonomous vehicle; and
calculating, based at least in part on the rate of change of distance and the predicted range of motion, one or more trajectories that causes the simulated autonomous vehicle to avoid the dynamic object in a simulated environment, wherein the command is configured to cause motion of the autonomous vehicle to track one of the one or more trajectories,
wherein the predicted range of motion is based, at least in part, on a classification associated with the dynamic object.

21. The non-transitory computer-readable storage medium of claim 20, wherein the instructions further cause the computer to:
provide the one or more trajectories to a computing device associated with a teleoperator;
receive a selection of one of the one or more trajectories from the computing device associated with the teleoperator; and
perform one or more of simulating a movement of the simulated autonomous vehicle using the selection of the one or more trajectories or causing a physical autonomous vehicle to utilize the selection of the one or more trajectories.

22. The non-transitory computer-readable storage medium of claim 20, wherein the instructions further cause the computer to:
receive, from a computing device associated with a teleoperator, data associated with controlling a simulated maneuver of the simulated autonomous vehicle; and
execute simulation instructions to cause the simulated autonomous vehicle to perform the simulated maneuver.

23. The non-transitory computer-readable storage medium of claim 22, wherein the data associated with controlling the simulated maneuver of the simulated autonomous vehicle comprises first data, and the instructions further cause the computer to:
generate second data associated with the simulated autonomous vehicle performing the simulated maneuver; and
determine that at least one of the first data or the second data complies with one or more policies; and
control the autonomous vehicle based at least in part on determining that at least one of the first data or the second data complies with the one or more policies.

24. The non-transitory computer-readable storage medium of claim 19, wherein the instructions further cause the computer to:
model output of a sensor device to form characterized sensor data; and
generate data representing output of a simulated sensor device based at least in part on the characterized sensor data.

* * * * *